(12) United States Patent
Williams

(10) Patent No.: US 9,576,884 B2
(45) Date of Patent: Feb. 21, 2017

(54) LOW PROFILE LEADED SEMICONDUCTOR PACKAGE

(71) Applicant: Richard K Williams, Cupertino, CA (US)

(72) Inventor: Richard K Williams, Cupertino, CA (US)

(73) Assignee: ADVENTIVE IPBANK, Luxembourg (LU)

( * ) Notice: Subject to any disclaimer, the term of this patent is extended or adjusted under 35 U.S.C. 154(b) by 488 days.

(21) Appl. No.: 14/056,287

(22) Filed: Oct. 17, 2013

(65) Prior Publication Data

US 2014/0306330 A1    Oct. 16, 2014

Related U.S. Application Data

(60) Provisional application No. 61/775,540, filed on Mar. 9, 2013, provisional application No. 61/775,544, filed on Mar. 9, 2013.

(51) Int. Cl.
| | |
|---|---|
| *H01L 23/495* | (2006.01) |
| *H01L 23/31* | (2006.01) |
| *H01L 23/00* | (2006.01) |
| *H01L 21/48* | (2006.01) |
| *H01L 21/56* | (2006.01) |

(52) U.S. Cl.
CPC ..... *H01L 23/49541* (2013.01); *H01L 21/4828* (2013.01); *H01L 21/565* (2013.01); *H01L 23/3107* (2013.01); *H01L 23/4952* (2013.01); *H01L 23/49551* (2013.01); *H01L 23/49555* (2013.01); *H01L 23/49568* (2013.01); *H01L 24/97* (2013.01); *H01L 2224/16245* (2013.01); *H01L 2224/48091* (2013.01); *H01L 2224/48247* (2013.01); *H01L 2224/48464* (2013.01); *H01L 2224/49171* (2013.01); *H01L 2224/73257* (2013.01); *H01L 2924/1305* (2013.01); *H01L 2924/13091* (2013.01); *H01L 2924/181* (2013.01)

(58) Field of Classification Search
CPC   H01L 23/49511; H01L 21/56; H01L 21/4821; H01L 48/4828; H01L 23/49541; H01L 24/97
USPC ........................................................ 257/675
See application file for complete search history.

(56) References Cited

U.S. PATENT DOCUMENTS

| | | | |
|---|---|---|---|
| 6,307,755 B1 * | 10/2001 | Williams | H01L 23/4334 |
| | | | 174/260 |
| 6,891,256 B2 | 5/2005 | Joshi et al. | |
| 8,513,787 B2 | 8/2013 | Williams et al. | |
| 8,575,006 B2 | 11/2013 | Xue et al. | |
| 2007/0284720 A1 | 12/2007 | Otremba et al. | |
| 2008/0017907 A1 | 1/2008 | Otremba | |
| 2011/0115069 A1 | 5/2011 | Teh et al. | |

(Continued)

*Primary Examiner* — David S Blum
(74) *Attorney, Agent, or Firm* — Patentability Associates; David E. Steuber

(57) ABSTRACT

In a semiconductor package a lead having a bottom surface coplanar with the flat bottom surface of the plastic body extends outward at the bottom of the vertical side surface of the plastic body. The result is a package with a minimal footprint that is suitable for the technique known as "wave soldering" that is used in relatively low-cost printed circuit board assembly factories. Methods of fabricating the package are disclosed.

23 Claims, 34 Drawing Sheets

(56) References Cited

U.S. PATENT DOCUMENTS

2012/0025227 A1* 2/2012 Chan ..................... H01L 33/62
257/89

* cited by examiner

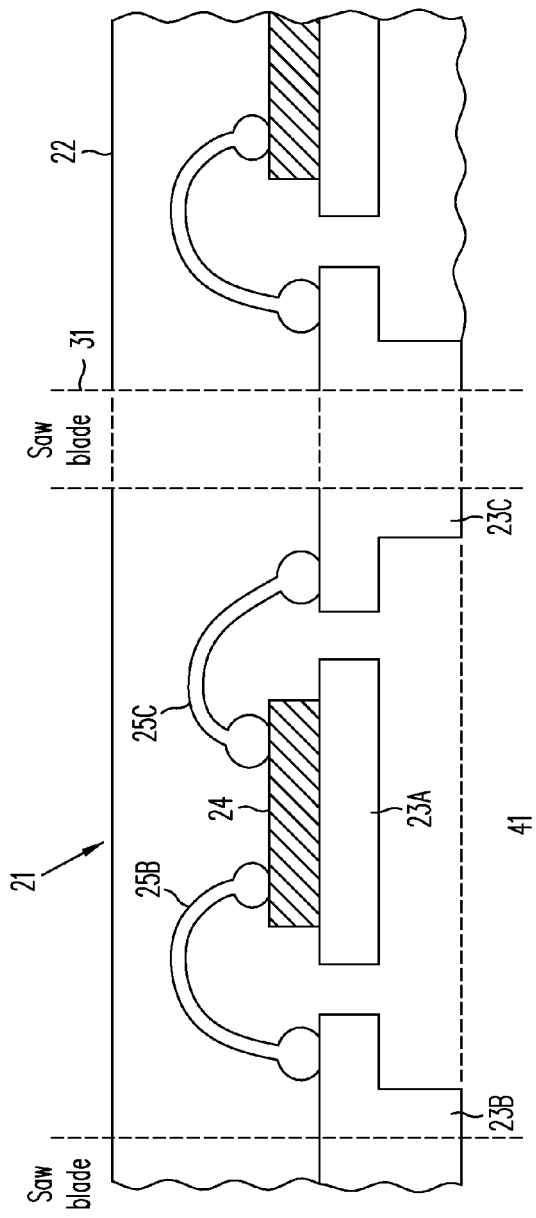
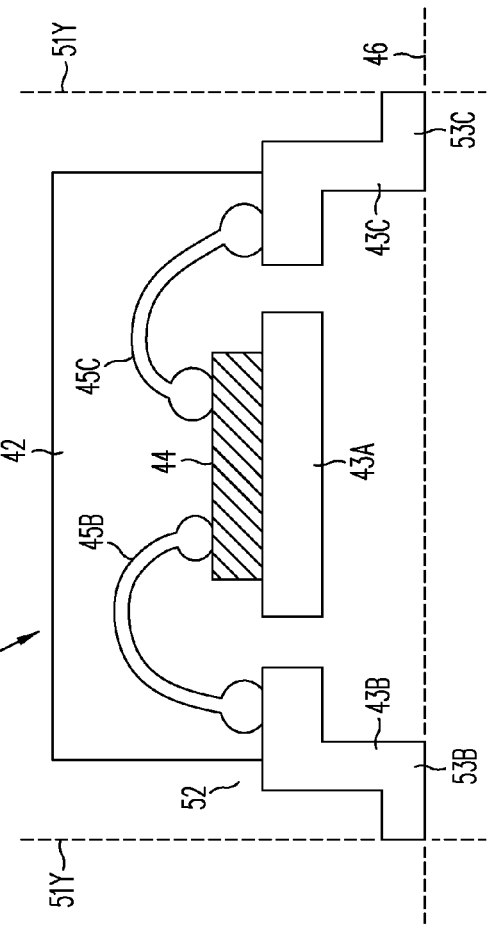
FIG. 3
FIG. 4

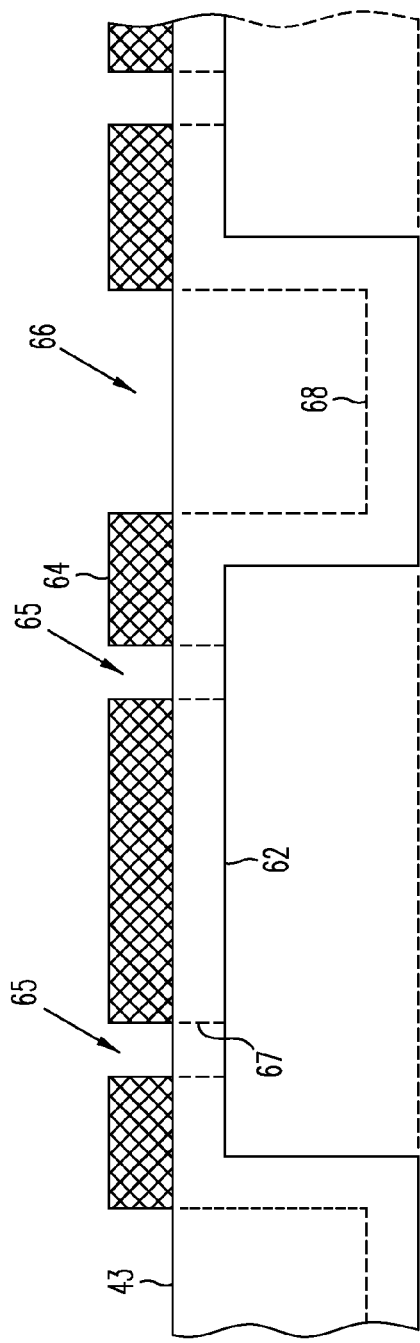
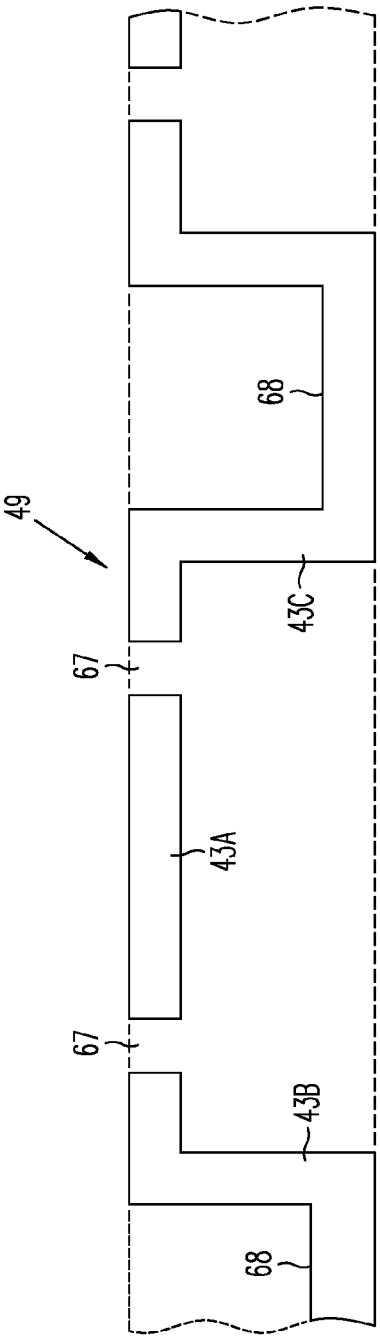
FIG. 5C
FIG. 5D

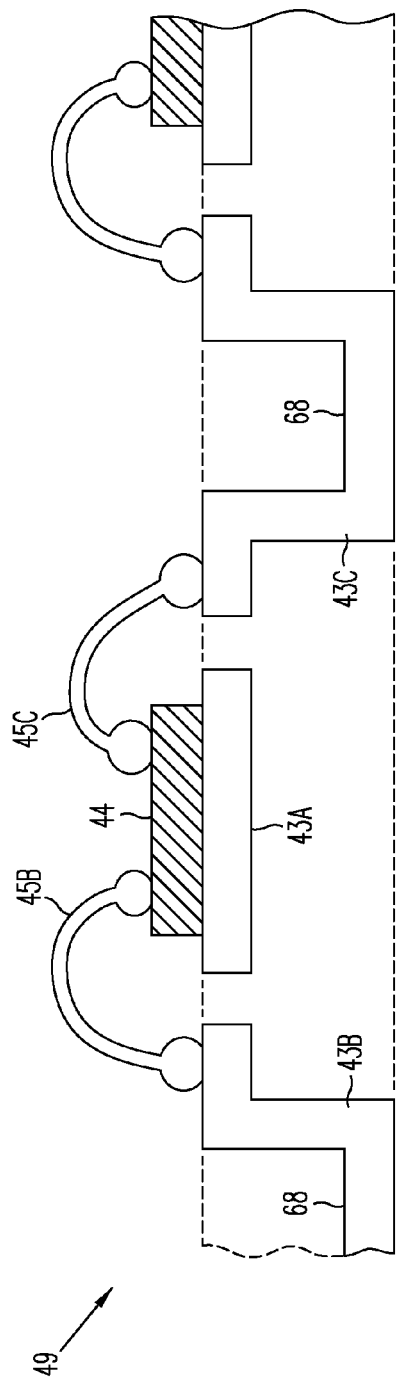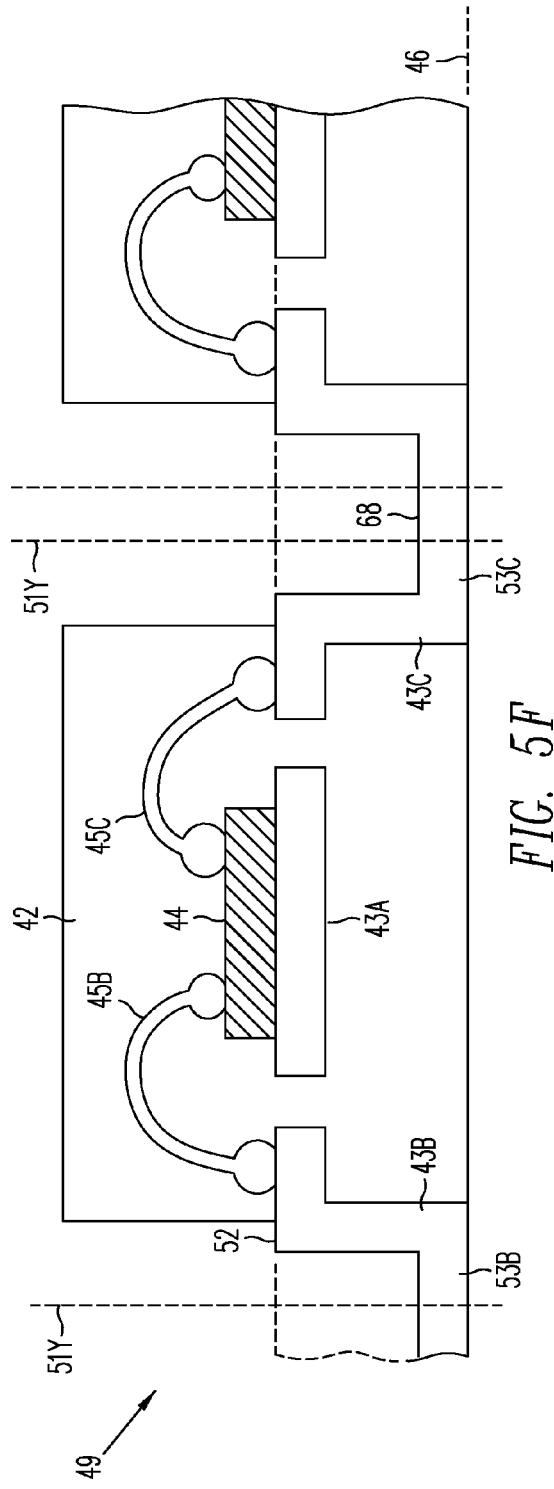

LOW PROFILE LEADED SEMICONDUCTOR PACKAGE

CROSS-REFERENCE TO RELATED APPLICATIONS

This application claims the priority of Provisional Application Nos. 61/775,540 and 61/775,544, filed Mar. 9, 2013, each of which is incorporated herein by reference in its entirety.

FIELD OF THE INVENTION

This invention relates to semiconductor packages including packages for power devices and analog integrated circuits.

BACKGROUND OF THE INVENTION

Semiconductor devices and ICs are generally contained in semiconductor packages comprising a protective coating or encapsulant to prevent damage during handling and assembly of the components during shipping and when mounting the components on printed circuit boards. For cost reasons, the encapsulant is preferably made of plastic. In a liquid state, the plastic "mold compound" is injected into a mold chamber at an elevated temperature surrounding the device and its interconnections before cooling and curing into a solid plastic. Such packages are commonly referred to as "injection molded".

Interconnection to the device is performed through a metallic leadframe, generally made of copper, conducting electrical current and heat from the semiconductor device or "die" into the printed circuit board and its surroundings. Connections between the die and the leadframe generally comprise conductive or insulating epoxy to mount the die onto the leadframe's "die pad", and metallic bond wires, typically made of gold, copper, or aluminum, to connect the die's surface connections to the leadframe. Alternatively, solder balls, gold bumps, or copper pillars may be used to attach the topside connections of the die directly onto the leadframe.

While the metallic leadframe acts as an electrical and thermal conductor in the finished product, during manufacturing the leadframe temporarily holds the device elements together until the plastic hardens. After the plastic cures, the packaged die is separated or "singulated" from other packages also formed on the same leadframe by mechanical sawing. The saw cuts through the metal leadframe and in some instances through the hardened plastic too.

In "leaded" semiconductor packages, i.e. packages where the metallic leads or "pins" protrude beyond the plastic, the leads are then bent using mechanical forming to set them into their final shape. The finished devices are then packed into tape and reels ready for assembly onto customers' printed circuit boards (PCBs).

One example of a leaded package 1 is shown in cross section in FIG. 1A, comprising semiconductor die 4, plastic 2, bond wires 5B and 5C, metallic leads 3B and 3C, and metallic die pad 3A. The metallic leads 3B and 3C and the die pad 3A comprise elements from a single lead frame separated during manufacturing. Leads 3B and 3C along with other leads not visible in the cross section are bent to lie flat or "coplanar" on a PCB depicted by planar surface 6. Owing to the shape of the bent leads 3B and 3C, package 1 is sometimes referred to as a "gull-wing" package.

Such leaded packages are manufactured in a large variety of sizes and pin configurations ranging from 3 leads used for packaging transistors and simple ICs such as bipolar junction transistors, power MOSFETs and shunt voltage regulators, to dozens of leads used for packaging integrated circuits (ICs). To date many billions of products have been manufactured using injection-molded leaded plastic packages. Common packages include small transistor packages like the SC70 and SOT23 packages, small outline packages such as the SOP-8, SOP-16 or SOP-24, and for higher pin counts, the leaded quad flat pack or LQFP. The LQFP, which can have 64 or more leads per package, apportions its leads in even amounts on each of its four edges while SOT and SOP packages have leads positioned on only two sides.

To accommodate the lead bending process, minimum package heights for the SOP and LQFP typically exceed 1.8 mm. Some packages including the small outline transistor package such as the SOT23-3, SOT23-5, SOT23-6 and the SOT223, the small chip package such as the SC70, the TSOP-8 thin small outline package, and the TSSOP-8 thin super small outline package have been engineered for lower profiles, as thin as 1 mm. Below 1 mm thickness it becomes difficult to manufacture any of these packages. Even for greater package heights, maintaining good lead coplanarity during lead bending is a constant concern in the volume manufacturing of gull wing packages.

Accurate forming of leads to tight specifications and tolerances is problematic. Customers consider deformed leads as quality failures, demanding a formal corrective action response and a committed improvement schedule. In extreme cases, manufacturing outside of specified tolerances can result in manufacturing interruptions triggering financial penalties, vendor disqualifications and even litigation.

Poor control of lead bending in manufacturing is not the only limitation of these packages. Despite their ubiquity, leaded injection molded packages suffer from a number of other limitations including poor area efficiency, poor thermal resistance and a relatively thick cross-sectional profile. Specifically, the maximum die size of such packages is small compared to their footprint on a printed circuit board, in part because of the area wasted by the curved portion of the leads. Comparing the maximum die area to the PCB mounting area of the package, area efficiency of gull wing packages can be as low as 30% to 50%.

One way to improve the area efficiency is to bend the leads under the package as shown in the package 11 of FIG. 1B comprising semiconductor die 14, plastic body 12, bond wires 15B and 15C, metallic leads 13B and 13C, and metallic die pad 13A. The metallic leads 13B and 13C and die pad 13A comprise elements from a single lead frame separated during manufacturing. Leads 13B and 13C along with other leads not visible in the cross section are bent under the package to lie flat or "coplanar" on a PCB depicted by imaginary surface 16. The lead shape can be referred to as a "J" lead for its obvious resemblance to the alphabetic character, but in practice is more similar to the gull-wing shape in the inverse direction.

Unlike gull wing package 1, the improved package 11 is able to accommodate a wider plastic body 12 and a larger cavity for die 14 for any given PCB footprint and likewise support a significantly larger die 14, up to three times the die size of gull wing packages with the same footprint, with area efficiencies improving up to 70% or even 80%. Accordingly this package type is referred to as a JW type package, a reference to its J-lead widebody construction. Production volumes to date exceed 1 billion units including the SC70JW, a JW-type package having the same PCB footprint as the SC70, and the TSOPJW, a smaller JW-type package having the same PCB footprint as the TSOP package.

Unfortunately the process of lead bending requires both vertical and horizontal clearance for the lead-forming machine to secure and bend the leads without touching the plastic. Should the machine touch the plastic, the plastic may crack and the resulting product will not pass requisite reliability and hermeticity tests. In order to avoid damage and achieve a lower package profile, the bottom edges of plastic body 12 of JW package 11 are notched to accommodate the upward bend of leads 13B and 13C. Even with this notch, considering minimum tolerances for the bending process, the JW package cannot be reliably manufactured below a thickness of 1 mm. Practically speaking, manufacturing any JW package in volume under 1.1 mm of thickness is challenging.

Aside from their height limitations, gull wing and JW type packages lack effective heat sinking because it is difficult to integrate an exposed die pad as a heat slug into these packages. In low thermal resistance "power packages" a heat slug comprising solid copper is interposed between the die and the PCB, essentially by employing a thick die pad whose backside extends beyond the plastic package. For example, in the package of FIG. 1A, if die pad 3A extended beyond plastic 2 down to planar surface 6, as shown hypothetically by metallic heat slug 7, heat could be more effectively transported from the die into the PCB. In practice heat slug 7 would replace die pad 3A, serving the dual roles of die pad and heat slug. As such, heat slug 7 can also be referred to as an "exposed die pad."

The problem with heat slug 7 is leads 3B and 3C have to be bent to match the bottom of heat slug 7. Unfortunately, the backside of heat slug 7 is not naturally coplanar with its leads 3B and 3C. While the forming machine can be calibrated to keep leads 3B and 3C relatively coplanar with one another, the distance of the bent foot below the bottom of plastic enclosure 2 will vary and so misalign leads 3B and 3C with the bottom hypothetical heat slug 7. While this misalignment can be tolerated in low volume production, yield fluctuations resulting from natural stochastic variability of a manufacturing process run in high volume are unavoidable, their impact being both risky and potentially very costly.

Moreover, such stochastic variability may result in differing failure modes in an application. For example, statistically, in some cases the bottoms of leads 3B and 3C may extend below the bottom of heat slug 7. In such cases mounting package 1 on a PCB having a top surface 6 will result in electrical connections to leads 3B and 3C, but with the bottom heat slug 7 suspended above plane 6 and unable to conduct heat into the PCB. Conversely, when heat slug 7 extends below the bottoms of leads 3B and 3C, then the leads may not solder onto the PCB whatsoever, resulting in open circuits and defective PCBs. Worse yet, poor or "cold" solder joints may result, passing final manufacturing tests but failing during operation in the field. Significant field failures can result in costly product recalls with the potential for customer damage claims against the manufacturer.

Despite all its manufacturing risks, leaded gull wing package 1 of FIG. 1A is at least conceptually adaptable to accommodate heat slug 7, because the package utilizes a "die up" design, where die 4 sits atop die pad 3A or hypothetical heat slug 7. In contrast, JW-type package 11 of FIG. 1B is completely incompatible with a PCB connected heat slug because the package utilizes a "die down" configuration, one where die 14 sits beneath die pad 13A.

To avoid the variability of lead bending in order to make a low profile package, a completely different type of package, a "leadless" package, was developed and became commercially adopted circa 2000. One common nomenclature for this type of package having leads on all four of its edges is the QFN, an acronym for quad flat no-lead package. A two-side variant of the package, the DFN or dual flat no-lead package is also widely used today. The nominative "leadless" or "no-lead" does not mean the package lacks connections to the PCB, but that its leads do not protrude beyond the edges of the plastic on any side. The term flat implies the package height is uniform, lacking an area devoted to bent leads.

Such a leadless package 21 is illustrated in the cross-sectional view of FIG. 2A comprises semiconductor die 24, plastic body 22, bond wires 25B and 25C, metallic leads 23B and 23C, and metallic die pad 23A. The metallic leads 23B and 23C and die pad 23A comprise elements from a single lead frame, collectively referred to as 23, whereby the leadframe is separated into die pad 23A, leads 23B and 23C, and into other leads (not shown) during manufacturing. As shown the lateral extent of plastic 22 and metallic lead 23C are coplanar with vertical edge 31 such that lead 23C does not extend beyond the edge of plastic body 22. In a similar manner lead 23B is coplanar with the other vertical edge of plastic body 22. Because the leads are vertically oriented, no clearance is required for leads or for lead bending and area efficiencies improve, in some cases up to 80% to 90% PCB area utilization.

The bottom of leadless package 21 is also flat, with the bottom of plastic body 22 coplanar with the bottoms of leads 23B and 23C along horizontal planar edge 26. In the event that optional heat slug 32 replaces die pad 23A, the bottom of optional heat slug 32 is naturally coplanar with the bottoms of leads 23B and 23C shown by horizontal line 26 because leads 23B and 23C and heat slug 32 are all formed out of the same piece of metal.

As shown in the DFN perspective drawing of FIG. 2B, leads 23B, 23D, 23F and 23H do not protrude beyond the cube shape defined by plastic body 22, lying flush with the side face of the package and with the bottom edge defined by horizontal line 26. A plan view of the package underside, shown in FIG. 2C, confirms the coplanarity of leads 23B through 23I with all the edges defined by plastic body 22. The optional heat slug 32 is also naturally coplanar with the bottom of the package and laterally enclosed on all side by a surrounding donut of plastic body 22.

Mounting of a leadless package onto a PCB requires solder between the package and the board, accomplished by coating the PCB with a solder paste prior to component placement. After a pick and place machine places all the components onto the PCB, the PCB is run through a reflow furnace, typically on a movable belt. During the reflow operation, the solder paste melts and adheres only to portions of the PCB where the copper traces are exposed. Likewise the solder only adheres to the exposed metallic surfaces of the mounted components. Accordingly, any PCB assembly manufacturing using solder reflow to attach components is referred to in the industry vernacular as a "reflow" assembly line.

A cross-sectional view of such a PCB assembly is shown in FIG. 2D where DFN package 21 is mounted onto multilayer PCB 27 by solder 30. As illustrated, DFN package 21 comprises, in part, a lead 23B and a plastic body 22. PCB 27 comprises an insulating substrate 28, typically phenolic, and multiple layers of conductive traces 29, 34 and 35, typically comprising copper. Some portions, but not all, of the conductive traces are exposed on the surface. An even smaller portion of conductive traces 29 overlap the conductive leads of the mounted components, in this case lead 23B and optionally heat slug 32.

The solder paste applied to the PCB prior to component mounting typically involves a metal such as Ag or a binary metallic compound such as Pb—Sn that melts at a relatively low temperature. In recent years, Pb compounds have largely been banned for environmental concerns, with higher temperature silver (Ag) solder being used instead. In the reflow assembly process, because the package is placed atop the solder itself, there is no need for solder to be able to flow under the package leads.

During the reflow process solder 30 reflows to where both PCB 27 has an exposed conductive trace 29 and DFN package 21 has an exposed lead 23B. The package itself is held in place purely by surface tension. The solder naturally "flows" away from any area lacking metallic connections on both package 21 and multilayer PCB 27. In essence, the solder goes to where it is needed, i.e. to the solder joint, and after reflow solder is absent from all other portions of the PCB. In cases where optional heat slug 32 is present, solder 33 will also remain in this region.

Ideally, after reflow, solder 30 fills the entire cavity between the bottom of lead 23B and conductive trace 29. In some cases solder 30 will "wick" up onto the side of lead 23B through the fluidic behavior to reduce surface tension. The connection to the side of lead 23B is inconsistent and cannot be relied on to insure a good connection. Instead, the solder located in the region directly between the bottom of lead 23B and conductor 29 must facilitate the main electrical and mechanical connection of the mounted component. In the case where optional heat slug 32 is present, solder will ideally fill the entire cavity between the bottom of heat slug 32 and the top of PCB conductive trace 34.

If any of these intervening regions are not filled with solder 30, an undesirable void will result, weakening the mechanical strength of the solder joint, increasing the electrical resistance of the connection, and possibly compromising the reliability of the product. For example, solder joints with large voids mechanical weaken in bond strength through repeated contractions and expansions during thermal cycling or power cycling. Eventually, a crack will form in the solder, and the component will develop and open or intermittent electrical connection. In extreme cases the component may "fall off" the PCB altogether.

So it is critical to confirm that a void free solder joint is formed on every lead during manufacturing. Since, however, the main solder connection is "beneath" the component, visual inspection is not possible, so that expensive x-ray inspection equipment is required.

PCB assembly using the described reflow method is commonly available in modern multilayer PCB factories used for manufacturing smartphones, tablets, notebooks, servers, and network infrastructure. Such products typically command sufficiently high prices to afford the higher manufacturing cost of a multilayer PCB assembly facility. Some markets, however, are extremely cost sensitive and cannot afford the high cost of multilayer PCBs or reflow PCB assembly with x-ray inspection. Instead, the cost sensitive products are still manufactured in PCB facilities built in the 1960s and using fully depreciated equipment.

Examples of products demanding low cost PCB assembly include most consumer products including clocks, radios, televisions, and home appliances along with many power supply modules used in consumer, lighting, HVAC (heating, ventilation and air conditioning) and industrial applications.

These old PCB factories are incapable of reflow solder manufacturing, lack x-ray inspection equipment, and can accommodate only one- or at most two-sided PCBs, i.e. PCBs with only one or two conductive layers. In fact the cost of a multilayer PCB manufactured with reflow processing can be 2 to 5 times that of single-layer PCBs made in these older factories.

To attach the components to the PCB, these low-cost factories use a method known as "wave soldering", essentially immersing the board and its components with molten solder that sticks only where a solder joint is to be made, i.e. where the component and the PCB both have exposed metallic surfaces in close proximity. In practice the components are "glued" down in their proper place and then the PCB is dipped in a molten solder bath. Because the solder is applied after the component is mounted, no solder is present between the bottom of a package lead and the PCB conductive trace as it is in FIG. 2D. Instead the solder attaches itself to the sides of the leads and wicks its way up onto the lead. In order to make a good connection the solder must cover a significant portion of any component's exposed leads. Because the solder is present on the exposed leads, the soldering operation can be inspected visually without the need for expensive x-ray inspection equipment. For this reason, only leaded packages such as the gull wing and JW-type packages shown in FIG. 1A and FIG. 1B are used with wave-solder PCB assembly.

Despite their performance advantages, leadless packages are intrinsically incompatible with wave soldering and low cost PCB assembly. As described previously, in wave soldering there is no means by which solder can squeeze between the bottom of the package leads and the PCB conductive traces, since those areas are filled with glue. Likewise, the vertical edges of the exposed leads 23B and 23C of the leadless package 21 shown in FIG. 2A are not suitable for wave-solder assembly because the solder will not reliably wick its way onto a vertical exposed lead, in essence because it is too steeply inclined. Also, as a vertical edge, it is impractical to visually inspect solder coverage of the lead.

Unfortunately, the angle of the side of a leadless package is necessarily vertical because of the way in which it is manufactured. FIG. 3 illustrates a leadless package during manufacturing after plastic molding but before singulation. As before, leadless package 21 comprises die pad 23A, die 24, bond wires 25B and 25C and leads 23B and 23C encapsulated in a plastic body 22. To the right of package 21 is an identical package manufactured with the same leadframe. As shown, lead 23C actually is a solid piece of metal extending into the next package.

The region labeled "saw blade" describes where the saw cuts during die singulation. During sawing, it cuts through plastic 22 and ultimately through lead 23C separating package 21 from its neighbors. Because the edge of package 21 is defined by a sawing operation, the edge of the saw blade 31 is necessarily substantially vertical. The coplanarity of lead 23C and the remaining plastic body 22 is a natural result of the fact that edge 31 is defined by the saw blade's cut. No practical way exists to slope the cut line of the saw blade, so edge 31 is necessarily vertical. As a result, all leadless packages today lack the ability to be assembled using low cost wave solder PCB factories.

In conclusion, leaded packages such as the gull wing, JW-type, and LQFP plastic packages are compatible with low cost wave-solder PCB assembly and visual inspection, but suffer from a high package height, problems with maintaining precise coplanarity of the leads during the bending process, poor area efficiency, and an inability to incorporate a heat slug for improved power dissipation. Leadless packages like the DFN and QFN offer superior coplanarity, high area efficiency, and the ability to incorporate a heat slug for improved power dissipating capability, but are incompatible with low cost PCB assembly using wave-soldering and visual inspection, instead requiring more expensive solder reflow PCB manufacturing with x-ray inspection.

What is needed is a new package that offers the performance and coplanarity benefits of the leadless package but is compatible with the low-cost PCB assembly method that uses wave soldering and visual inspection.

SUMMARY OF THE INVENTION

A package of this invention comprises a semiconductor die, a die pad, a lead and a plastic body. The die pad may be completely encased in the plastic body or exposed at the bottom surface of the plastic body. The lead is generally Z-shaped when viewed in a vertical cross section and comprises a vertical column segment, a cantilever segment and a foot. The cantilever segment projects horizontally inward towards the die pad at the top of the vertical column segment, and the foot projects horizontally outward at the bottom of the vertical column segment. The vertical column segment typically forms right angles and sharp corners with the cantilever segment and with the foot. The bottom surface of the foot is coplanar with a bottom surface of the plastic body.

In some embodiments, the vertical column segment extends horizontally beyond a side surface of the plastic body to form a ledge. In other embodiments, the side surface of the plastic body extends outward beyond the vertical column segment and covers a portion of the upper surface of the foot. All or a portion of the upper surface of the foot is exposed.

The package of this invention uniquely combines the characteristics of a leaded package, shown in FIGS. 1A and 1B, with those of a leadless package, shown in FIGS. 2A and 2B. Thus the vertical edge of the vertical column segment forms a vertical plane and is either covered by or located slightly outside the plastic body. In embodiments wherein the vertical outside edge of the vertical column segment is covered by the plastic body, the foot protrudes outward at the bottom of the side surface of the plastic body. A bottom surface of the foot is flat at least from a location adjacent to the side surface of the plastic body to the end of the foot. These features minimize the horizontal dimensions of the package.

The invention also comprises a process for forming a semiconductor package. The process comprises forming a first mask layer on a first side of a metal piece and then partially etching the metal piece through an opening in the first mask layer in an area where the die pad, the cantilever segment of the lead and a gap between the lead and the die pad are to be located. If the die pad is to be exposed at the bottom of the plastic body, the mask layer also covers where the die pad is to be located, and that area is not etched. The partial etch does not cut through the entire metal piece, and a thinned layer of metal remains in the etched areas.

The process further comprises forming a second mask layer on a second side of the metal piece, second mask layer having first and second openings, the first opening in the second mask layer overlying the gap between the die pad and the lead, the second opening in the second mask layer overlying an area where the foot of the lead is to be located. If multiple packages are to be formed from the metal piece, the second opening in the second mask layer may also overlie an area separating adjacent packages.

The metal piece is then etched through the first and second openings in the second mask layer. This etch is continued until the metal is completely removed in the area where the gap between the die pad and the lead is to be located but is only partially removed in the area where the foot is to be located (and in the area separating adjacent packages). The first opening in first mask layer and the second opening in the second mask are vertically offset from each other such than a section of the metal piece remains unaffected by the etch processes. That section will become the vertical column segment of the lead.

Alternatively, a metal stamping process may be used in lieu of the etch processes described above. A first metal stamp is applied to the first side of the metal piece to compress and thin the metal piece where the cantilever segment of the lead and the gap between the die pad and the lead are to be located (and optionally where the die pad is to be located). A second metal stamp is applied to the second side of the metal piece to sever the metal piece where the gap between the die pad and the lead is to be located and to compress and thin the metal piece where the foot of the lead is to be located (and optionally in the area between adjacent packages).

Whether an etching or stamping processes is used, the result is typically a leadframe with multiple die pads, each die pad being associated with a plurality of leads. If the package is to have leads only on two opposite sides of the die pad (a "dual" package), the die pad is typically held in place in the leadframe by means of at least one tie bar. If the package is to have leads on four sides of the die pad (a "quad" package), the die pad is typically left connected to at least one of the associated leads, that is, no gap is formed between the die pad and the at least one of the associated leads in the above-described etching or stamping processes. Either way, the die pad remains connected to the leadframe.

A semiconductor die is then mounted to the die pad, and an electrical connection is made between the die and the lead, typically using wire bonding or flip-chip techniques. The die, die pad and a portion of the lead are encased in a plastic molding compound that is cured to form a plastic body, the plastic body leaving at least a portion of the foot of the lead uncovered. In some embodiments, the plastic body does not cover the vertical outside surface of the vertical column segment, forming a ledge at the top of the lead.

The leadframe and dice are then singulated into separate packages. In the case of dual packages, the leadframe is first cut, typically by sawing, so as to separate adjacent packages on the sides where the leads are located. The first cut is made so as to leave a segment of each lead protruding beyond its vertical column segment, the protruding segment forming the foot of the lead. The plastic body is not affected by this cut. The packages are then separated by cutting them apart on the sides which do not have leads. This second cut, which is typically made at a right angle to the first cut, cuts through the plastic body and normally a tie bar that holds the die pad in place before the molding process is completed.

In the case of quad packages, two cuts are also made, typically at right angles to each other, but both cuts are similar to the first cut described above, that is, the plastic body is not affected and a foot of each lead is left protruding beyond its vertical column segment.

The invention will be more fully understood by reference to the following drawings and detailed description.

BRIEF DESCRIPTION OF THE DRAWINGS

In the drawings listed below, components that are generally similar are given like reference numerals.

FIG. 3 is a cross-sectional view of leadless packages before singulation.

FIG. 4 is a cross-sectional view of a low-profile footed package made in accordance with this invention.

FIG. 5C is a cross-sectional view of the leadframe after the second mask process step and prior to the second metal etch.

FIG. 5D is a cross-sectional view of the leadframe after the second metal etch and mask removal process steps.

FIG. 5E is a cross-sectional view of the leadframe after the die-attach and wire-bonding process steps.

FIG. 5F is a cross-sectional view of the leadframe after the plastic molding process step but prior to singulation.

DESCRIPTION OF THE INVENTION

Figure 1A:
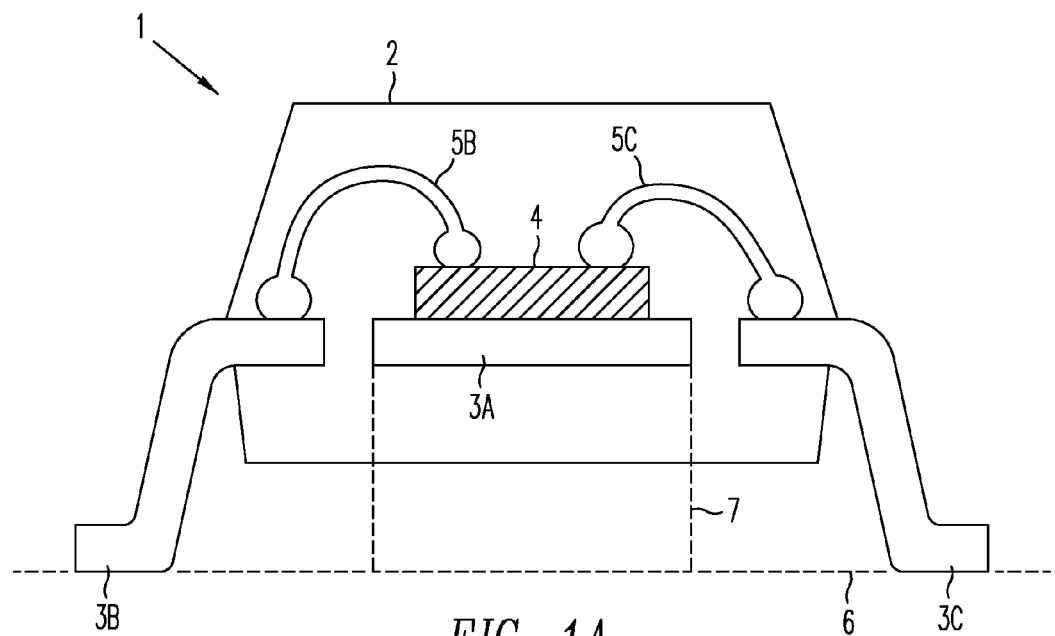
FIG. 1A is a cross-sectional view of a leaded gull-wing package.

FIG. 4 illustrates a low profile package 41 compatible with wave soldering made in accordance with this invention. The package comprises a semiconductor die 44, a die pad 43A, leads 43B and 43C, bond wires 45B and 45C, and plastic body 42. To accommodate wave soldering and visual inspection, lead 43B includes "foot" 53B protruding laterally beyond plastic body 42. In a similar fashion, lead 43C includes "foot" 53C protruding laterally beyond plastic body 42.

Leads 43B and 43C with corresponding feet 53B and 53C, along with die pad 43A, are constructed out of a single piece of metal, preferably copper, without the need for bending or lead forming. As a result, the bottoms of leads 43B and 43C and feet 53B and 53C are naturally coplanar with one another as represented by horizontal line 46. Except for a small ledge 52 of leads 43B and 43C that extends beyond plastic body 42, the newly disclosed package is essentially leadless aside from its feet. Accordingly, packages made in accordance with this invention are herein referred to as flat "footed" packages, having corresponding acronyms DFF for dual-side footed packages and QFF for quad (four-sided) footed packages. In the context of this disclosure, the term flat refers to low profile, i.e. thin or low package height.

As illustrated, the vertical height of feet 53B and 53C is a fraction of the height of leads 43B and 43C. In a preferred embodiment, the height of feet 53B and 53C is no more than 30% of the vertical height of leads 43B and 43C. Because of the low foot height, during PCB assembly solder can easily wick onto feet 53B and 53C, covering the metallic lead extensions in solder. Since the solder joint occurs beyond the plastic package body rather than beneath it, solder quality and coverage can be easily confirmed by visual inspection, either by low cost visual-inspection machines or by the human eye.

The thermal characteristics and electrical performance of the disclosed DFF and QFF packages are similar to that of similar sized DFN and QFN packages except for a slight detriment in area efficiency lost by the extra area needed to accommodate the feet. In manufacturing, however, the differences in conventional leadless packages and the newly disclosed footed packages are substantial. In the conventional leadless package, solder must wick itself onto the sidewall of the package's vertical leads, whereas in the footed package solder can easily flow onto the low profile feet without needing to climb onto and adhere to an essentially vertical lead. The edge of the foot can be rounded to further enhance solderability and lead coverage, making it even easier for solder to cover the foot. Likewise, while it is nearly impossible to visually inspect solder coverage on the sides of the vertical leads present in conventional leadless packages, the disclosed footed package can be easily inspected for solder coverage and quality.

While a numerous design variations and manufacturing flows are possible to produce the footed package, one exemplary manufacturing flow is shown in cross section in FIG. 5A through FIG. 5G, starting with a solid piece of metal piece 43 and finishing with a completed package 41.

Figure 5A:
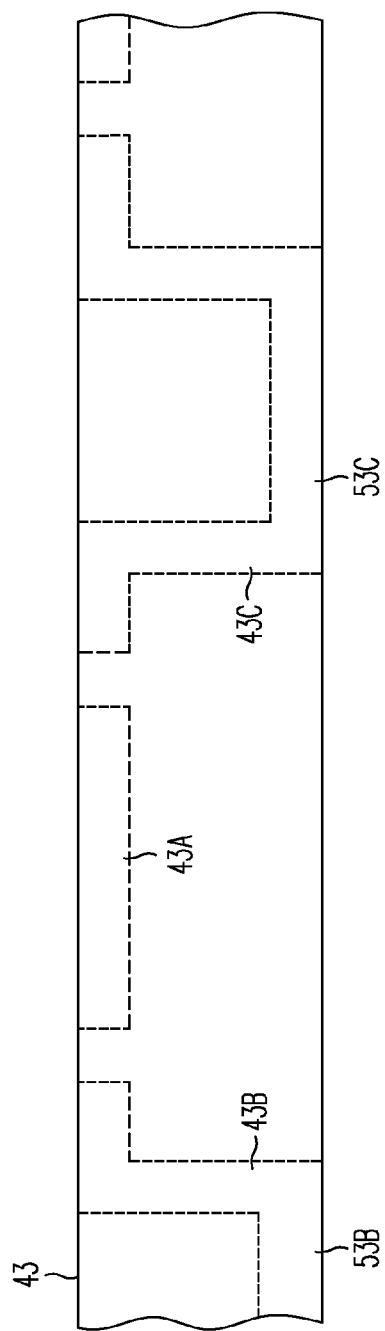
FIG. 5A is a cross-sectional view of a leadframe prior to manufacturing illustrating the locations of the elements to be formed.

FIG. 5A illustrates a single solid metal piece 43 forming a portion of a conductive leadframe used to fabricate multiple packaged products simultaneously, comprising a metallic alloy or solid metal, preferably copper, and having a thickness that depends on the desired thickness and power rating of the package. In low-profile package applications like portable consumer devices where package thickness is critical, metal piece 43 must be limited in height, e.g. approximately 200 µm thick, while in higher power applications a thicker metal is needed, as a a thicker metal, e.g. from approximately 500 µm to approximately 1.2 mm thick, is a better heat spreader. In some embodiments, the metal may be more than 1.2 mm thick. The copper may be plated with another metal such as Sn (tin) either at the beginning at the process or later in manufacturing.

The lateral dimensions of the portion of the metal piece 43 from which a single package will be manufactured vary with the size of the package, ranging from a fraction of a millimeter to tens of millimeters for a single package. For illustrative purposes, the constituent package elements into which metal piece 43 will be manufactured are shown in FIG. 5A as dotted lines, defining where die pad 43A and metallic leads 43B and 43C (including feet 53B and 53C) will be formed during the processing in accordance with this invention.

Figure 5B:
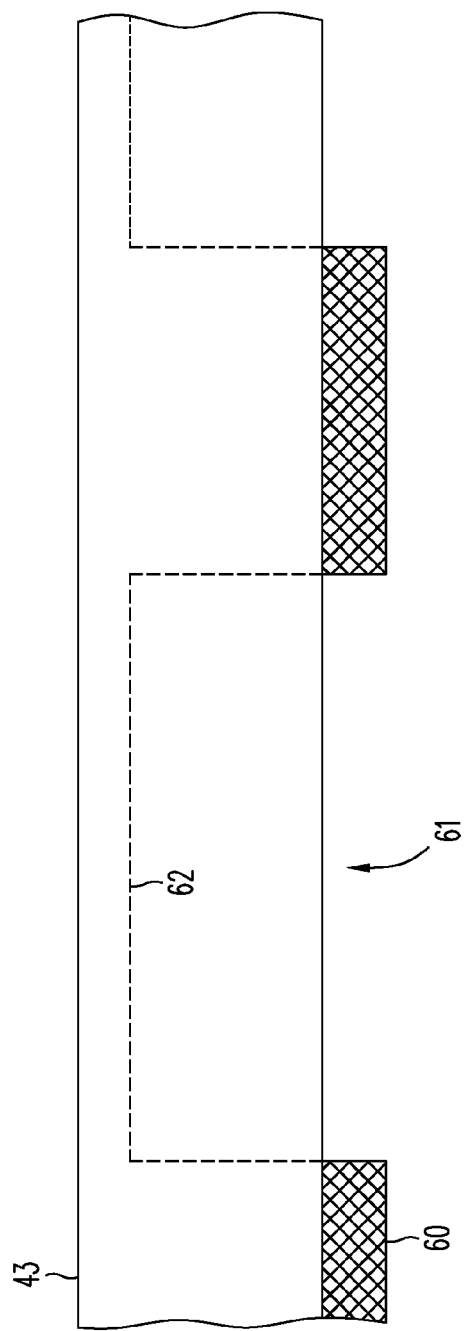
FIG. 5B is a cross-sectional view of a leadframe after the first mask process step and prior to the first metal etch.

In FIG. 5B, metal piece 43 is coated with a photoresist layer 60, which is optically patterned using photolithographic means to define an opening 61 exposing metal piece 43. Metal piece 43 is subsequently etched to form a thin region 62. Alternatively, protective photoresist layer 60 may be silkscreened through a stencil mask to define the opening 61 in photoresist layer 60. The subsequent metal etching is performed by immersing the metal piece 43 in a heated acid bath of sulfuric or nitric acid, or other acids commonly used to etch metal in semiconductor package manufacturing. After etching, the thin region 62 may have a thickness equal to 10% to 30% of the original thickness of metal piece 43, but the thin region 62 is generally at least 50 µm thick.

In an alternative embodiment, a metal "stamp" is used to stamp and compress a portion of metal piece 43 to form thin region 62. Metal stamping, a method well known to those skilled in the art of metal working, utilizes powerful precision machinery that mechanically impacts and locally compresses metal piece 43 with a custom-made steel "die" in rapid fashion to form thin regions mechanically rather than chemically. Because stamping takes only seconds while chemical etching take tens-of-minutes to hours, stamping is therefore able to achieve a higher throughput and lower manufacturing costs to form thin region 62 than the slower metal etching method described previously.

In the metal stamping process, the stamping machine's metal stamp has a feature having the same dimensions and located in the same places as shown by the opening 61 in photoresist layer 60. Photoresist layer 60 is therefore not required during metal stamping (except that during the making of the stamp itself a photoresist layer may be used to define the stamp's protruding areas). When the hardened steel stamp strikes metal piece 43, it locally compresses the softer metal piece 43 to the target thickness of thin region 62 while leaving other portions at full thickness.

Depending on the type of metal used for metal piece 43, the amount of compression can be substantial, squeezing the metal atoms into a volume down to even 10% of the original thickness. Between the thick and thin portions of metal piece 43, the stamp creates a clean sheer vertical cut, even sharper than edges produced by etching. For stamping, it is preferable that metal piece 43 be made of a uniform metal or alloy with no plated metal on its surface because, during stamping, plated metal may crack or flake off. If stamping is used for manufacturing, any metal plating should be performed after the stamping is complete; the use of "pre-plated" metal should be avoided.

When the die pad in the completed package is to be exposed at the bottom of the package (referred to herein as an "exposed die pad") a portion of the photoresist layer 60 is left within the opening 61. As a result, the etch process illustrated in FIG. 5B removes a portion of metal piece 43 only in the areas where the cantilever segment of the lead and the gap between the lead and the die pad in the completed package are to be located. The area in which the die pad is to be located is not etched. If a metal stamping process is used, the stamping die is correspondingly designed so that only the areas where the cantilever segment of the lead and the gap between the lead and the die pad are to be located are compressed.

In FIG. 5C, metal piece 43 is coated with a photoresist layer 64, which is optically patterned using photolithographic means to define openings 65 and 66. A second etch is then performed on metal piece 43 through openings 65 and 66 to form openings 67 and thin regions 68 in metal piece 43. Alternatively, the photoresist layer 64 may be silkscreened through a stencil mask to define openings 65 and 66 in photoresist layer 64. The second etch is performed by immersing the metal piece 43 in a heated acid bath of sulfuric or nitric acid, or other acids commonly used to etch metal in semiconductor package manufacturing.

As shown, the openings 66 in photoresist layer 64 define the areas of metal piece 43 that will be subjected to the second metal etch so as to form the thin regions 68. Openings 65 define areas of the thin regions 62 of metal piece 43 to be exposed to the second etch so as to form the gaps 67 in metal piece 43. The depth of the second etch process is chosen to thin metal piece 43 from its full thickness to a thickness preferably equal to 10% to 30% of the original thickness but generally no thinner than 50 μm. In openings 65 in photoresist layer 64, thin region 62, previously formed during the first etch, is exposed to the second etch, which completely removes all the metal in the thin regions 62 to form gaps 67. Note that the opening 66 in photoresist layer 64 is laterally offset from the opening 61 in photoresist layer 60 so as to form the vertical column segment of the lead, as shown in FIG. 5D.

In an alternative embodiment, a hardened metal stamp is used to stamp and compress a portion of metal piece 43 to form thin regions 68. As described previously, a metal stamp, typically made of steel or steel alloys, having protrusions that coincide with the openings 66 in photoresist layer 64, compresses metal piece 43 to its final thickness 68. Other portions of metal piece 43 remain unaffected and at their original thickness. As described previously, between thick and thinned portions of metal piece 43 the stamp creates a clean sheer vertical cut.

In the alternative embodiment a second mechanical operation, metal punching, is used after stamping to form openings 67 in the thin regions 62 of the metal piece 43. Metal punching, like stamping, a method well known to those skilled in the art of metal working, utilizes precision machinery that impacts and locally cuts and removes portions of metal piece 43 with a custom-made steel punch in rapid fashion. The punch, unlike a stamp, is designed to cut and completely remove material, whereas a stamp is generally used to compress and thin material, but not to remove it. Compared to chemical etching, mechanical punching takes only seconds, rather than tens-of-minutes or hours, and is therefore able to achieve higher throughput and lower manufacturing costs to form openings 67 than metal etching.

If thin region 62 is sufficiently thin, a steel stamp having protrusions that coincide with both opening 66 and 65, may actually be used to form openings 67 simultaneously, in the same process step, with thin regions 68, Thus both the stamping and the punching operations are performed in a single step. While the combined operation may be theoretically possible, specialization of skills in machinists and the assignment of dedicated equipment for stamping and punching may render commercial production of a one-step operation more specialized and therefore more expensive than performing stamping and punching separately and sequentially.

It should also be noted that the etching or stamping of metal piece 43 to form thin regions 68 occurs on the opposite side of metal piece 43 from the steps used to form thin regions 62. In practice, this involves processing one side of the metal piece 43, then turning it over to process its other side. For clarity's sake however, the process steps shown in FIG. 5A through FIG. 5G maintain the same orientation of metal piece 43 as the final package orientation throughout the illustrations, showing some operations such as that of FIG. 5C on the topside of metal piece 43 while illustrating other steps, e.g. in FIG. 5B, being performed on the backside of metal piece 43.

While the process of patterning and thinning metal piece 43 has been described using masking and chemical etching processes, and in an alternative embodiment using mechanical stamping and punching processes, the methods may be performed in combination. For example, chemical etching may be used to form thin regions 62 while mechanical methods may be used to form thin regions 68 and openings 67. As a practical matter, a photoresist layer such as layer 60 or 64 should not be present on metal piece 43 whenever a mechanical operation is performed.

FIG. 5D illustrates the portions of metal piece 43 remaining after the prior metal thinning operations, including leads 43B and 43C and die pad 43A, components of a leadframe 49 comprising the metal pieces as shown forming package 41 and other metal pieces forming other packages not shown in this cross section, temporarily held together by shared metal strips forming the leadframe. A leadframe is the combination of the metal pieces forming the leads and die pad of multiple packages and the metal rails used to hold these metal pieces in place during manufacturing. After molding, the leads are separated from the leadframe to "singulate" the package from the lead frame's metal rails and from the other packages made on the same leadframe. Openings 67 separate die pad 43A from leads 43B and 43C. Other openings similar to openings 67, not shown in FIG. 5D, separate other leads similar to leads 43B and 43C from die pads similar to die pad 43A. In this stage in the manufacturing flow, thin regions 68 still connect leads 43B and 43C with the leads of adjacent packages, and the die pad 43A and other similar die pads are not "floating" but instead are held in place by attachments to metal piece 43 in the third dimension, i.e. beyond the plane of the cross-section at which FIG. 5D is taken. Thus, despite having thin regions 62 and 68 and openings 67, the leadframe 49 can still be handled as a single metal sheet.

FIG. 5E illustrates the leadframe 49 after die attach and wire bonding processes. Sequentially, a semiconductor die 44 is first attached to die pad 43A using solder or epoxy. The epoxy may be electrically conductive, using metal filling in the epoxy glue, or can be electrically insulating, as required. Wire bonding is then performed to form bond wires 45B and 45C between metal bond-pads located on the surface of semiconductor die 44 and cantilever segments of leads 43B and 43C. The bond wires 45B and 45C may comprise gold, copper, aluminum or other metal alloys. Other leads, not visible in FIG. 5E, may similarly be connected through corresponding bond wires to other leads. Die pad 43A and leads 43B and 43C, along with other leads (not shown in FIG. 5E), are held together during die attach and wire bonding operations in leadframe 43, which comprises many similar die pads and leads that were fabricated contemporaneously with die pad 43A and leads 43B and 43C.

Leadframe 49 is next molded with plastic using plastic injection molding or mold transfer processes well known to those skilled in the art, forming a plastic body 42 shown in FIG. 5F. Except for the small ledge 52, plastic body 42 covers the die pad 43A and the elevated horizontal portions of leads 43B and 43C, i.e. the portions not touching horizontal line 46, filling in both above and below the leadframe 49 to encapsulate die 44. The ledge 52 comprising a slight protrusion of leads 43B and 43C beyond plastic body 42 occurs because the plastic body 42 must be mechanically aligned to the leadframe 49. Because any mechanical process must accommodate some tolerance for misalignment, the lateral sides of plastic body 42 are slightly stepped back from the outside edges of the vertical column segments of leads 43B and 43C. The ledges 52 are small, however, e.g.

0.1 mm in length, and therefore have a minimal impact on the size of the package's footprint. In a preferred embodiment, plastic body 42 does not overlap onto the thin regions 68.

Because the mold defining the location of the edge of plastic body 42 is mechanically aligned to leadframe 49, some tolerance for misalignment resulting from natural statistical variation in manufacturing must be included in the design of the lateral dimension of ledge 52. To avoid the case where the plastic body 42 overlaps onto thin regions 68 and in other cases forms a ledge 52, the design length of the ledges 52 should be sufficient to accommodate variations in the dimensions of the leadframe 49 (whether formed by etching or stamping) and to accommodate variations in the mold-to-leadframe alignment. This design length (tolerance) depends on the processing equipment and its maintenance and may vary from 0.01 mm to 0.2 mm (preferably less than 0.1 mm).

In an alternative embodiment, plastic body 42 extends beyond the vertical outside edges of leads 43B and 43C, such that die 44 and leads 43B and 43C are sealed entirely within plastic body 42 and plastic body 42 overlaps slightly onto thin regions 68. But since this method consumes a larger dimension for the same die width, the maximum size of die 44 is adversely impacted compared to the embodiment shown in FIG. 5F. If plastic body 42 is to consistently overlap onto the thin portion 68 of leadframe 49, the design dimension of that overlap must be sufficient to account for dimensional variations in leadframe 49 from etching or stamping and variations in the mold-to-leadframe alignment.

After plastic molding, the individual packages are separated, i.e. singulated, by cutting through the thin regions 68 with a precision saw. Dashed lines 51Y represent the locations of the edges of the saw blade as it cuts through thin regions 68, leaving (except for the small ledges 52) only feet 53B and 53C protruding beyond plastic body 42, as shown in the cross-sectional view of FIG. 5G. Since plastic body 42 does not overlap onto thin regions 68, the saw blade does not cut any portion of plastic body 42, leaving feet 53B and 53C exposed for convenient soldering. By contrast, in conventional leadless packages, the saw blade cuts through both the plastic body and the metal leads. With only a single cutting operation to define the lateral extent of both plastic and metal, conventional leadless package construction is incapable of producing a package wherein the metal leads protrude beyond the plastic body.

Figure 5G:
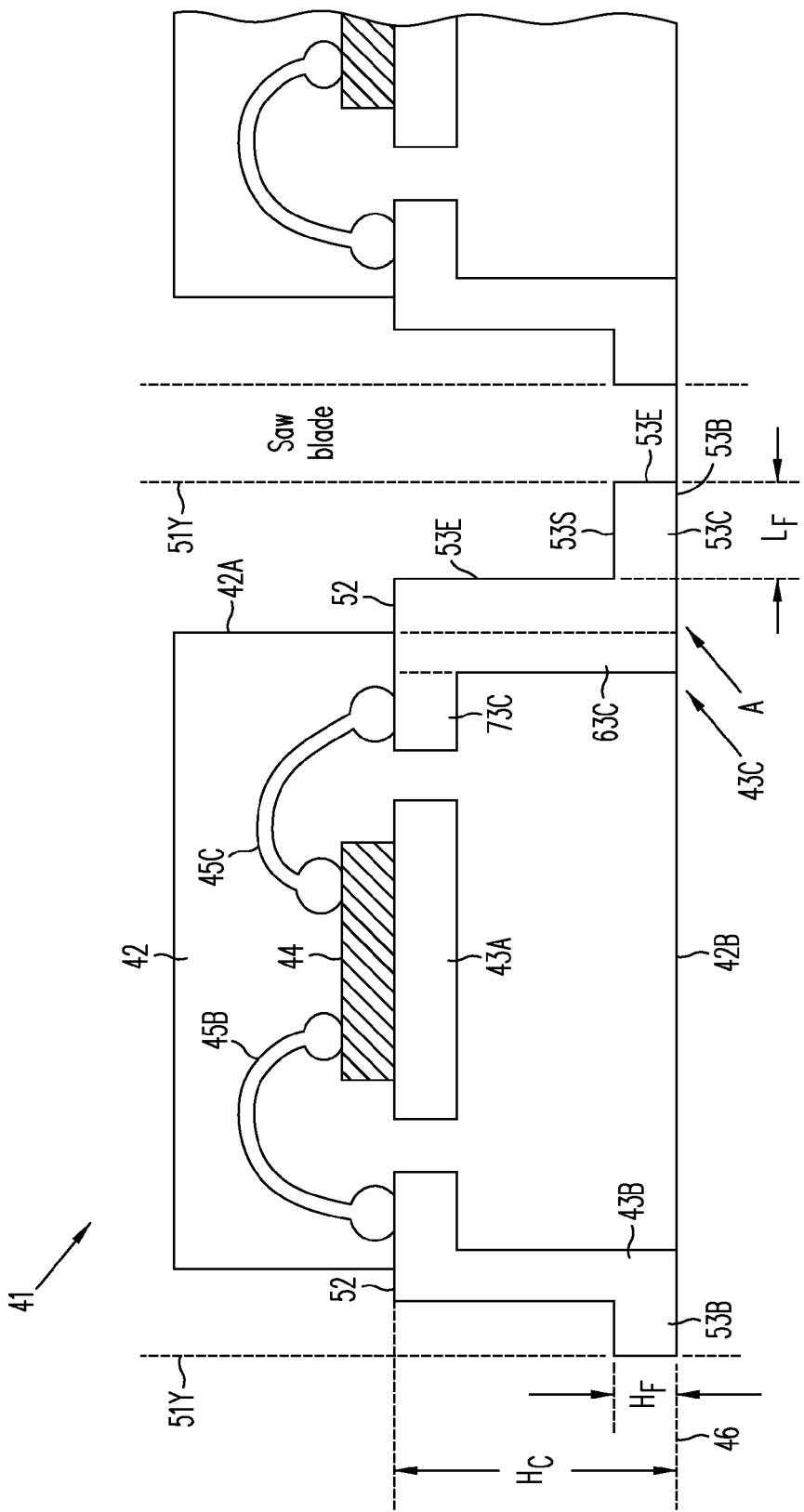
FIG. 5G is a cross-sectional view of the leadframe after the die singulation process steps.

FIGS. 5F and 5G illustrate the saw blade cutting through leadframe 49 in a direction parallel to the dashed lines 51Y (the "y-direction"). In a second pass, the same saw cuts leadframe 49 in a direction perpendicular to the dashed lines 51Y (the "x-direction"), completing the singulation process and separating every package in leadframe 49 from its neighboring packages.

In the x-direction, the saw blade may cut through the leads, as shown in FIGS. 5F and 5G, or it may cut through the plastic body 42 and no leads, depending on the type of package being manufactured. In a "quad" lead package (QFF) which has leads on all four sides, the saw blade cuts the thin regions 68 of the leadframe 49 when cutting in the x-direction, in a manner similar to that shown in FIGS. 5F and 5G. In a dual-sided or DFF package, a package with leads only two sides, the saw blade cuts (with but one exception) only through the plastic body 42 when cutting in the x-direction, since no leads are present on the sides of the packages parallel to the x-direction.

The exception is for the so called "tie-bars", which comprise thin metal extensions used to hold the die pad 43A and the other die pads in place prior to molding. Unlike leads 43B and 43C whose feet 53B and 53C extend beyond plastic body 42, the tie bars are cut flush with the plastic body 42 and do not (and should not) protrude beyond the plastic as they may inadvertently result in unwanted shorts during PCB assembly and wave soldering. In a preferred embodiment, the tie bars are formed in an elevated position at the level of die pad 43A and the other die pads.

After singulation, the resulting footed package 41 shown in FIG. 5G, comprises die 44 mounted atop die pad 43A contained within plastic body 42, with leads 43B and 43C that do not laterally extend beyond plastic body 42 by any substantial amount except for feet 53B and 53C. Die 44 is connected to leads 43B and 43C by corresponding wire bonds 45B and 45C. The length of feet 53B and 53C is defined by the location of saw cuts 51Y in the y-direction (and for QFF packages by the perpendicular saw cuts in the x-direction). The length of ledges 52 is essentially negligible compared to the width of package 41 and to the length of the feet 53B and 53C. The bottoms of feet 53B and 53C are coplanar with the bottom of plastic body 42. Die pad 43A is enclosed and surrounded by plastic body 42, except for the ends of the metal tie bars and any leads that may be optionally connected to die pad 43A, as described below.

Referring to FIG. 5G and to lead 43C in particular, it is apparent that a package of this invention may comprise a lead that is generally Z-shaped when viewed in a vertical cross section. Lead 43C comprises a vertical column segment 63C, a cantilever segment 73C and a foot 53C. Cantilever segment 73C extends horizontally inward towards the die pad at the top of vertical column segment 63C, and foot 53C extends horizontally outward at the bottom of vertical column segment 63C. Vertical column segment 63C forms right angles and sharp inside corners with cantilever segment 73C and with foot 53C. The bottom surface of foot 53C is coplanar with a bottom surface 42B of plastic body 42. Typically the top surface of the cantilever segment 73C is coplanar with the top surface of the die pad 43A. In some embodiments the thickness of the cantilever segment 73C is equal to the thickness of the die pad 43A.

As shown, vertical column segment 63C has a height $H_C$ and foot 53C has a height $H_F$ and length $L_F$. The height He of the vertical column segment 63C is equal to the original thickness of the metal piece 43. In some embodiments, the height $H_F$ of the foot 53C is no greater than 30% of the height $H_C$ of the vertical column segment 63C. An upper surface 53S of the foot 53C may be horizontal and parallel to a bottom surface 53B of the foot 53C.

Figure 1B:
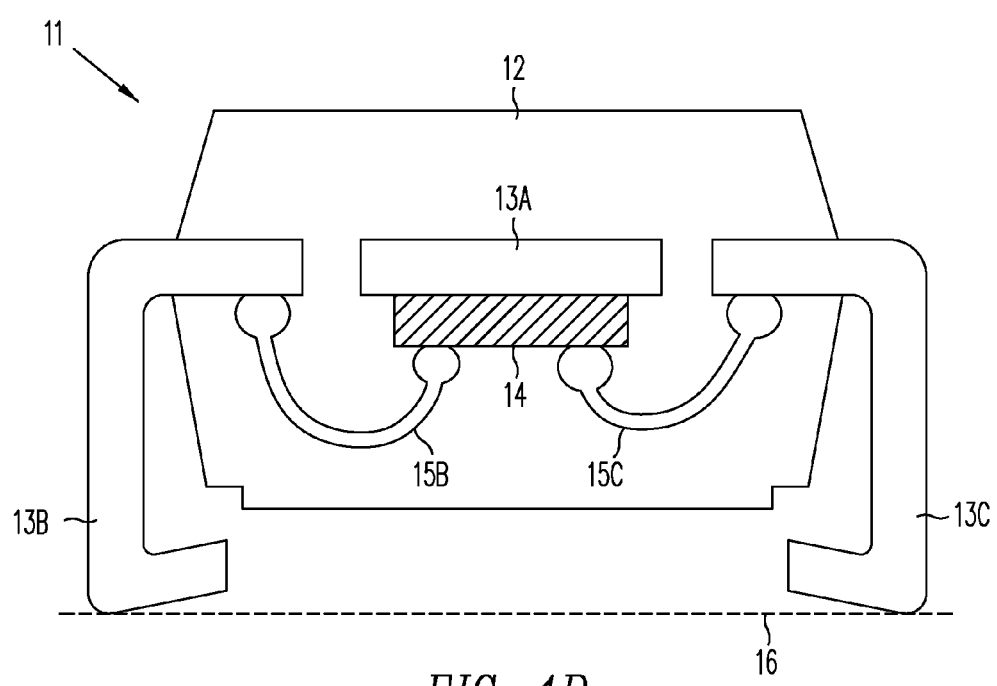
FIG. 1B is a cross-sectional view of a leaded JW-type package.
Figure 2A:
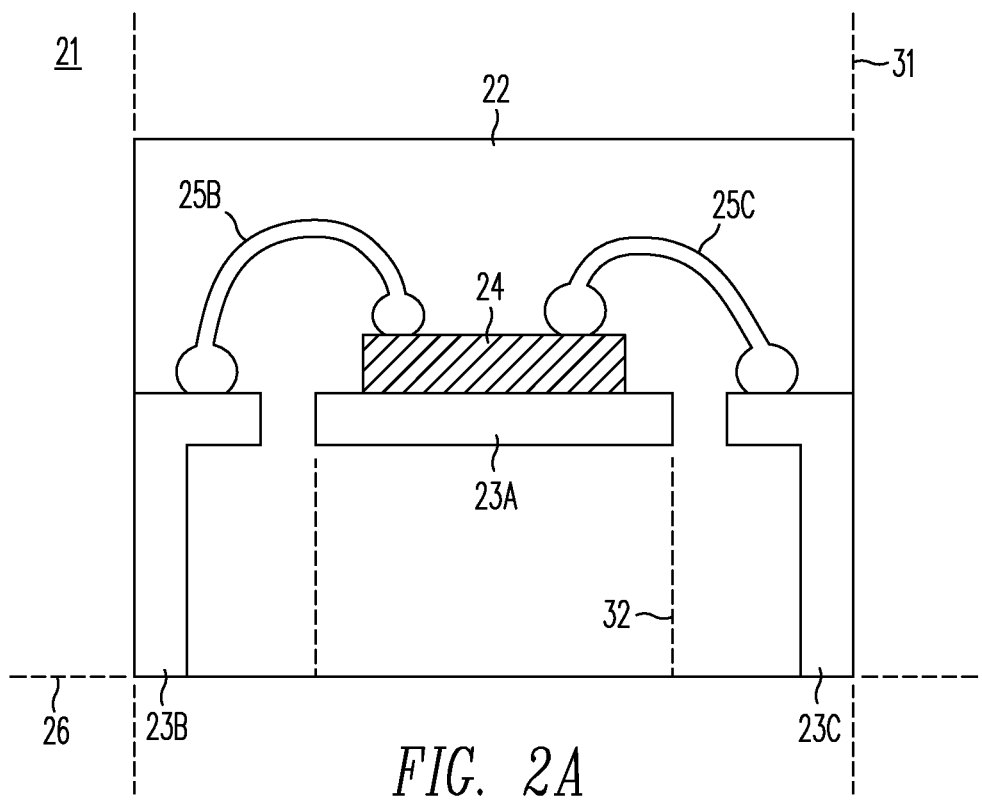
FIG. 2A is a cross-sectional view of a leadless package.
Figure 2B:
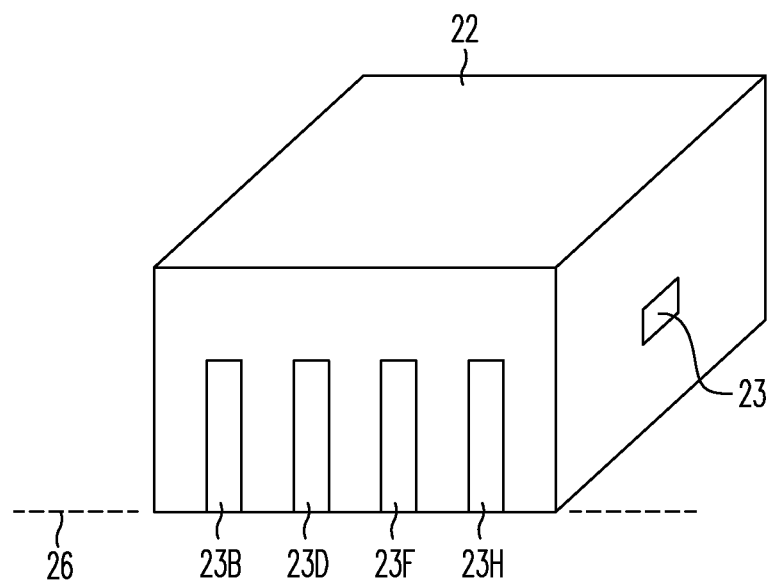
FIG. 2B is a perspective view of a leadless package.
Figure 2C:
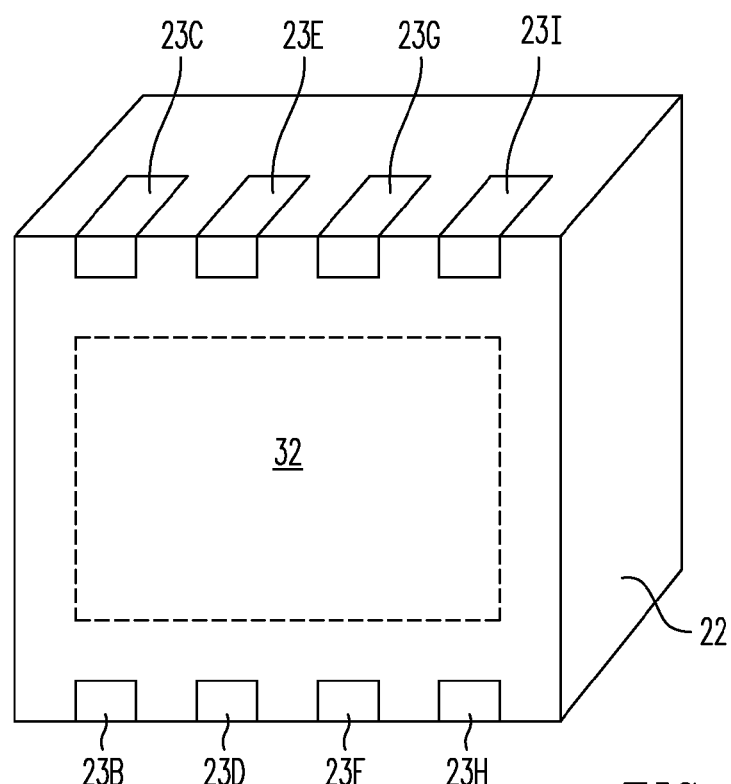
FIG. 2C is a bottom view of a leadless package.
Figure 2D:
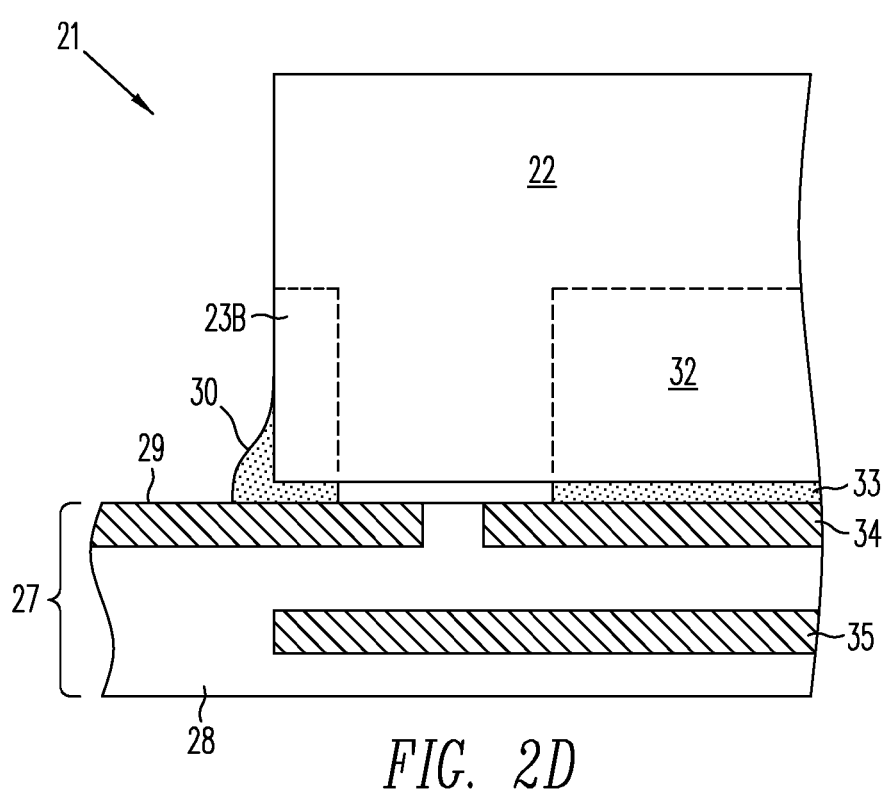
FIG. 2D is a cross-sectional view of a leadless package mounted on a PCB using solder reflow.
Figure 7A:
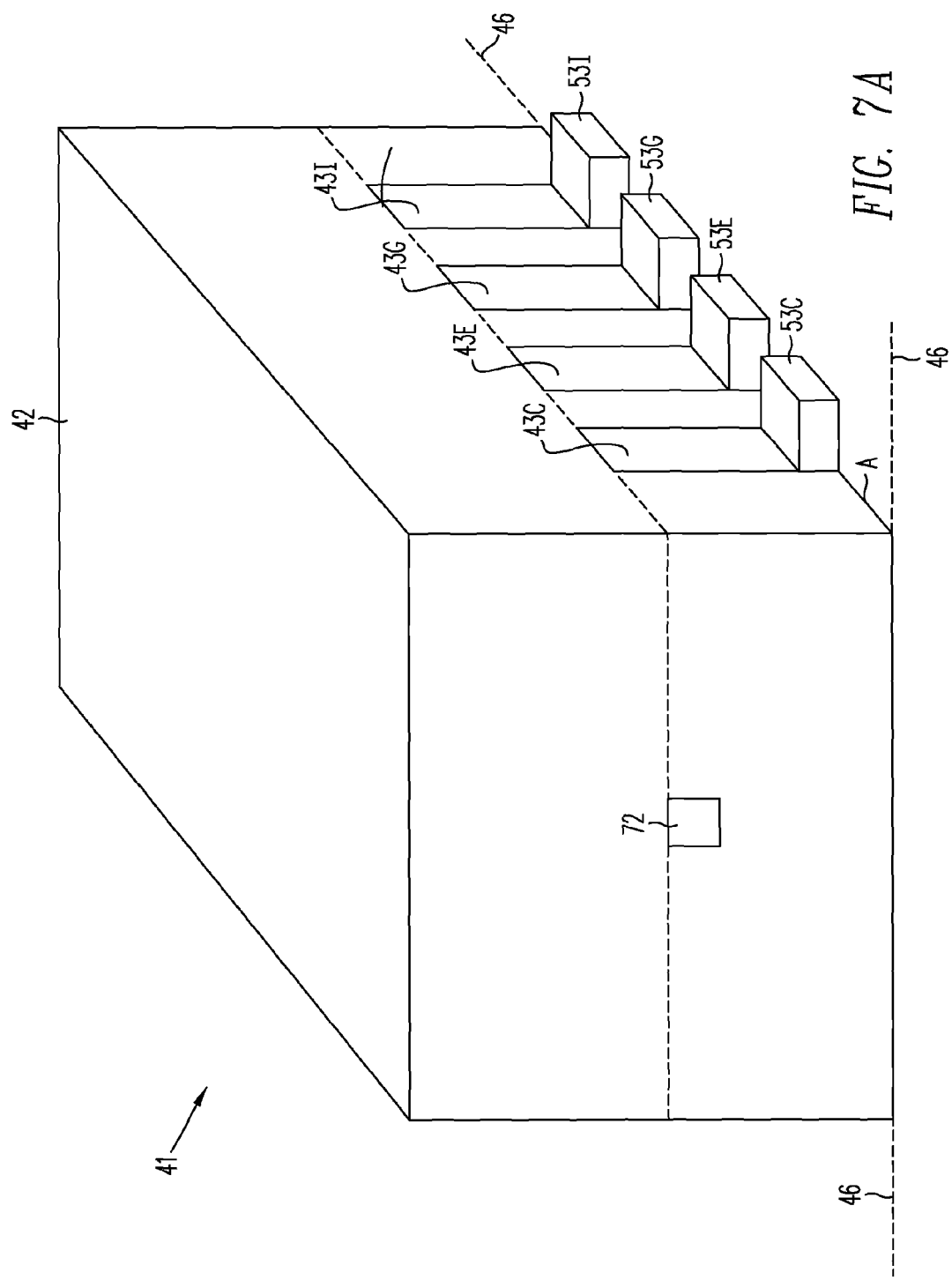
FIG. 7A is a perspective view of an 8-lead DFF footed package.
Figure 7B:
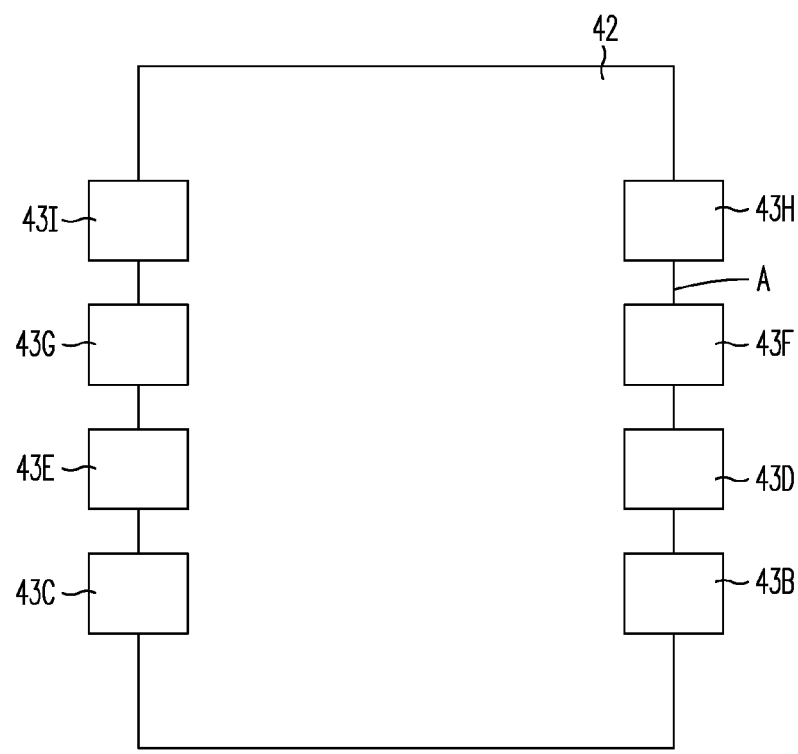
FIG. 7B is a bottom view of a narrow body 8-lead DFF footed package.
Figure 7C:
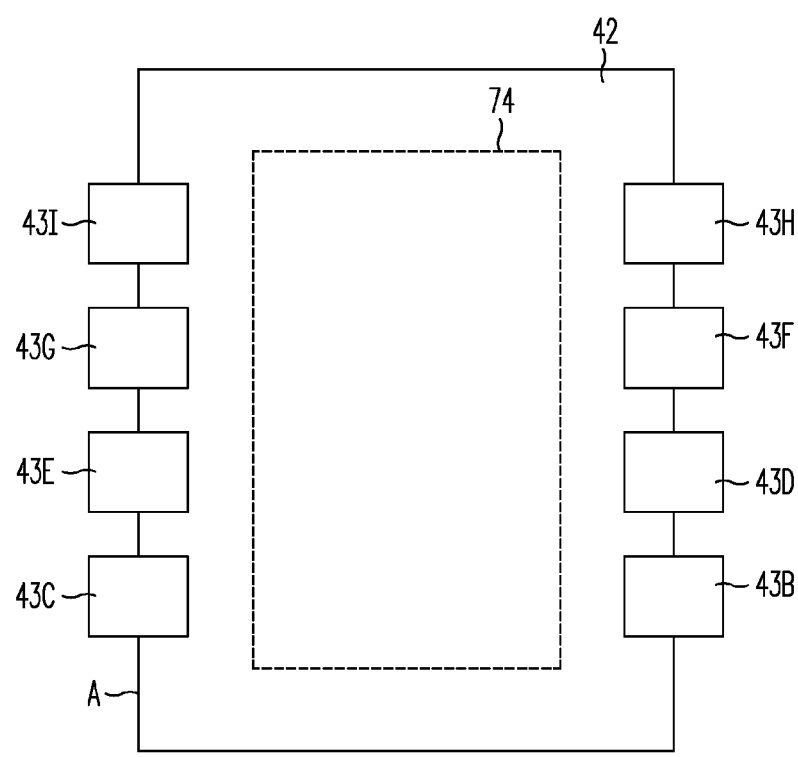
FIG. 7C is a bottom view of a wide-body 8-lead DFF footed package.

In the embodiment shown in FIG. 5G, vertical column segment 63C extends horizontally beyond a side surface 42A of plastic body 42 to form ledge 52. (Note that FIG. 5G is not drawn to scale.) Thus a vertical outside edge 63E of vertical column segment 63C is not covered by plastic body 42. In other embodiments, the side surface 42A of plastic body 42 is positioned outward (to the right in FIG. 5G) beyond the vertical column segment 63C and covers a portion of the upper surface 53S of foot 53C. In such embodiments, there is no ledge 52 and the foot 53C protrudes outward at the bottom of the side surface 42A of the plastic body 42. The package of this invention uniquely combines the characteristics of a leaded package, shown in FIGS. 1A and 1B, with those of a leadless package, shown in FIGS. 2A and 2B. Thus the outside edge 63E of vertical column segment 63C forms a vertical plane and is either covered by plastic body 42 or is located slightly outside the surface 42A of plastic body 42. These features minimize the horizontal dimension of package 41. Moreover, the bottom surface 53B of foot 53C is flat at least from a location adjacent to the side surface 42A of plastic body 42 (marked by the letter A) to an end 53E of foot 53C. (Note that the location of the side surface 42A in a third dimension outside the cross section at which FIG. 5G is taken is shown as a dashed line. The location is also shown in FIGS. 7A-7C). All or a portion of the upper surface 53S of foot 53C is exposed. With this combination of features, the horizontal footprint of the package is minimized and yet solder can easily flow onto the foot 53C and the package can be easily inspected for solder coverage and quality.

Figure 6A:
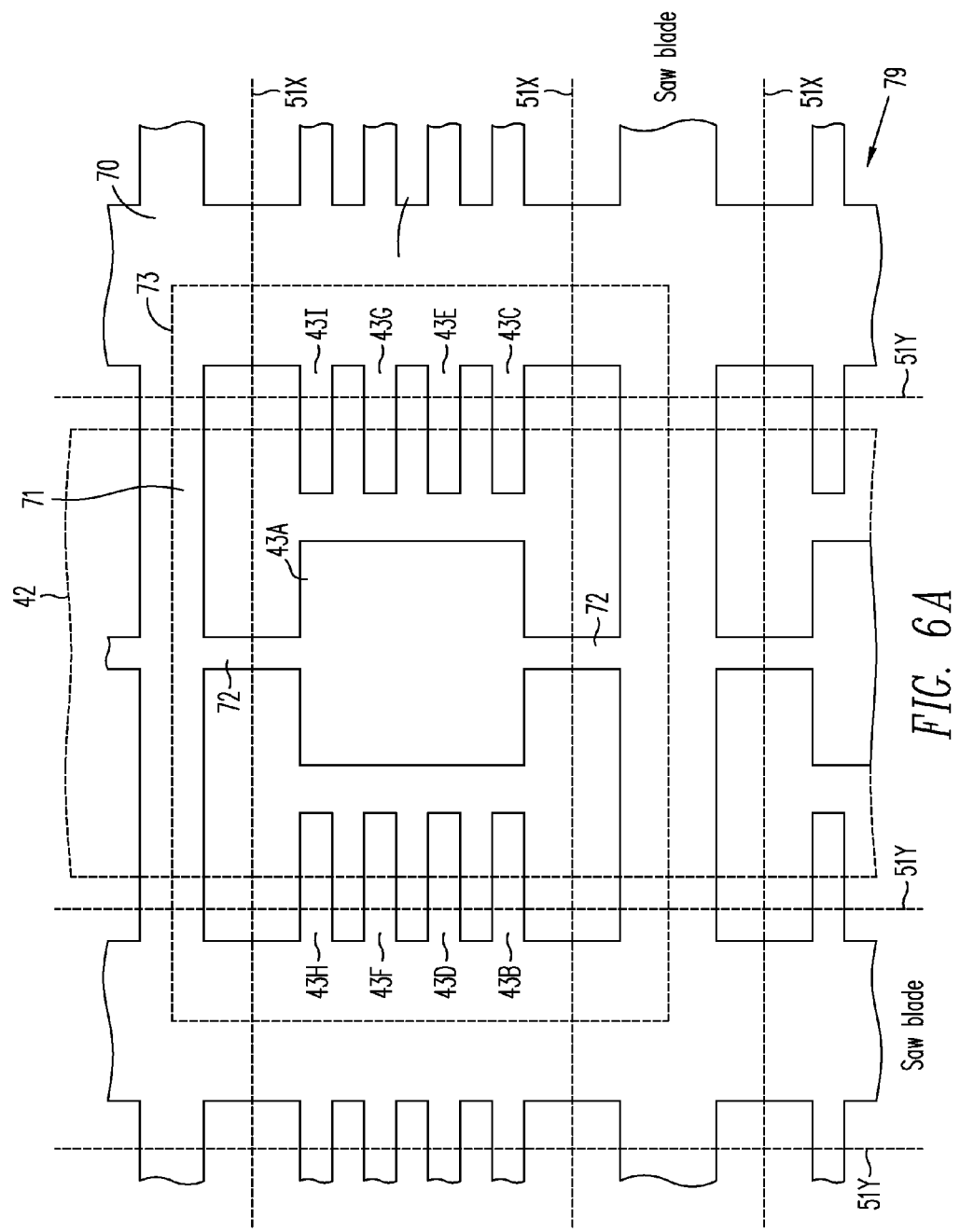
FIG. 6A is a plan view of a multi-package DFF leadframe including supporting bars holding adjacent packages in place.

FIG. 6A illustrates a plan view of a leadframe 79 for an 8-lead DFF footed package made in accordance with this invention prior to die attach and wire bonding. The leadframe 79 comprises vertical and lateral bus bars 70 and 71 to provide mechanical rigidity to the structure supporting a multiplicity of identical packages arranged in an array of rows and columns. In this illustration, variations in the thickness of leadframe 79 from etching or stamping are not shown except where openings have been formed in leadframe 79 in prior steps.

In FIG. 6A, a dashed line indicates a unit cell 73 defining one DFF package. Unit cell 73 is repeated multiple times within leadframe 79 to produce multiple packages simultaneously. Within unit cell 73, the DFF package includes die pad 43A, leads 43B through 43I, and tie bars 72. For clarity's sake, the location of the semiconductor die and its bond wires has been omitted. Plastic body 42 is shown in dashed lines.

Plastic body 42 intersects and laterally overlaps only a portion of leads 43B through 43H. Saw blade cut lines 51Y intersect leads 43B through 43I but do not intersect plastic body 42, thereby defining the length of the feet of leads 43B through 43I protruding beyond plastic body 42. During singulation, saw cut 51Y permanently separates leads 43B through 43H from metal bus bar 70.

Plastic body 42 entirely laterally encloses die pad 43A and tie bars 72. Thus, plastic body 42 forms a continuous vertical stripe overlapping all of the die pads in one row along the length of the leadframe. During singulation, saw cut lines 51X transect plastic body 42 and tie bars 72, separating die pad 43A from bus bars 71 and completely removing the package within unit cell 73 from the other packages formed on leadframe 79. Since saw cut 51X cuts through both plastic body 42 and metal tie bars 72, the ends of tie bars 72 after singulation are vertically flush with the lateral extent of plastic body 42.

Figure 6B:
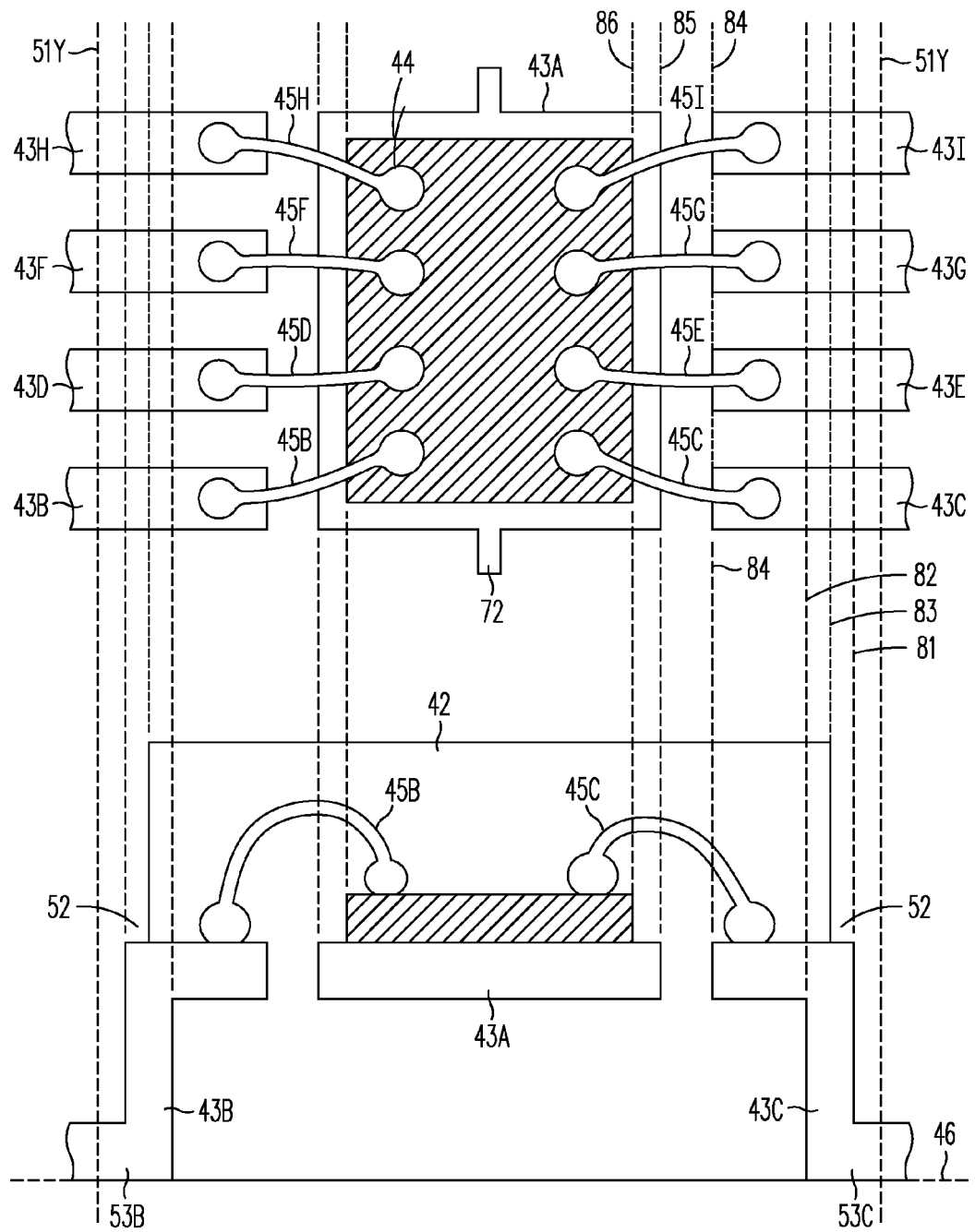
FIG. 6B is a widthwise (x-direction) cross-sectional and corresponding plan view of a DFF footed package illustrating common features and their relative alignment.

Adding detail to the prior figure, FIG. 6B illustrates both a plan view and a correlated cross-sectional view of the aforementioned DFF package through a section parallel to the x-direction. The cross-section shown is taken through the center of leads 43B and 43C, illustrating die 44, bond wires 43B and 43C, die pad 43A, leads 43B and 43C, package feet 53B and 53C and plastic body 42.

As shown, semiconductor die 44 having a lateral edge (collinear with dashed line 86) is positioned atop and laterally disposed within an edge of die pad 43A (collinear with dashed line 85). The underlap of die pad 43A beyond die 44, i.e. the distance between dashed lines 86 and 85, is beneficial to insure reliable and reproducible electrical and thermal contact between the die and the die pad. To insure that die 44 never extends beyond the edge of die pad 43A, the overlap needs to accommodate stochastic dimensional variations in die pad 43 as well as misalignment of die 44 to the leadframe 79 and die pad 43A. The underlap of die pad 43A beyond die 44 may range from tens to hundreds of microns, but in preferred embodiment should not exceed 100 microns or be lower than 20 microns. While it is possible to for the underlap to be very small or even zero, it is not advisable since any overhang of die 44 beyond the edge of die pad 43A can subject the die 44 to stress, cracking, and reliability failures.

The gap between the edge of die pad 43A and the inner edges of leads 43B through 43I, i.e. the space between dashed line 85 and dashed line 84, is determined in the manufacturing of leadframe 49, and may differ for etched and stamped leadframes. A gap of 100 microns can be manufactured with low risk of electrical shorts between die pad 43A and leads 43B through 43I.

As shown in the cross-sectional view of FIG. 6B, each of leads 43B through 43I is in the shape of a "Z," with a thin horizontal elevated region of the same thickness and at the same height as die pad 43A, a thin horizontal "foot" coplanar with the bottom of the package and plane 46, and a vertical column segment connecting the two horizontal regions. The vertical column segment located between dashed lines 82 and 81 intersects and is partially embedded in plastic body 42, having an inside edge covered and enclosed by plastic body 42 and having an exposed outer edge.

The minimum length of the leads within plastic body 42, i.e. the length of leads 43B through 43I measured from dashed line 84 to dashed line 83, must be sufficient to accommodate the balls by which bond wires 45B through 45I are mounted to leads 43B through 43I, while insuring these balls are contained entirely within plastic body 42.

Dashed line 82 defines the transition from the thin cantilever segment (diving board) of leads 43B through 43I, to a thicker vertical column segment having a vertical length equal to the original thickness of metal piece 43, as shown in FIG. 5A. In a preferred embodiment this edge defined by dashed line 82 is laterally contained within plastic body 42, with sufficient overlap to insure that stochastic variations in the dimensions of the leadframe 49 and in the alignment of leadframe 49 to plastic body 42 do not occasionally allow the vertical column segments of any of leads 43B through 43I to be completely uncovered. Minimum overlap dimensions range from 100 microns to 20 microns.

Similarly, dashed line 81 defines outer edges of the vertical column segments of leads 43B through 43I and the transition of leads 43B through 43I from a vertical column segment to a thin horizontal foot region coplanar with the bottom of the package, i.e. the portion of leads 43B through 43I comprising feet 53B through 53I lying on plane 46. In a preferred embodiment these outer edges coincident with dashed line 81 are located outside the edge of plastic body 42 with sufficient space for ledge 52 to insure that stochastic variations in the dimensions of the leadframe 49 and in the alignment of leadframe 49 to plastic body 42 do not occasionally completely cover the outer edges of the vertical column segments of any of the leads 43B through 43I. Minimum dimensions of ledge 52 range from 100 microns to 20 microns.

The lateral length of feet 53B through 53I extending beyond plastic body 42 is defined by saw blade cut 51Y, having minimum lengths of 100 microns to 20 microns.

Figure 6C:
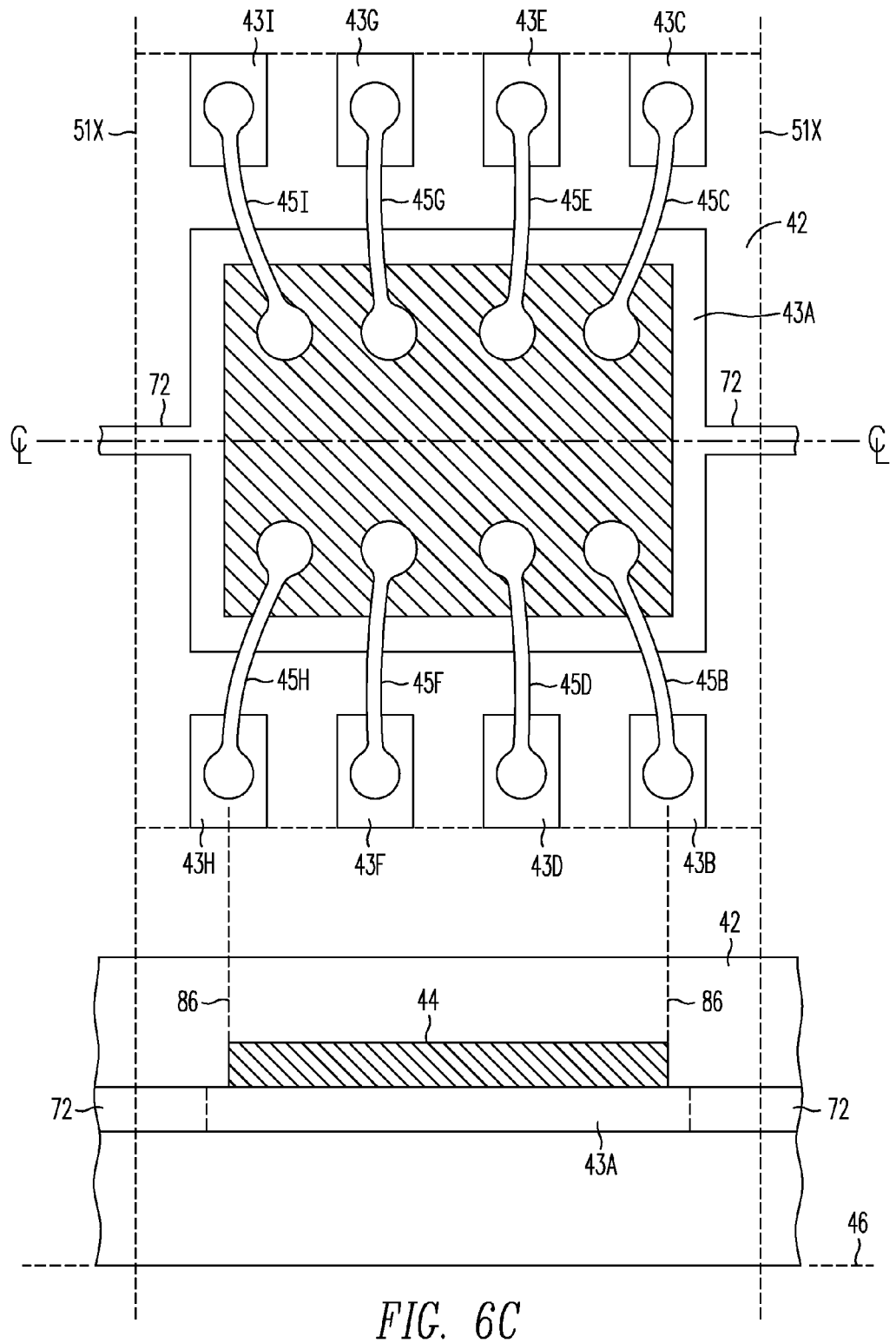
FIG. 6C is a lengthwise (y-direction) cross-sectional and corresponding plan view of a DFF footed package illustrating common features and their relative alignment.

FIG. 6C illustrates both a plan view and a correlated cross-sectional view of the aforementioned DFF package through a section parallel to the y-direction. The cross-section shown is taken through the center of tie bars 72, illustrating die 44, die pad 43A, tie bars 72, and plastic body 42. The plan view additionally illustrates bond wires 45B through 45I, leads 43B through 43I and plastic body 42. As shown, die 44 has edges collinear with dashed line 86 and contained laterally within die pad 43A and plastic body 42. Saw blade cut lines 51X transect tie bars 72 and plastic body 42, making the ends of tie bars 72 flush with the lateral edges of plastic body 42 at the ends of the DFF package, i.e. on the package edges where leads 43B through 43I are not located.

Figure 6D:
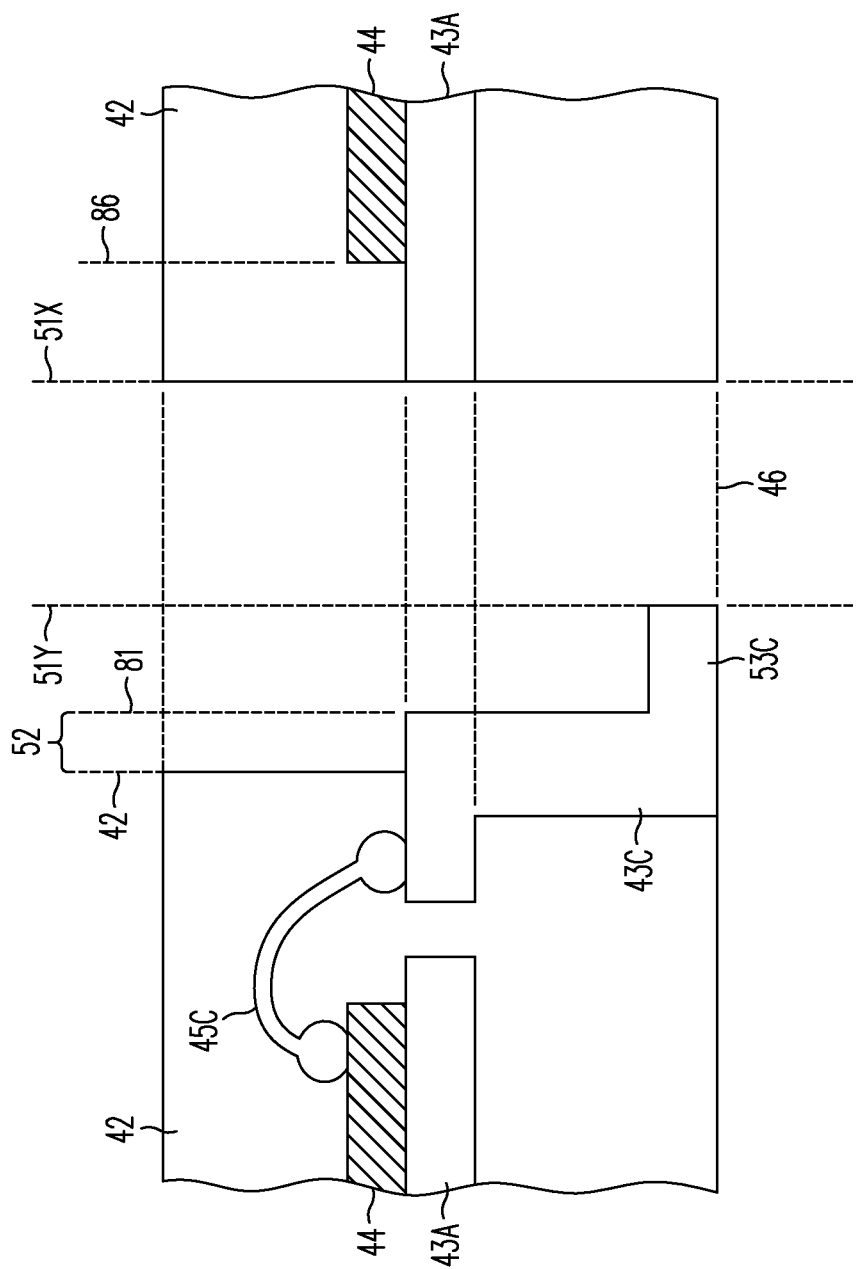
FIG. 6D is a comparison of the widthwise and lengthwise cross-sectional views of a DFF footed package illustrating the common features and their relative alignment.

FIG. 6D provides a direct cross-sectional comparison of the DFF package through a section parallel to the y-direction (leaded edges) and a section parallel to the x-direction (tie bar edges). As shown, die pad 43A, tie bars 72 and the thin elevated horizontal portion of lead 43C are coplanar. Likewise the bottom of foot 53C and plastic body 42 are coplanar with the bottom of the package and plane 46.

Saw cut line 51Y defines the length of foot 53C but does not intersect plastic body 42. The edge of plastic body 42 is stepped back from the outside edge of the vertical column segment of lead 43C (denoted by the dashed line 81) by the length of ledge 52. Die 44 is laterally inset from the edge of die pad 43A and spaced from the thin elevated horizontal portion of lead 43C. Saw line 51X defines the edge of plastic body 42 and tie bar 72. Edge 86 of die 44 is laterally inset from package edge defined by saw cut 51X.

A three-dimensional perspective drawing of an 8-lead DFF package 41 made in accordance with this invention is illustrated in FIG. 7A. Package 41 comprises plastic body 42, tie bar 72, and visible leads 43C, 43E, 43G and 43I, having corresponding feet 53C, 53E, 53G and 53I. The bottom of the plastic body 42, the bottoms of the vertical column segments of the leads 43B through 43I, and the bottoms of feet 53B through 53I are coplanar to the bottom of the package and plane 46. As shown, the sides of the vertical columns of leads 43 are exposed and not covered by plastic 42. The vertical portions of the leads protrude only slightly beyond the side edges of plastic body 42 and are therefore not shown in the drawing.

DFF Package with Exposed Die Pad

Figure 7D:
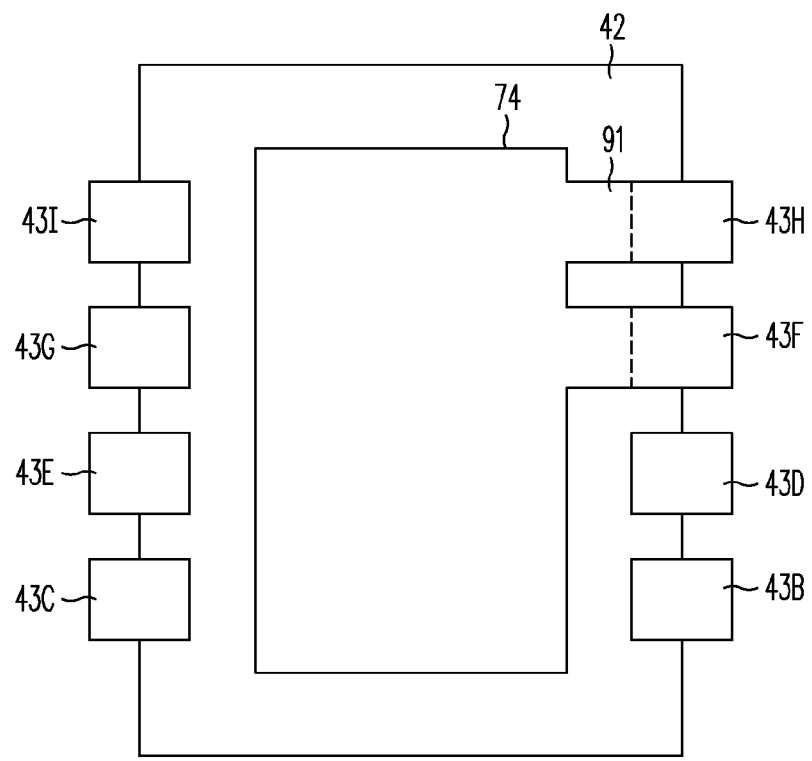
FIG. 7D is a bottom view of an 8-lead DFF footed package with an exposed die pad and two exposed die-pad-connected leads.
Figure 7E:
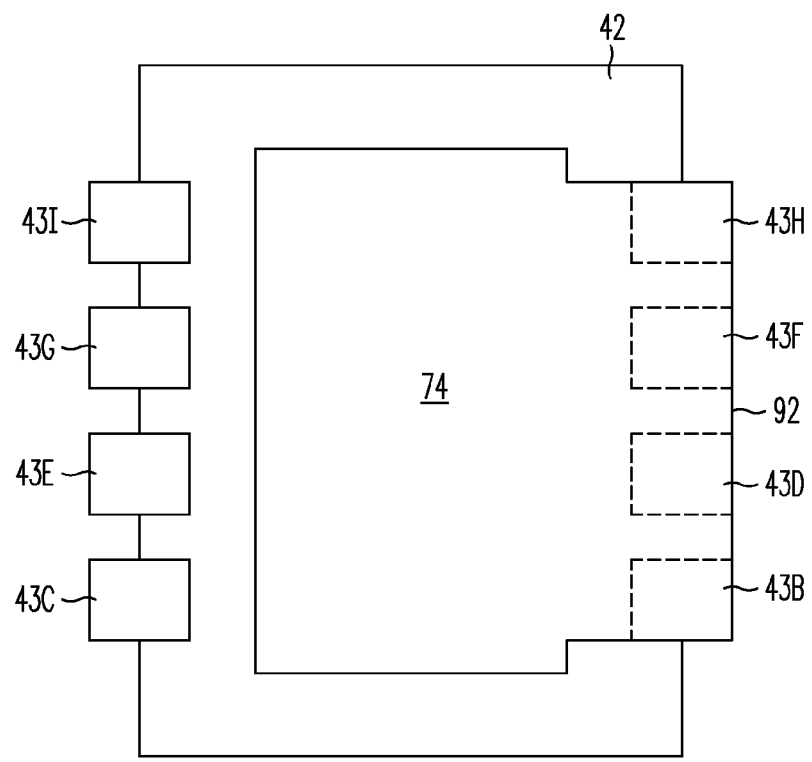
FIG. 7E is a bottom view of a 5-lead DFF footed package with a wide heat tab.

The aspect ratio of the package can be designed to be narrow or wide relative to its length. In FIG. 7B, an underside view of a narrow body DFF is shown comprising plastic body 42 and the bottom of footed leads 43B through 43I. From the underside, there is no way to differentiate the bottom of a lead's vertical column segment from its foot. FIG. 7C illustrates a widebody option of the same DFF package made in accordance with this invention. With a wider width and lower aspect ratio, an optional exposed die pad 74 may be included to improve heat dissipation of the package. In a bottom view of another embodiment of this invention shown in FIG. 7D, leads 43H and 43F are merged into exposed die pad 74 to facilitate easier electrical connection to the die pad. The additional metal piece 91 bridges the gap between die pad 74 and lead 43H to facilitate electrical and thermal conduction from the die pad to the lead. Any number or combination of pins may be connected to the exposed die pad as desired simply by changing the leadframe design. For example, FIG. 7E illustrates four leads 43B, 43D, 43F and 43F connected together to exposed die pad 74 and merged into a solid exposed heat tab 92. No change in the plastic mold is required to vary the lead combinations connected to the die pad, thereby minimizing the cost for implementing custom pinout options. (Note: As used herein, the term "exposed die pad" refers to a die pad that extends downward and is exposed at the bottom surface of the package, thereby allowing direct electrical or thermal contact with a conductive trace or other feature of the printed circuit board (PCB) or other supporting structure on which the package is mounted.)

Figure 8A:
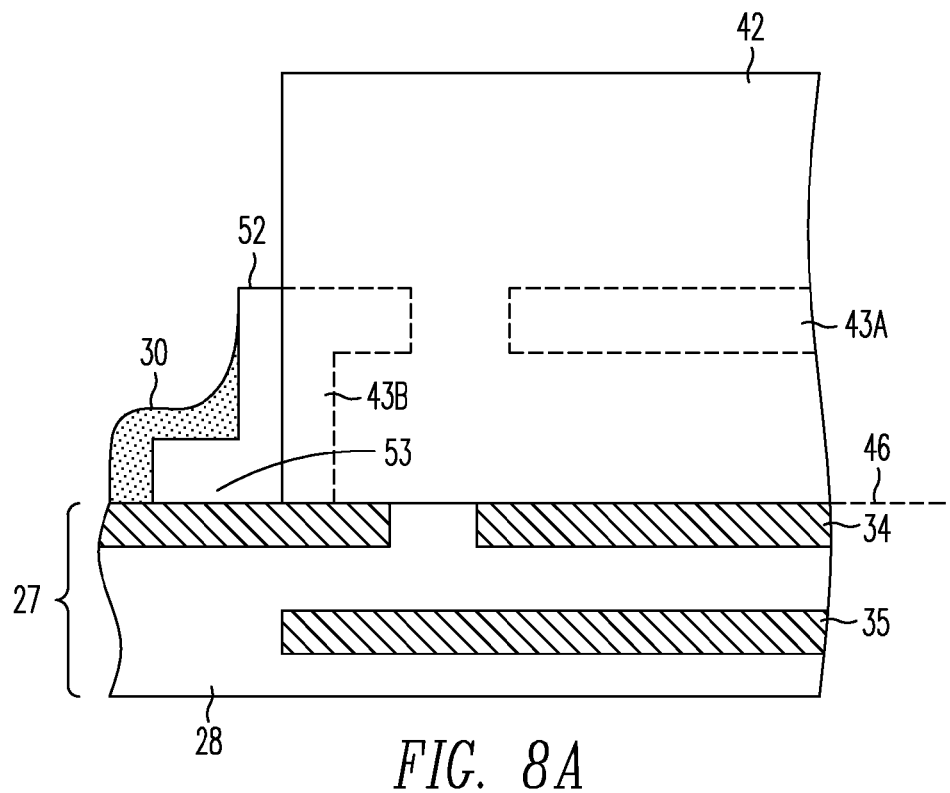
FIG. 8A is a cross-sectional view of a footed package without an exposed die pad mounted on a PCB.

The mounting of the DFF package without an exposed die pad onto a PCB using wave soldering is illustrated in the cross-sectional view of FIG. 8A. As shown, a DFF package comprising plastic body 42, die pad 43A, and lead 43B with foot 53B is mounted atop PCB 27 having an upper surface 46, insulating phenolic 28, internal metal traces 35, and exposed metal traces 34. Dashed lines illustrate features internal to the DFF package while solid lines denote features visible outside of plastic body 42.

After wave soldering, solder 30 coats the side and top of package lead foot 53B, electrically and thermally connecting lead 43B to PCB conductor 34. Solder coating the horizontal surface of package foot 53B is easily verified using optical machine or visual inspection. Some solder may also wick its way onto the exposed vertical sidewall of lead 43B but is not easily inspected using optical means. In wave soldering, little or no solder is present between the bottom of foot 53B and the top of PCB conductor 34. All heat and current must therefore flow out of foot 53B, through solder 30 and into PCB conductor 34. Since die pad 43A is entirely enclosed within plastic body 42 and since plastic exhibits a relatively poor thermal conductivity compared to metal, no direct means exist for heat to flow from die pad 43A into PCB 27 unless one or more leads are connected to die pad 43A.

Figure 8B:
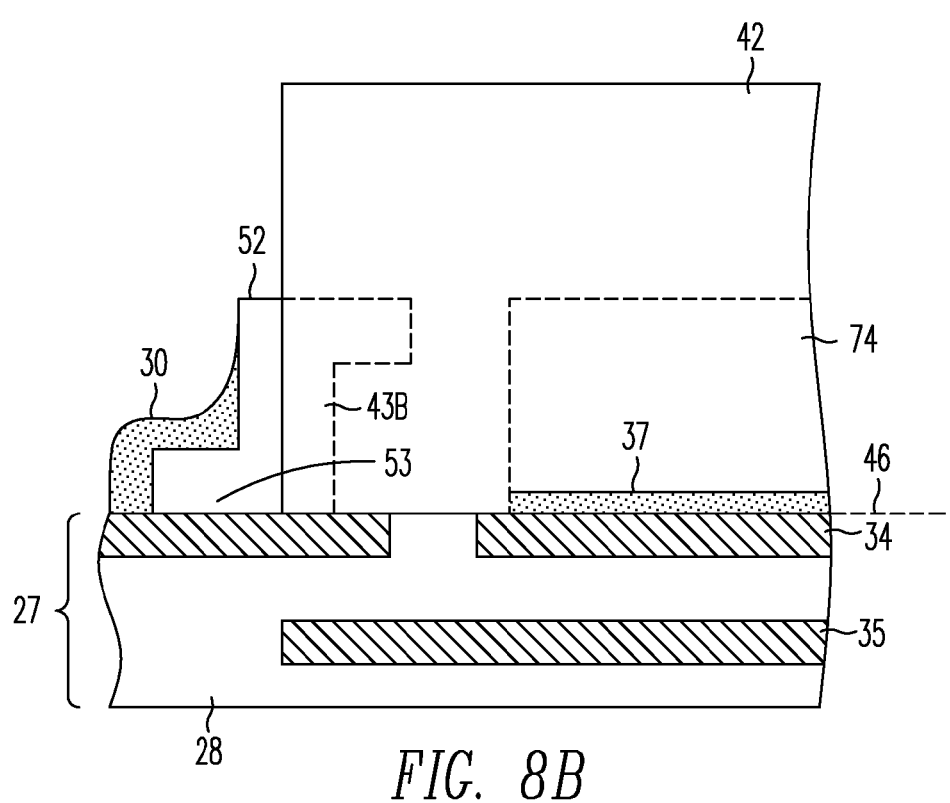
FIG. 8B is a cross-sectional view of a footed package with an exposed die pad mounted on a PCB.
Figure 8C:
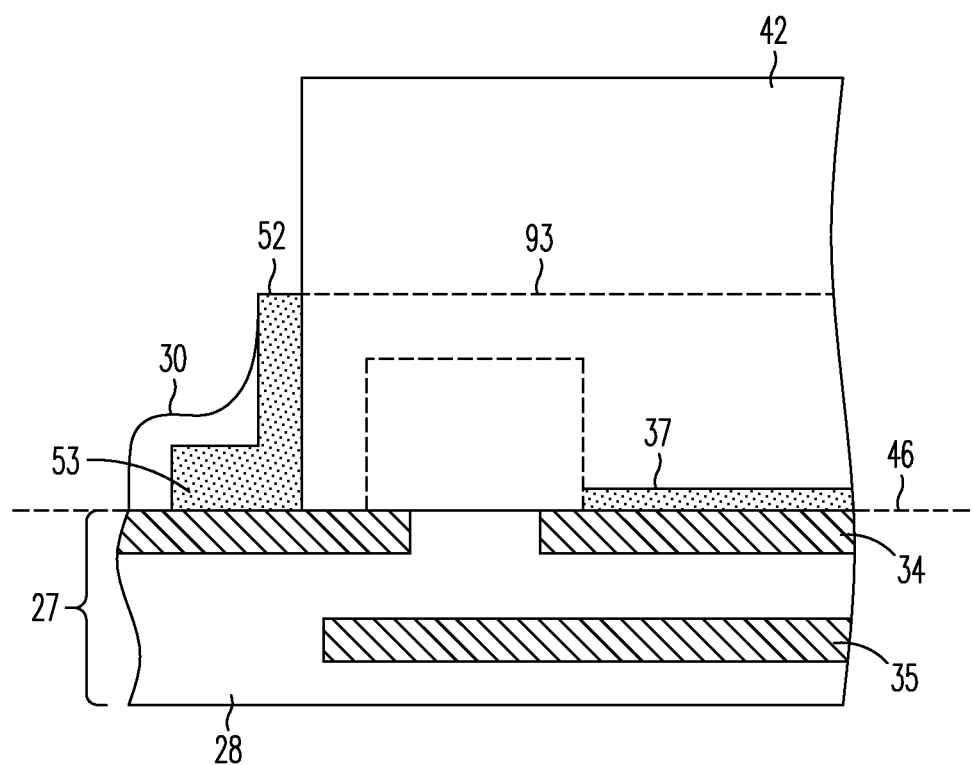
FIG. 8C is a cross-sectional view of a footed package with an exposed die pad shorted to a lead mounted on a PCB.

In FIG. 8B, die pad 43A has been replaced by exposed die pad 74 acting as the die pad for mounting a semiconductor die (not shown) and providing a low thermal resistance path to the backside of the DFF package. Unless however, some thermally conductive compound 37 is applied atop PCB conductor 34 prior to mounting the package and performing wave solder, the thermal performance of the package will exhibit only minimal improvements over that shown in FIG. 8A because without conductive compound 37 heat cannot readily flow between exposed die pad 74 and PCB conductive trace 34. Even with thermal conductive compound 37, the thermal performance of the DFF package can be improved by connecting one or more leads to the die pad as shown by thermal short 93 illustrated in FIG. 8C. In this embodiment of the invention, the backside of an 8-lead DFF package with an exposed die pad appears like the package shown in FIG. 7C and does not require a special PCB layout since its pinout is identical to that required by the package shown in FIG. 8B. While an exposed die pad may be merged into one or more leads, the assembly of such designs differs from normal PCB assembly and from the large thermal mass of the die pad may require added heating duration or temperature to insure good electrical connection to the lead. It can also increase lead inductance and adversely affect the high frequency performance of a package.

Figure 9A:
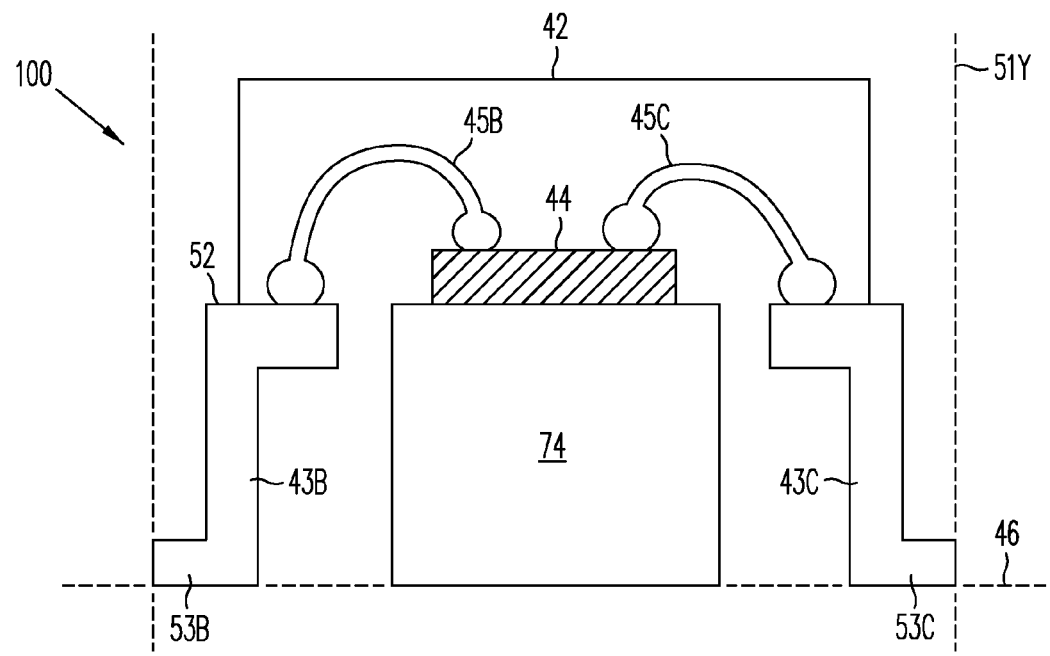
FIG. 9A is a cross-sectional view of an alternative footed package with an exposed die pad not attached to the package leads.

A DFF footed package 100 with an exposed die pad made in accordance with this invention is illustrated in FIG. 9A. Package 100 includes plastic body 42, die 44 mounted on exposed die pad 74, bond wires 45B and 45C, leads 43B and 43C with corresponding feet 53B and 53C. The length of feet 53B and 53C is defined by saw cut lines 51Y. Importantly, the bottom of exposed die pad is necessarily coplanar with the bottom of feet 53B and 53C since the leads and the exposed die pad are all constructed from the same leadframe, formed simultaneously in manufacturing.

Figure 9B:
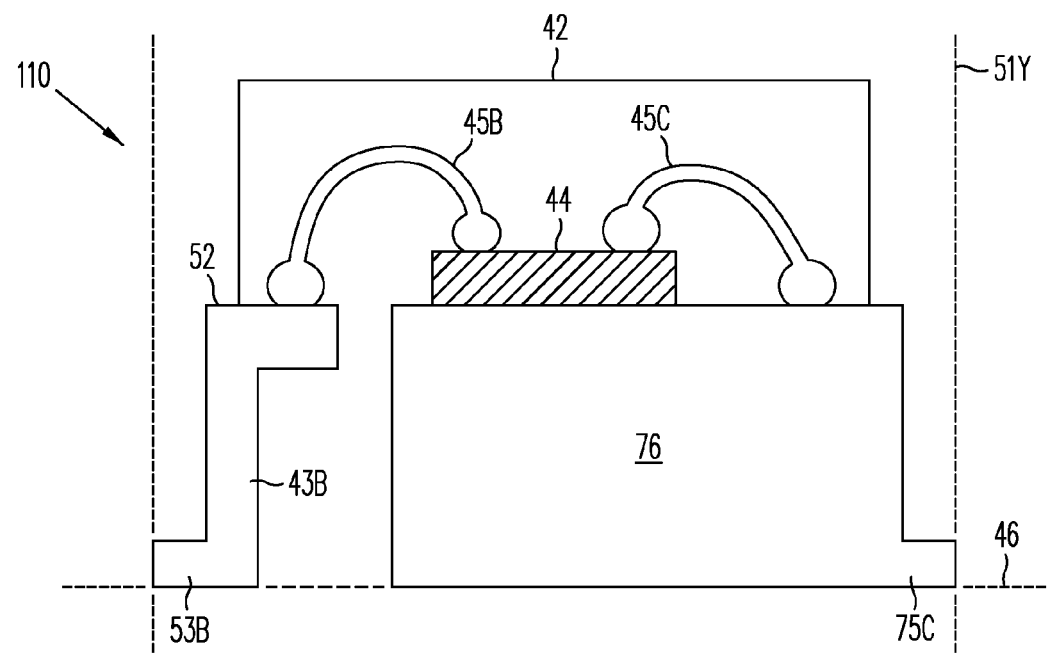
FIG. 9B is a cross-sectional view of an alternative footed package with an exposed die pad merged into the package lead.

A DFF package 110, shown in the cross-sectional view of FIG. 9B is a variation of package 100 with an exposed die pad 75 merged into a foot 75C.

Figure 9C:
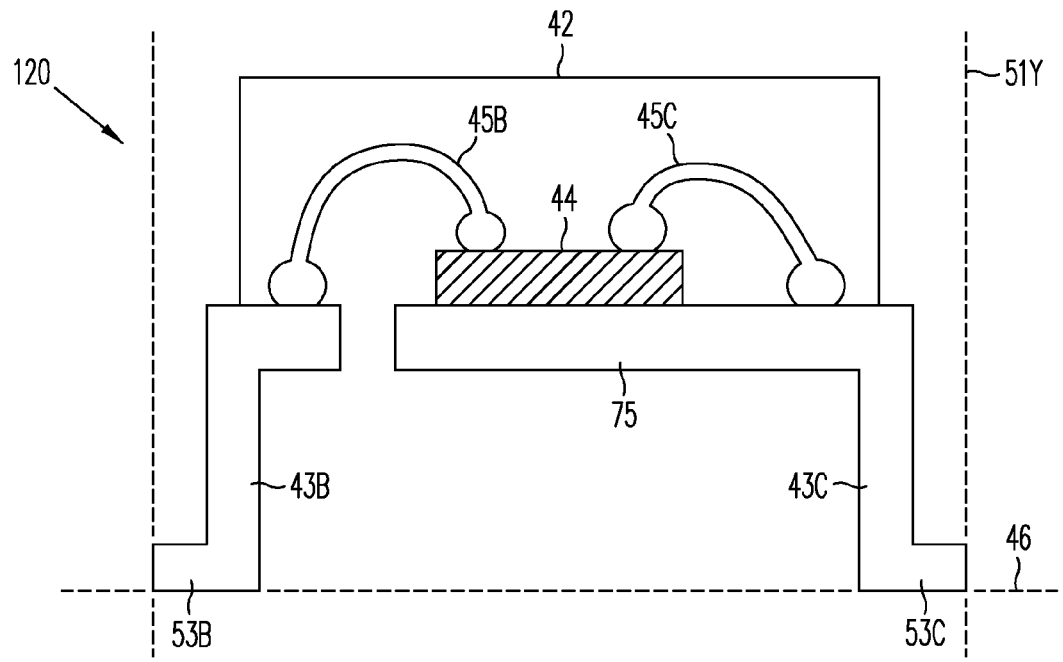
FIG. 9C is a cross-sectional view of an alternative footed package with a non-exposed die pad attached to the package lead.

A DFF footed package 120 without an exposed die pad. made in accordance with this invention is illustrated in FIG. 9C. Package 120 comprises plastic body 42, die 44 mounted on die pad 43A, bond wires 45B and 45C, leads 43B and 43C with corresponding feet 53B and 53C. Die pad 43A is merged into and electrically shorted to lead 43C by metal bridge 75. Optionally, down-bond 45C connects the topside ground connection of die 44 to die pad 43A and lead 43C. Package 120 is expected to offer better thermal resistance than package 41 of FIG. 4 but inferior to package 110 of FIG. 9B.

Figure 9D:
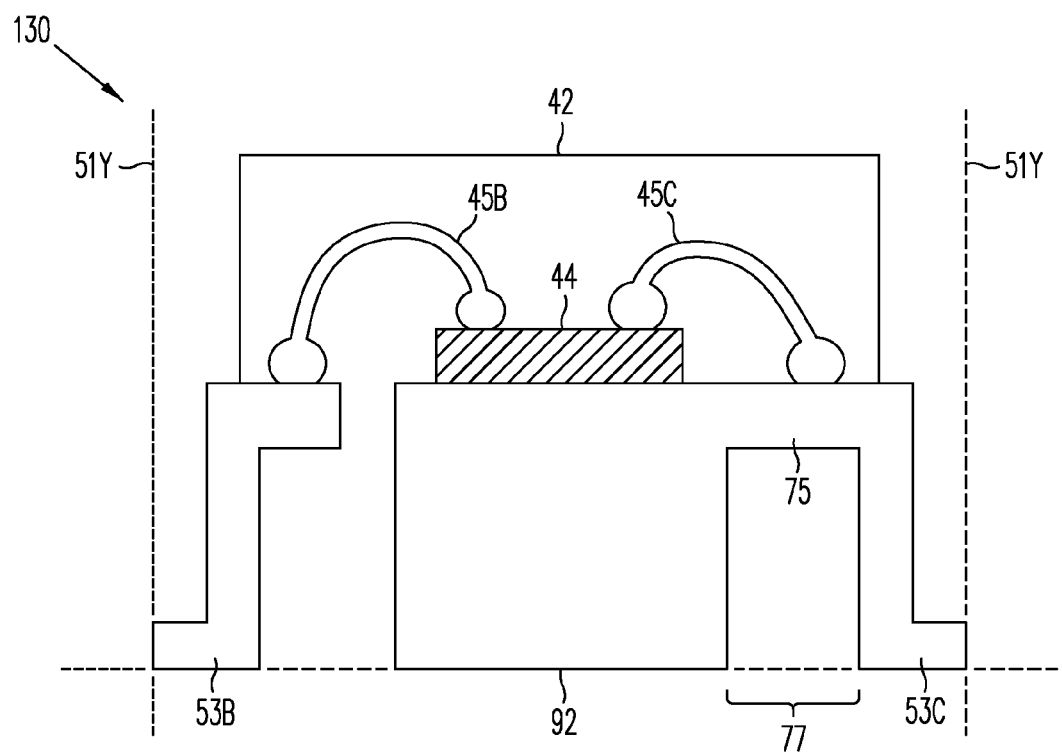
FIG. 9D is a cross-sectional view of an alternative footed package with an exposed die pad attached to the package lead internally.

A DFF footed package 130 with an exposed die pad made in accordance with this invention is illustrated in FIG. 9D. Package 130 comprises plastic body 42, die 44 mounted on exposed die pad 92, bond wires 45B and 45C, leads 43B and 43C with corresponding feet 53B and 53C. Die pad 92 is merged into and electrically shorted to lead 43C by a metal bridge 75. Optionally, down-bond 45C connects the topside ground connection of die 44 to exposed die pad 92 and lead 43C. While internal construction of exposed die pad 92 and lead 53C are merged by metal bridge 75, the underside of package 130 appears the same the package illustrated in FIG. 7C, having a gap 77 between exposed die pad 92 and foot 53C.

Figure 9E:
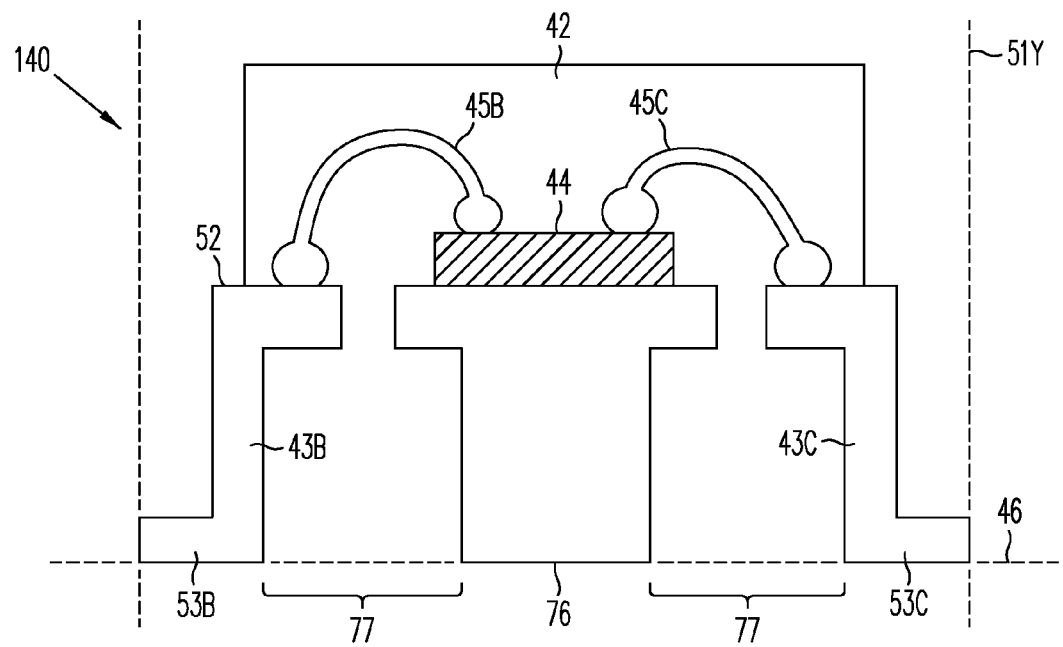
FIG. 9E is across-sectional view of an alternative footed package with a T-shaped exposed die pad not attached to the package leads.

A DFF footed package 140 with an exposed die pad made in accordance with this invention is illustrated in FIG. 9E. Package 140 comprises plastic body 42, die 44 mounted on a T-shaped exposed die pad 76, bond wires 45B and 45C, leads 43B and 43C with corresponding feet 53B and 53C. With the T-shaped exposed die pad 76, a larger die size 44 can be used than in package 100 of FIG. 9A while maintaining a larger gap 77 between the bottom of exposed die pad 76 and feet 53B and 53C.

Figure 10:
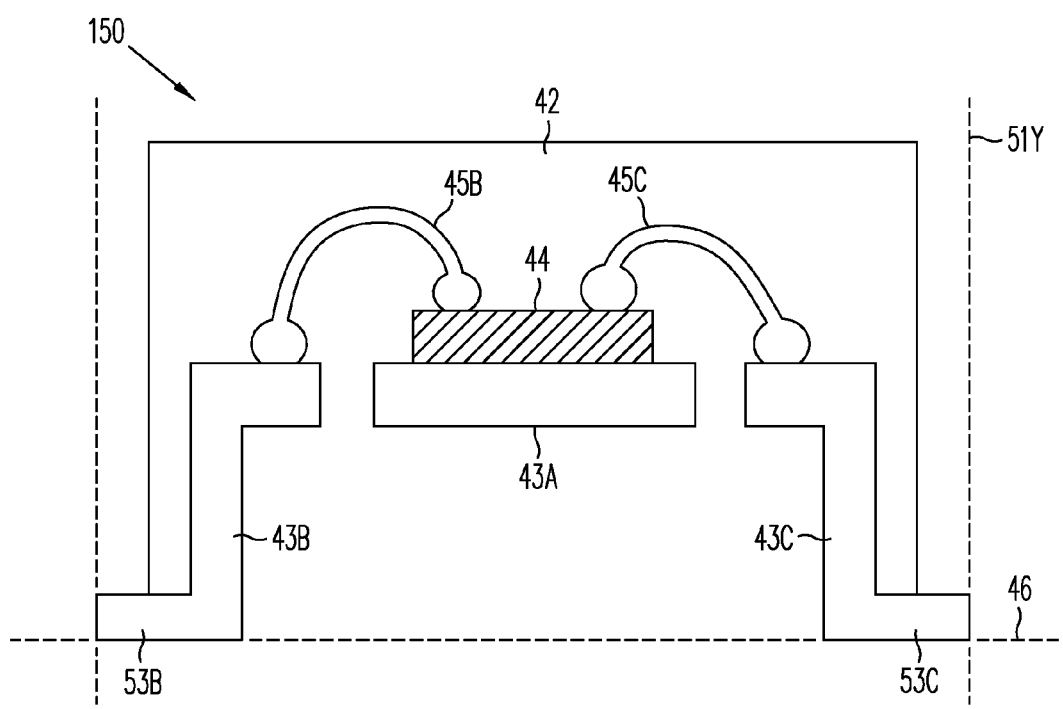
FIG. 10 is a cross-sectional view of an alternative footed package with the leads covered by plastic.

A DFF footed package 150 made in accordance with this invention is illustrated in FIG. 10. In package 150 plastic body 42 extends beyond the vertical column segment of leads 43B and 43C and overlaps onto feet 53B and 53C. As stated previously, this design is not preferable since it reduces the maximum size of die 44 for a given PCB area.

Four-Sided Footed (QFF) Package Variants

With minor changes, the methods for manufacturing a low profile footed package disclosed herein can be adapted to produce packages with leads on all four sides, i.e. quad flat footed or QFF packages. The steps of the manufacturing process flow for QFF packages are identical to those used to manufacture DFF packages, except for variations in the package size (and hence the mold) and in the leadframe and the location of the saw blade cut lines relative to the leadframe. Otherwise, the manufacturing sequences for QFF and DFF packages are identical, making it possible for a single manufacturing line to produce both products with the same machinery.

Figure 11A:
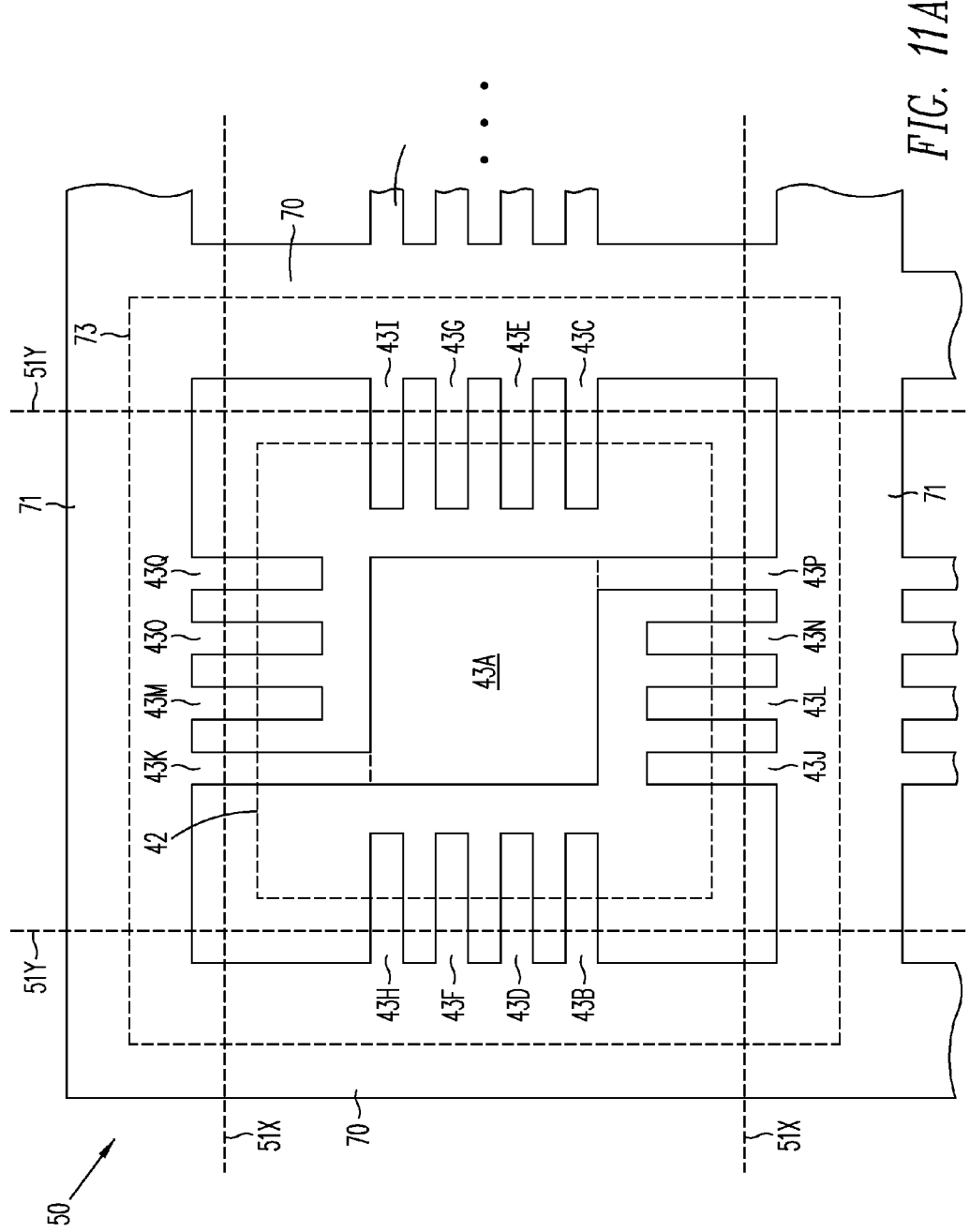
FIG. 11A is a plan view of a multi-package QFF leadframe including supporting bars holding adjacent packages in place.

FIG. 11A illustrates a plan view of a portion of a leadframe for an 16-lead QFF footed package in accordance with this invention prior to die attach and wire bonding. Leadframe 50 comprises vertical and lateral bus bars 70 and 71 to provide mechanical rigidity to the structure supporting a multiplicity of identical packages arranged in an array of rows and columns. In this illustration, variations in the thickness of leadframe 50 from etching or stamping are not shown except where openings in the leadframe have been formed.

In FIG. 11A, a dashed line indicates a unit cell 73, defining one QFF package. Unit cell 73 is repeated multiple times within leadframe 50 to produce multiple packages simultaneously. Within unit cell 73, leadframe 50 includes die pad 43A and leads 43B through 43Q. For clarity's sake, the location of the semiconductor die and its bond wires has been omitted from this drawing.

Notably absent from the leadframe 50 are tie bars used to hold die pad 43A in place prior to molding. Instead of employing tie bars to support die pad 43A during manufacturing operations, one or more of leads 43B through 43Q is intentionally connected to the die pad 43A to offer mechanical rigidity during die attach, wire bonding, and handling. In a preferred embodiment, these supporting leads are located on opposite sides of the package, such as illustrated in FIG. 11A by leads 43K and 43P. Any die-pad connected lead is electrically shorted to the same electrical potential as die pad 43A.

Unless insulating epoxy is employed to attach the die to the die pad, the die pad's electrical potential is the same as the backside of the semiconductor die mounted on it, which in most cases is ground potential or the most negative IC voltage. Die-pad connected leads also more efficiently carry heat from the die to the PCB than the other leads. This benefit in lower thermal resistance is inconsequential for packages with exposed die pads, but otherwise it improves with each additional lead connected to the die pad. While a single die-pad connected lead may also be used to stabilize die pad 43A during processing, care must be taken to provide underside support to avoid "diving board" like bending during wire bonding.

Plastic body 42, shown as a dashed line, intersects and laterally overlaps only a portion of leads 43B through 43I. On the same sides of plastic body 42, saw blade cut lines 51Y intersect leads 43B through 43I but do not intersect plastic body 42, thereby defining the length of the feet of leads 43B through 43I protruding beyond plastic body 42. During singulation, saw cut 51Y permanently separates leads 43B through 43I from metal bus bar 70.

Similarly, plastic body 42 intersects and laterally overlaps only a portion of leads 43J through 43Q. On the same sides of plastic body 42, saw blade cut lines SIX intersect leads 43J through 43Q but do not intersect plastic body 42, thereby defining the length of the feet of leads 43J through 43Q protruding beyond plastic body 42. During singulation, saw cut 51X permanently separates leads 43J through 43Q from metal bus bar 71. Sawing of the QFF in the x-direction, where the saw blade does not touch plastic 42 is in direct contrast to the singulation of a DFF package, where the saw blade cuts through both the plastic and the tie bars. In this regard, sawing and singulation of the QFF package is uniform in both the x- and y-directions, whereas the sawing of a DFF package is not.

The aspect ratio of the QFF package can be varied to make the package square or rectangular. Following the convention for prior art QFN packages, the leads are normally spaced at even increments along each package side. In the case of square aspect ratios, 3, 4, 5, and 6 leads per side result in square packages having 12, 16, 20 and 24 leads, with one or two leads physically connected to the die pad. With two leads connected to the grounded die pad, a 16-pin package supports only 15 distinct electrical signals, i.e., 14 independent leads and one ground connected lead. If only one lead is ground connected then all the package leads can be biased at different potentials.

Figure 11B:
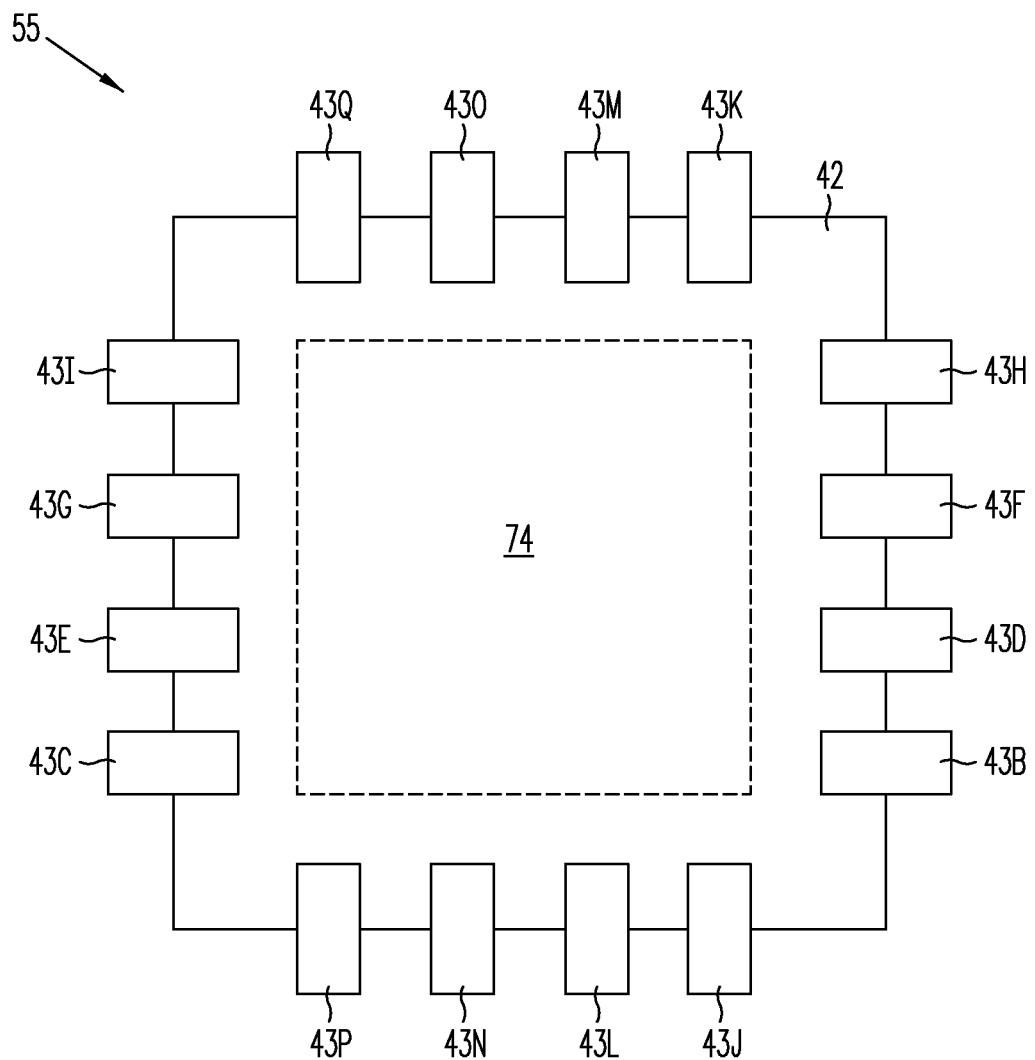
FIG. 11B is a bottom view of a 16-lead QFF footed package with an optional exposed die pad.

In FIG. 11B, an underside view of a square QFF package 55 is shown. Package 55 comprises plastic body 42 and the bottoms of the feet of leads 43B through 43Q. From the underside, there is no way to differentiate the bottom of a lead's vertical column segment from its foot. An optional exposed die pad 74 (shown by the dashed lines) may be included to improve heat dissipation of the package 55. If a design similar to that shown in FIG. 9D is used, from the underside leads 43K and 43P, which are physically connected to the exposed die pad 74 appear identical to the other leads. Any number or combination of pins may be connected to the exposed die pad as desired simply by changing the leadframe design. No change in the plastic mold is required to vary the lead combinations connected to the die pad, thereby minimizing the cost for implementing custom pinout options.

Figure 11C:
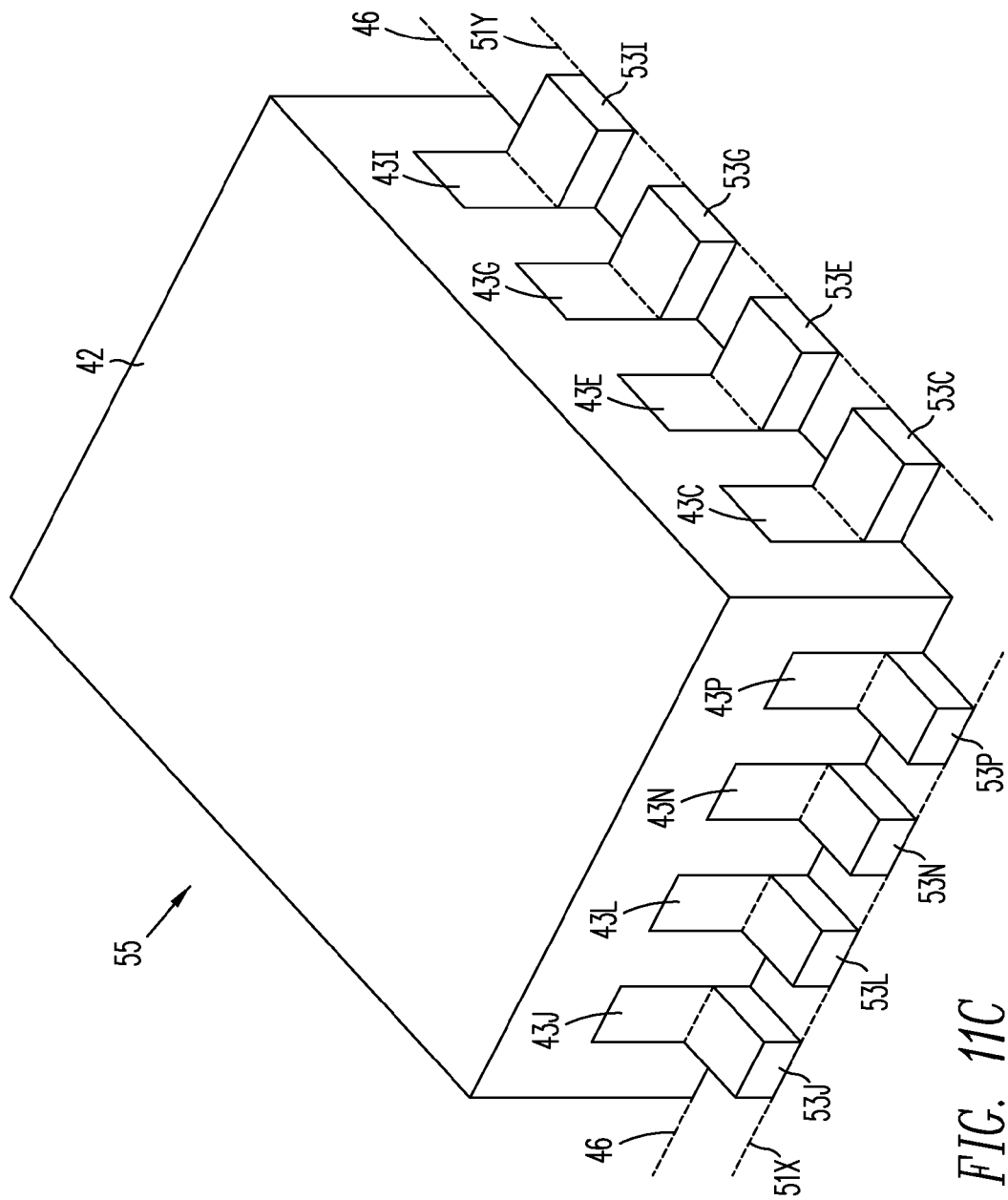
FIG. 11C is a perspective view of 16-lead example of QFF footed package

A three-dimensional perspective drawing of 16-lead QFF package 55 is illustrated in FIG. 11C. Of the 16 leads, leads 43C, 43E, 43G, 43I are visible on one edge of package 55, and leads 43J, 43L, 43N, and 43P are visible on another edge of package 55. These leads have corresponding feet 53C, 53E, 53G, 53I, 53J, 53L, 53N, and 53P. The bottom of the plastic body 42, the bottoms of the vertical column segments of the leads 43B through 43Q, and the bottoms of the feet 53B through 53Q are coplanar and form the bottom of package 55. As shown, the sides of the vertical column segments of leads 43C, 43E, 43G, 43I, 43J, 43L, 43N and 43P are exposed and not covered by plastic body 42. The vertical column segments of the leads 43C, 43E, 43G, 43I, 43J, 43L, 43N and 43P protrude only slightly beyond the side edges of plastic body 42, and these protrusions are therefore not shown in the drawing.

Figure 12A:
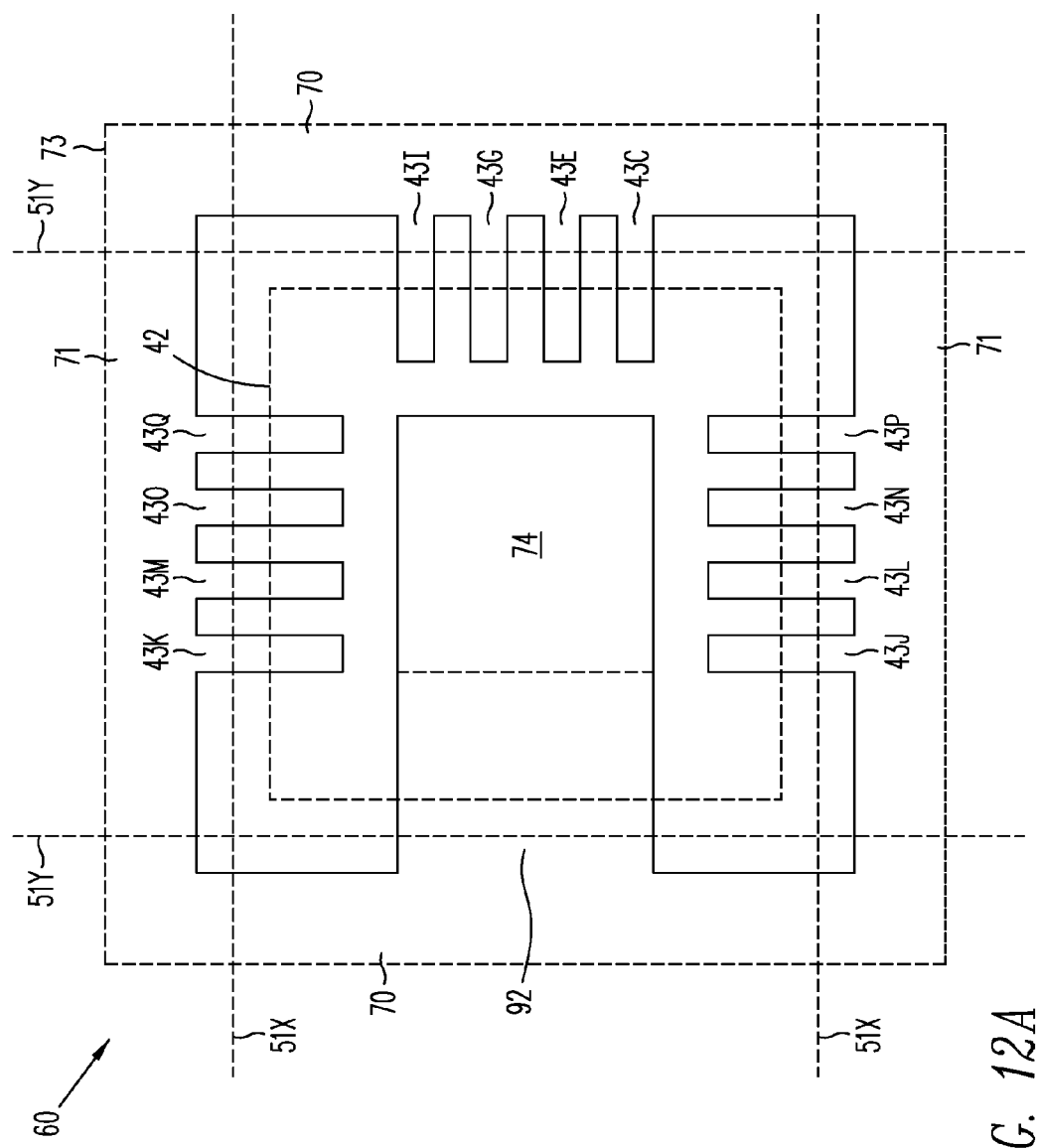
FIG. 12A is a plan view of an alternative QFF leadframe including a wide heat tab lead.

FIG. 12A illustrates a plan view of a leadframe 60 for a QFF package having leads on three edges and a single "heat tab" lead on its remaining edge, the heat tab comprising a single die-pad connected lead serving both as an electrical connection (for ground) and as a low-thermal resistance path out of the package and into the PCB on which the package is mounted. For clarity's sake, the location of the semiconductor die and its bond wires has been omitted from FIG. 12A. A dashed line indicates a unit cell 73, defining one QFF package. Unit cell 73 is repeated multiple times within the leadframe 60 to produce multiple packages simultaneously. Within unit cell 73 are an exposed die pad 74 and leads 43C, 43E, 43G, 43I, and 43J through 43Q. On the remaining edge of the package, a single heat tab 92, shorted to die pad 74, replaces the leads that might otherwise be present in this location. For example, heat tab 92 shown in the leadframe 60 of FIG. 12A replaces separate leads 43B, 43D, 43F and 43G shown in FIG. 1A by filling in the gaps between the leads with metal, thereby merging the leads together into a solid piece.

Like leadframe 50 shown in FIG. 11A, no tie bar is included in leadframe 60. Instead, the die-pad connected heat tab 92 provides mechanical rigidity during die attach, wire bonding, and handling without the need to support the die pad with other leads.

Plastic body 42 (shown as a dashed line) intersects and laterally overlaps only a portion of heat tab 92 and leads 43C, 43E, 43G and 43I. Saw blade cut lines 51Y intersect leads heat tab 92 and leads 43C, 43E, 43G and 43I but do not intersect plastic body 42, thereby defining the length of the feet of heat tab 92 and of the feet of leads 43C, 43E, 43G and 43I protruding beyond plastic body 42. During singulation, the saw cut at line 51Y permanently separates heat tab 92 and leads 43C, 43E, 43G and 43I from metal bus bar 70.

Similarly, plastic body 42 intersects and laterally overlaps only a portion of leads 43J through 43Q. Saw blade cut lines 51X intersect leads 43J through 43Q but do not intersect plastic body 42, thereby defining the length by which the feet of leads 43J through 43Q protrude beyond plastic body 42. During singulation, saw cut 51X permanently separates leads 43J through 43Q from metal bus bar 71. Sawing of the QFF in the x-direction where the saw blade does not touch plastic 42 is in direct contrast to the singulation of a DFF package, where the saw blade cuts through both the plastic and the tie bars. In this regard, sawing and singulation of the QFF package is uniform in both x- and y-directions, whereas the sawing of a DFF package is not.

The aspect ratio of the heat tab QFF package can be varied to make the package square or rectangular. Following the convention for prior art QFN packages, the leads are normally spaced at even increments along each package side. The heat tab may merge all on any combination of adjacent leads on any package edge.

Heat flow out of the package into the PCB occurs vertically through exposed die pad 74 and laterally through heat tab 92. Since heat tab 92 is soldered onto the PCB on which the package is mounted, the thermal resistance in this heat conduction path is essentially constant. Heat conduction vertically from the exposed die pad 74 depends on the quality of the thermal contact between the bottom of exposed die pad 74 and the conductor on the PCB that is located beneath the package. If a thermally conductive compound is present between the bottom of exposed die pad 74 and the PCB conductor, significant heat flow may occur through this path. If however, no thermal compound is present, vertical heat flow is inhibited by any intervening air gap, and heat will flow into the PCB primarily through the solder joints of heat tab 92.

Figure 12B:
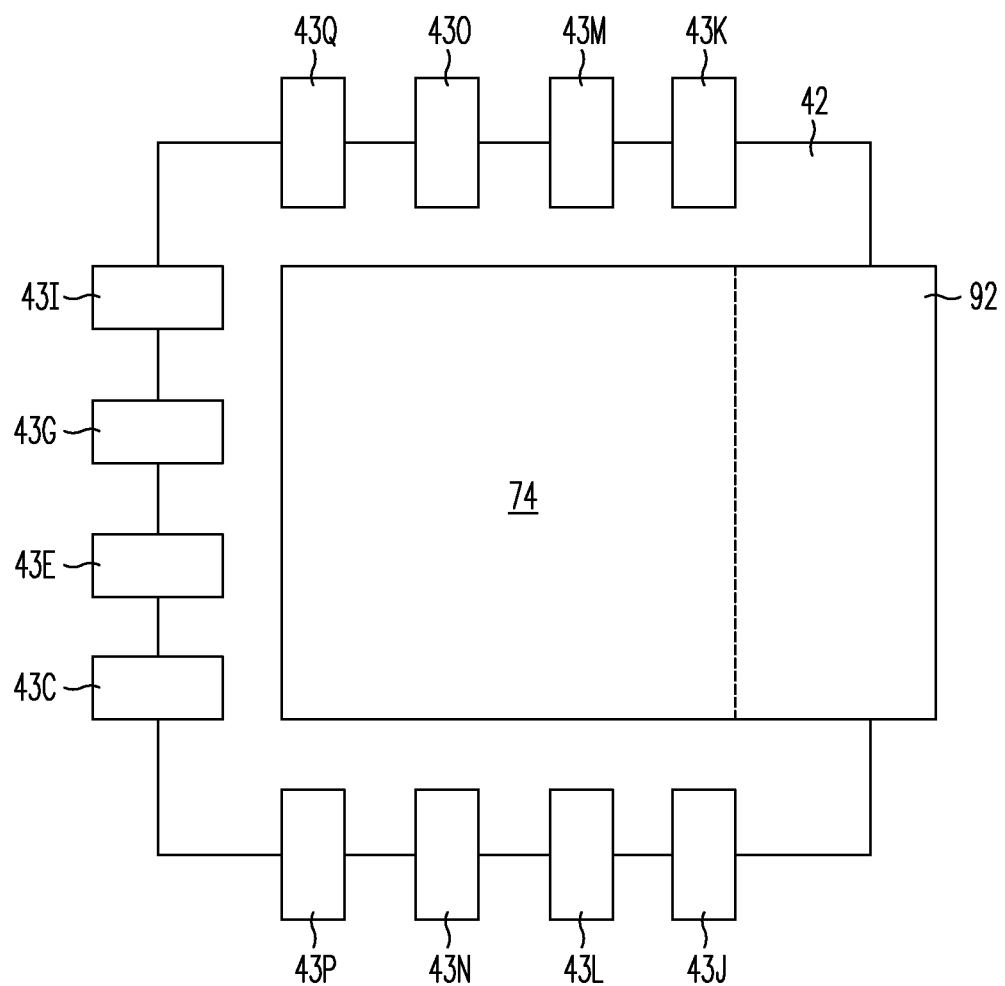
FIG. 12B is a bottom view of an alternative QFF package including a wide heat tab lead.

In FIG. 12B, an underside view of a square heat tab QFF made in accordance with this invention is shown comprising plastic body 42, heat tab 92 and the bottom of footed leads 43c, 43E, 43G, 43I and 43J through 43Q. From the underside, there is no way to differentiate the bottom of a lead's vertical column segment from its foot. Exposed die pad 74 merged into heat tab 92 improves heat dissipation of the package. While the design shown merges four leads into a solid piece of metal to form heat tab 92, including optionally filling the gaps between the leads, any number or combination of pins may be connected to the exposed die pad as desired simply by changing the leadframe design. No change in the plastic mold is required to vary the lead combinations connected to the die pad, thereby minimizing the cost for implementing custom pinout options.

A heat tab QFF package made in accordance with this invention conducts heat through its heat tab, insuring a minimal power rating for the package without reliance on thermal conduction through its exposed die pad. Proper mounting of the heat tab QFF package onto a PCB using an intervening thermally conductive gel can further reduce the package's thermal resistance, either allowing the package to be rated at a higher power or reducing the junction temperature of the semiconductor at a given power rating, thereby improving system reliability.

Figure 12C:
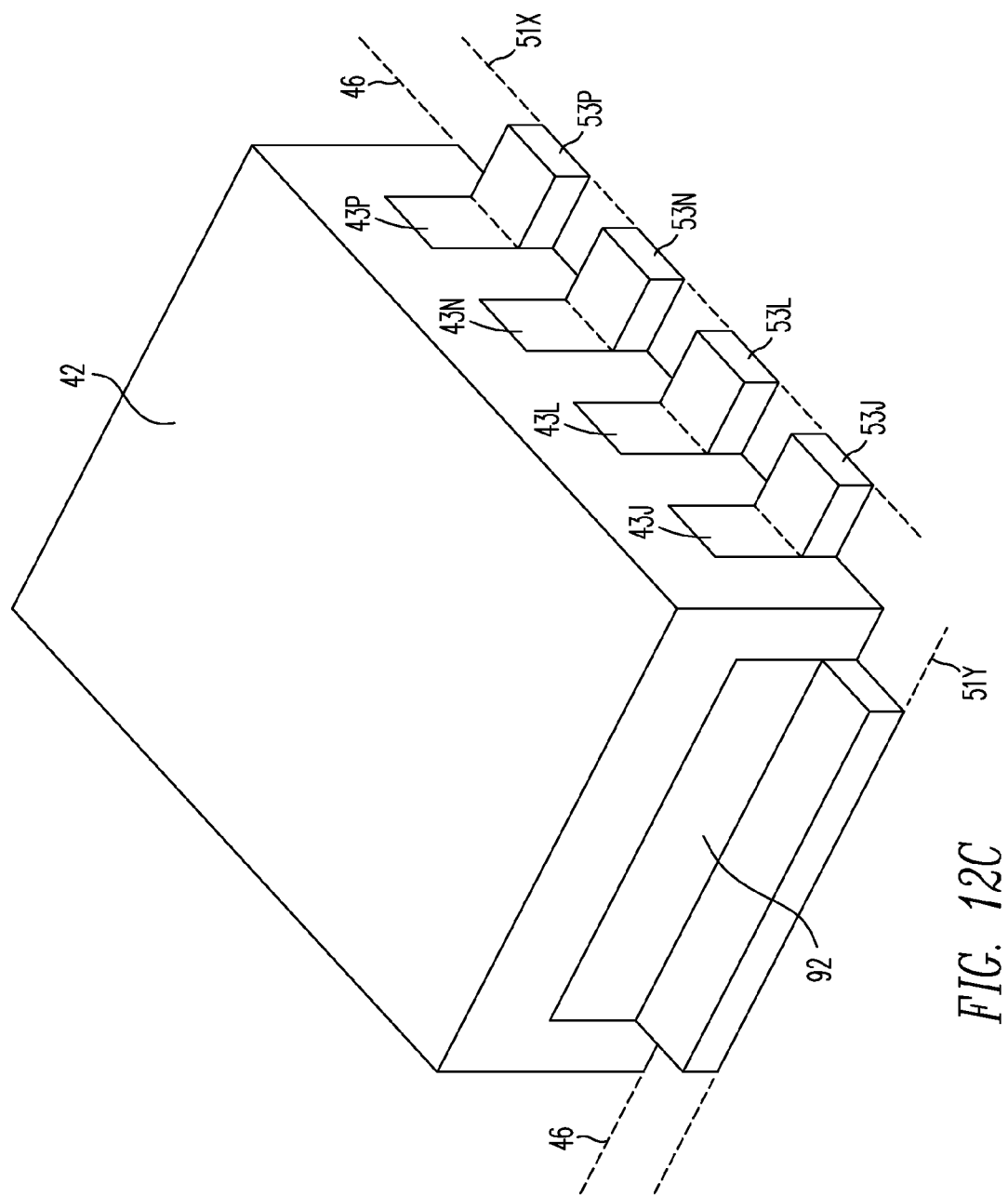
FIG. 12C is a perspective view of an alternative QFF package including a wide heat tab lead.

A three-dimensional perspective view of the 13-lead heat tab QFF package 60 is illustrated in FIG. 12C. Shown are plastic body 42 with footed heat tab 92 and twelve other footed leads, where from the perspective shown only four leads 43J, 43L, 43N and 43P with corresponding feet 53J, 53L, 53N and 53P are visible.

The bottom of the plastic body 42, along with the bottoms of the vertical column segments of the leads, feet and heat tab are coplanar to the bottom of the package and plane 46. As shown, the sides of the vertical column segments of leads 43J, 43L, 43N, 43P and heat tab 92 are exposed and not covered by plastic body 42. The vertical column segments of the leads 433, 43L, 43N, 43P and heat tab 92 protrude only slightly beyond the side edges of plastic body 42, and these protrusions are therefore not shown in the drawing. Also illustrated in FIG. 12C, the lengths of the feet 53J, 53L, 53N and 53P are determined by saw blade cut line 51X. Similarly, the length of the foot on heat tab 92 is determined by saw blade cut line 51Y.

Figure 13A:
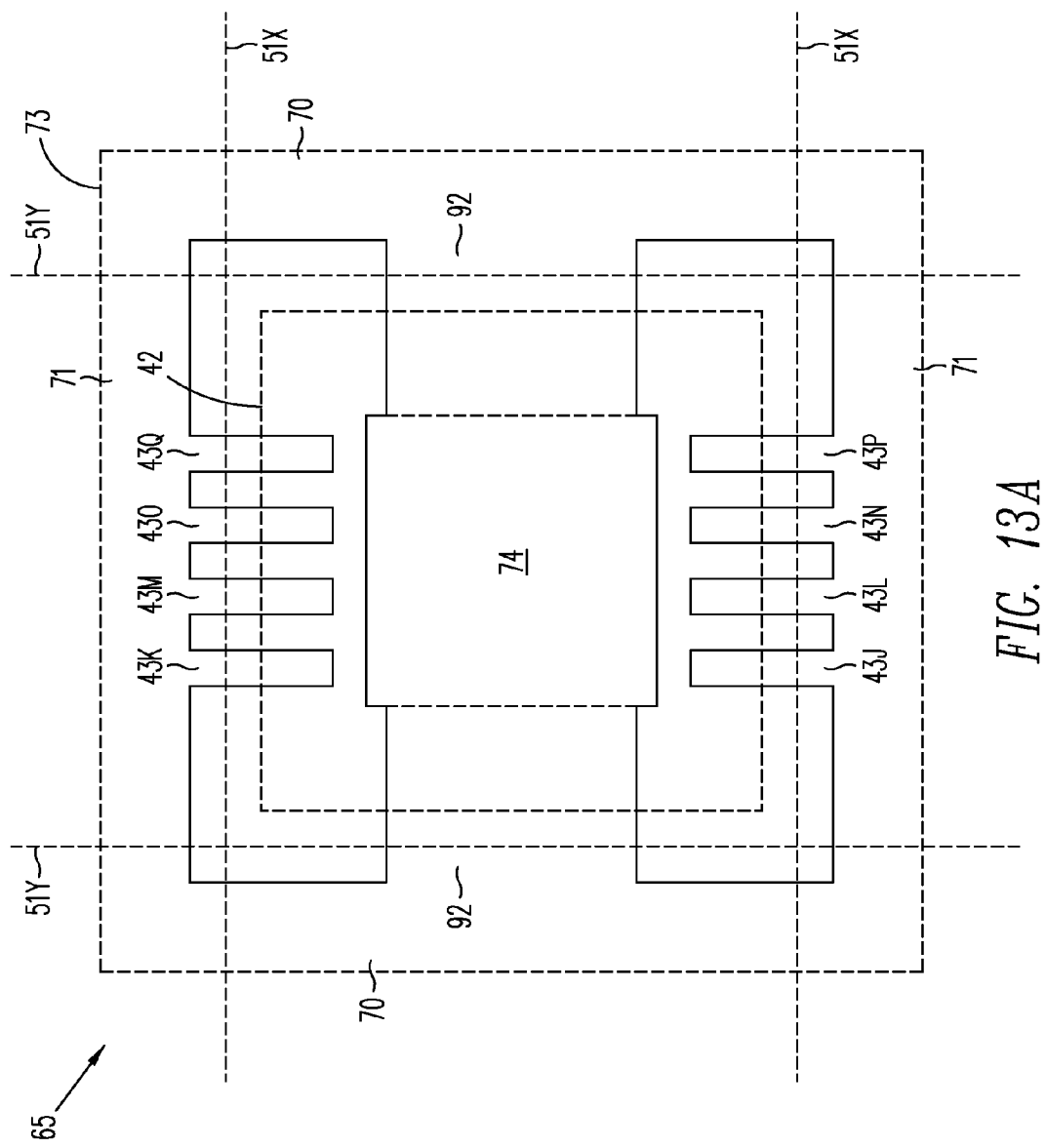
FIG. 13A is a plan view of an alternative square QFF leadframe including double-sided wide heat tab leads.

FIG. 13A illustrates a plan view of a leadframe 65 for a 9-lead heat tab QFF package made in accordance with this invention. Heat tabs 92A and 92B are connected to die pad 74 and extend laterally beyond plastic body 42 on two opposite edges of the package, while separate leads 43J through 43Q, not shorted to die pad 74, are located on the other two package edges. Such a package offers superior power handling capability and low thermal resistance even if a thermally conductive compound is not employed under the package when it is being mounted on a PCB. In an alternative embodiment, an exposed die pad 74 may be replaced with an "isolated" die pad, i.e. fully enclosed by plastic body 42, without significantly degrading the package's thermal performance.

Figure 13B:
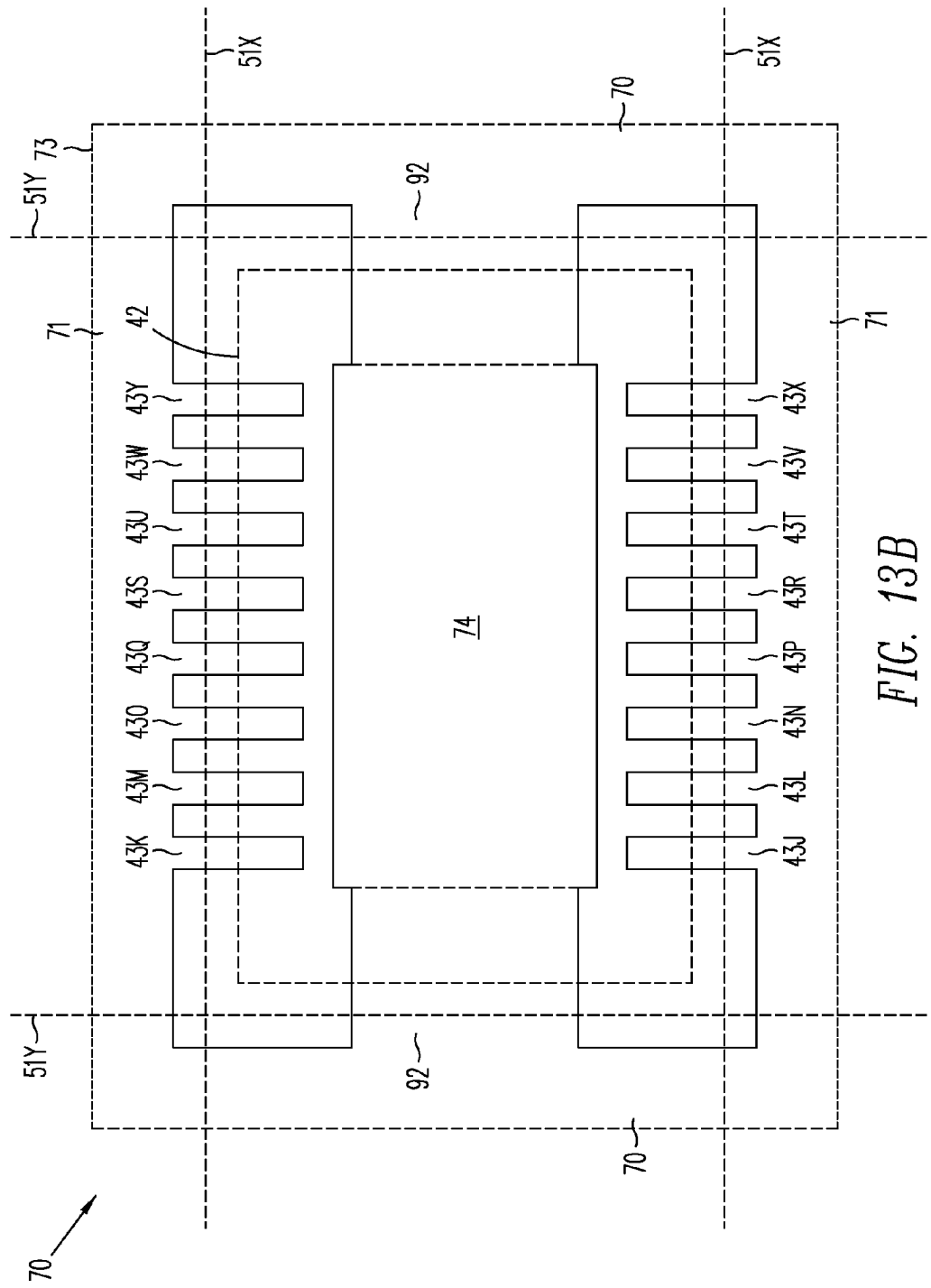
FIG. 13B is a plan view of an alternative rectangular QFF leadframe including double-sided wide leads.

In another embodiment of the heat tab QFF package, the package is "stretched" beyond its square shape, i.e. with a length-to-width aspect ratio greater than one, to increase the number of available package leads. FIG. 13B illustrates a plan view of an alternative rectangular leadframe 70, wherein the number of leads located on the longer edges of the package transected by saw blade cut lines 51X are increased by adjusting the package dimensions as needed. In leadframe 70, the number of leads on an edge has been doubled to eight per package edge, resulting in a 17-lead QFF package with dual heat tabs 92A and 92B. Leadframe 70 is illustrative. The number of leads can be increased to any number provided that the aspect ratio of the semiconductor die mounted on exposed die pad 74 does not become too severe and result in die cracking. In general, the length-to-width ratio of semiconductor die should not exceed 4 to 1 and preferably should not exceed 3 to 1. For practical reasons of optimum intra-die interconnections, in most cases die aspect ratios do not exceed 2.5.

Figure 13C:
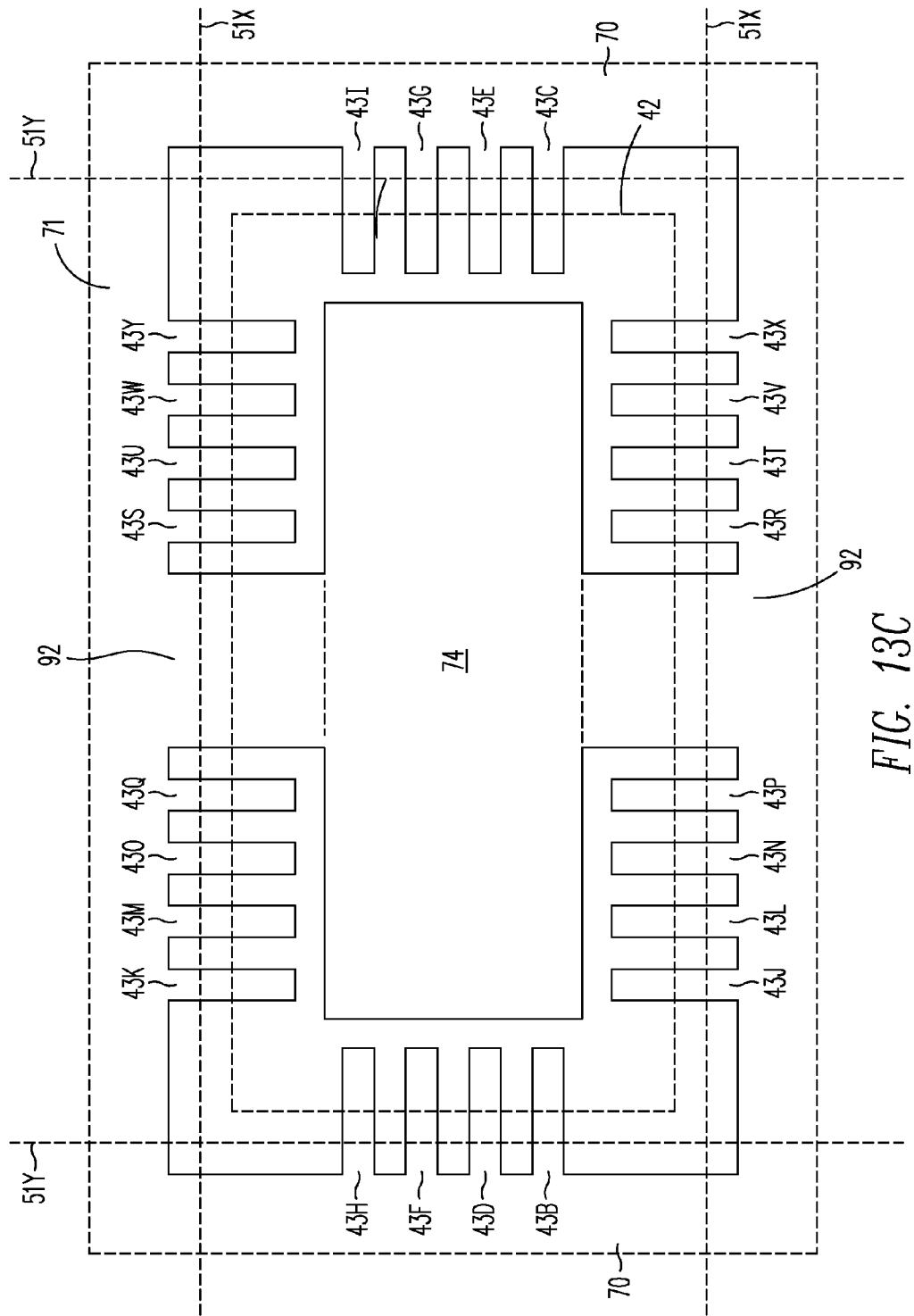
FIG. 13C is a plan view of another embodiment of a rectangular leadframe.

Another embodiment of a rectangular leadframe is shown in the plan view of FIG. 13C. In leadframe 75, heat tabs and independent leads are both provided along each of the long edges of the package. Specifically, heat tabs 92C and 92D are connected to exposed die pad 74, along with independent leads 43J through 43Y. Heat tabs 92C and 92D and leads 43J through 43Y are transected by saw blade cut lines 51X along the long edges of the package and separated during sawing from leadframe support bars 71. Independent leads 43B through 43I are located on the shorter edges of the package transected by saw blade cut lines 51Y and separated during sawing from leadframe support bars 70. Dual heat tabs 92C and 92D effectively conduct heat from die pad 74 while electrically constituting a ground or die pad connection. Combined with electrically independent leads 43B through 43Y, the dual heat tab QFF design of FIG. 13C comprises a 25-lead footed package.

As described previously, a QFF package according to the invention may use leads or heat tabs rather than tie bars to hold the die pad in place during manufacturing and handling prior to molding. These leads should hold the die pad securely, without significantly bending or flexing, during die attach and wire bonding to avoid manufacturing and reliability problems with the assembled device. The reason that a minimum of one or two leads (rather than tie bars) must be reserved for insuring mechanical stability during manufacture is that tie bars are incompatible with the manufacturing flow and leadframe design of a QFF package.

Figure 14A:
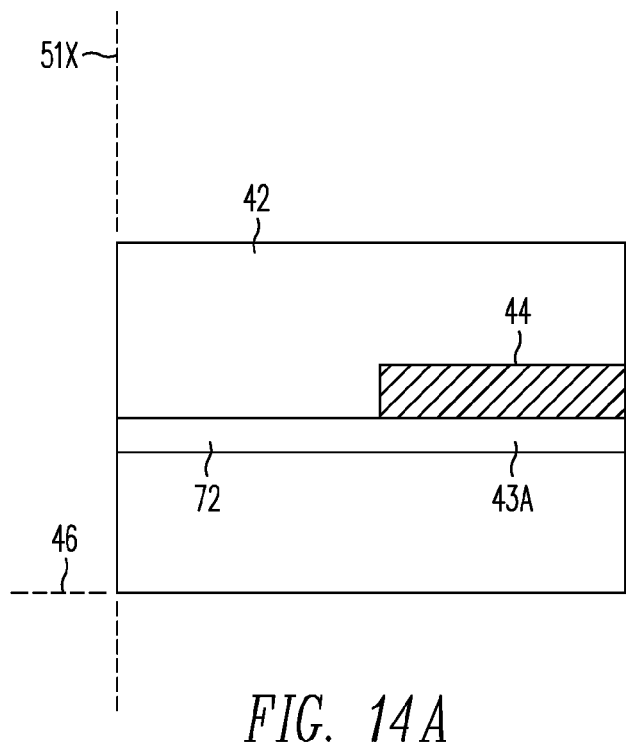
FIG. 14A is a cross-sectional view of a footed package showing a tie bar on a flush saw edge.

The attempted use of tie bars in a leadframe for a QFF package unavoidably results in an unwanted protrusion of the tie bar portion of the leadframe beyond the package's plastic body, a protrusion that interferes with assembly, can lead to electrical shorts, and may during handling may cause cracking of the die cracking or plastic and delamination of the plastic from other leads. This problem is unique to the QFF and does not occur in a DFF package. As shown in FIG. 14A, in the DFF package of FIG. 7A tie bar 72 exits the side of plastic body 42 at a height equal to that of die pad 43A, i.e. elevated above the bottom plane 46 of the package, but tie bar 72 is cut "flush" with plastic body 42 by the saw blade. Because the saw blade cuts both tie bar 72 and plastic 42 at the same time the tie bar 72 does not protrude beyond the surface of the plastic body 42.

Figure 14B:
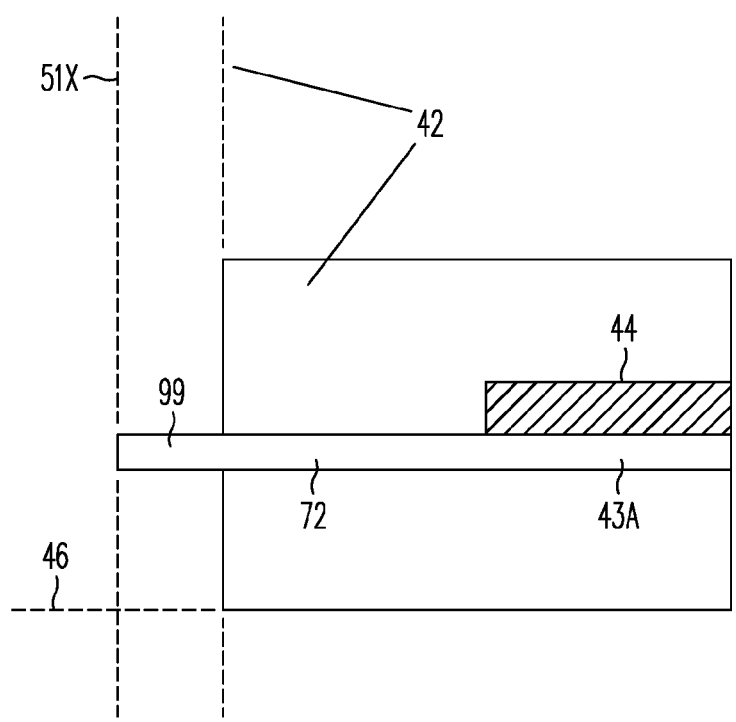
FIG. 14B is a cross-sectional view of a footed package showing a problematic tie bar protrusion on a footed edge.

On the two leaded edges of the DFF, a situation similar to that of any edge on a QFF package, however, the saw blade is pulled back from the edge of the plastic body 42 to accommodate formation of the feet 53C, 53E, 53G, 53I of the leads 43C, 43E, 43G, 43I that extend beyond the surface of the plastic body 42. In such a case, the presence of a tie bar at an edge of the package with footed leads will, without additional processing steps, necessarily leave the tie bar protruding laterally beyond the plastic body. The length of the protrusion will be equal to the length of the feet. This problem is shown in the cross section of FIG. 14B where a length of tie bar 72 determined by saw blade cut line 51X (protrusion 99) extends beyond plastic body 42 by. Since the tie bar is elevated above plane 46, the resulting "diving board" metal protrusion can easily be bumped or bent during mechanical handling resulting in package and die damage.

Since by no package edge with footed leads can accommodate a tie bar without producing unwanted protrusion 99, then the QFF package is mutually incompatible with tie bars and must instead employ one or more leads or heat tabs to stabilize the die pad during manufacturing. Added steps may be included to remove the tie bar protrusion from the package but since this step must necessarily occur after singulation, i.e. cutting the leads, the only steps to remove a metal protrusion would involve clipping or etching the unwanted component. Clipping or cutting the unwanted metal is problematic since there is no convenient way to hold the package during the process. Moreover the extra step could clack the plastic molding and lead to quality and reliability failures. Etching could easily damage the other leads. Aside from these complexities, the extra processing steps invariably add cost making the use of a tie bar on a QFF package undesirable even if once or the means described or other means were devised to remove it.

Bump-on-Leadframe Fooled Package Variants

Footed packages such the DFF and the QFF packages made in accordance with this invention are compatible with bond-wireless assembly methods. In bond-wireless assembly, bond wire interconnections are replaced by solder balls or copper pillars formed on the die prior to assembly, generally while in wafer form, and subsequently used to attach the die to the leadframe, providing both mechanical support and electrical connections to the die. Because the dice are flipped-over to facilitate mounting on the leadframe, bond-wireless assembly methods are sometimes referred to as "flip-chip" assembly.

The first step in bond-wireless assembly is to form the ball or pillar on the semiconductor die. Using methods well known to those skilled in the art, bumps or balls are formed by dropping preformed silver solder balls through a stencil mask onto a heated wafer surface. Upon touching exposed metal bonding pads, the solder balls melt, slightly adhering to open bonding pads. The solder balls do not stick to any areas other than exposed bonding pads, proving placement accuracy with micron precision.

Alternatively, contact can be facilitated using copper pillars. In this process, also well known in the art and commercially available from assembly houses, the topside of a silicon wafer is coated with a thin metal sandwich comprising a bottom layer of a high temperature refractory metal such as tungsten or titanium, and a thin top layer of copper. The thin deposited metal sandwich is then masked and etched using photolithographic means, removing the metal everywhere except above the bond pad areas. The wafer is then copper electroplated, growing columns of copper "pillars" only in locations where the thin copper base layer is present. During electroplating, the refractory metal layer serves as a diffusion barrier keeping copper from diffusing into the aluminum bond pads. After the pillar is formed, the copper is dipped in molten silver solder leaving a small droplet of solder atop each pillar.

Whether bumped with solder balls or copper pillars, the "bumped" wafer is then sawed into separate dice and mounted onto the leadframe using a flip-chip pick and place machine, i.e. where the die is flipped over so the front side of the dice faces down as its aligned and mounted onto the leadframe. A solder flow then melts the intervening solder securing the die onto the leadframe both mechanically and electrically.

Figure 15A:
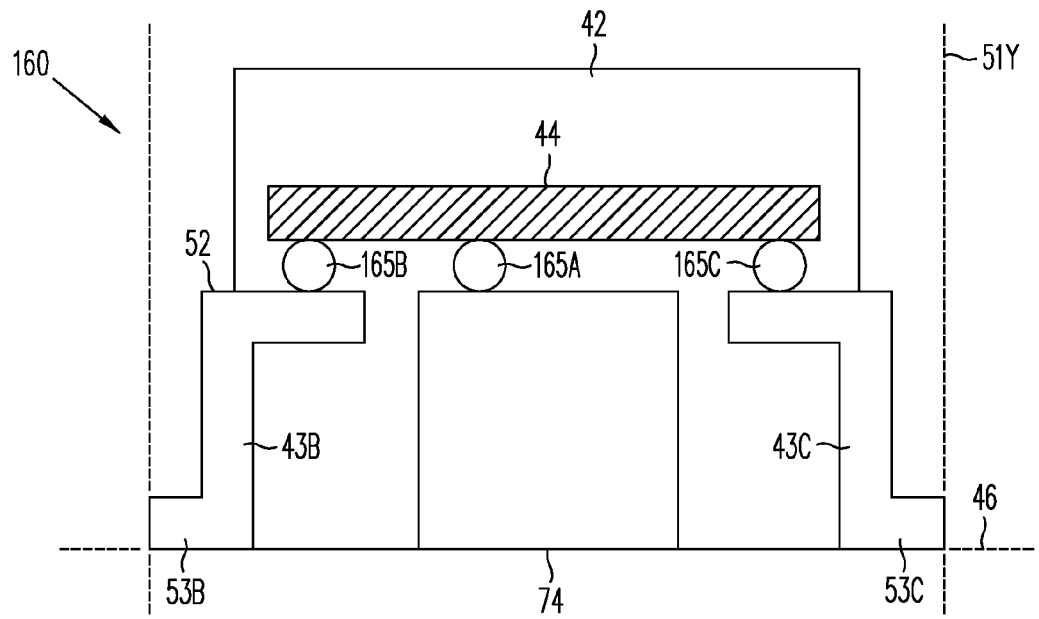
FIG. 15A is a cross-sectional view of a footed package with a solder ball die attach to leads.

A cross-sectional view of a bond-wireless package in accordance with the invention is illustrated in FIG. 15A. A bond-wireless footed package 160 comprises die 44 having a front side attached to leadframe 43 through solder balls or pillars 165A through 165C where plastic body 42 encloses die 44 and solder balls 165A through 165C. Specifically solder ball 165B connects one bonding pad of die 44 to lead 43B and foot 53B, solder ball 165C connects a different bonding pad of die 44 to lead 43C and foot 53C and so on.

Figure 15B:
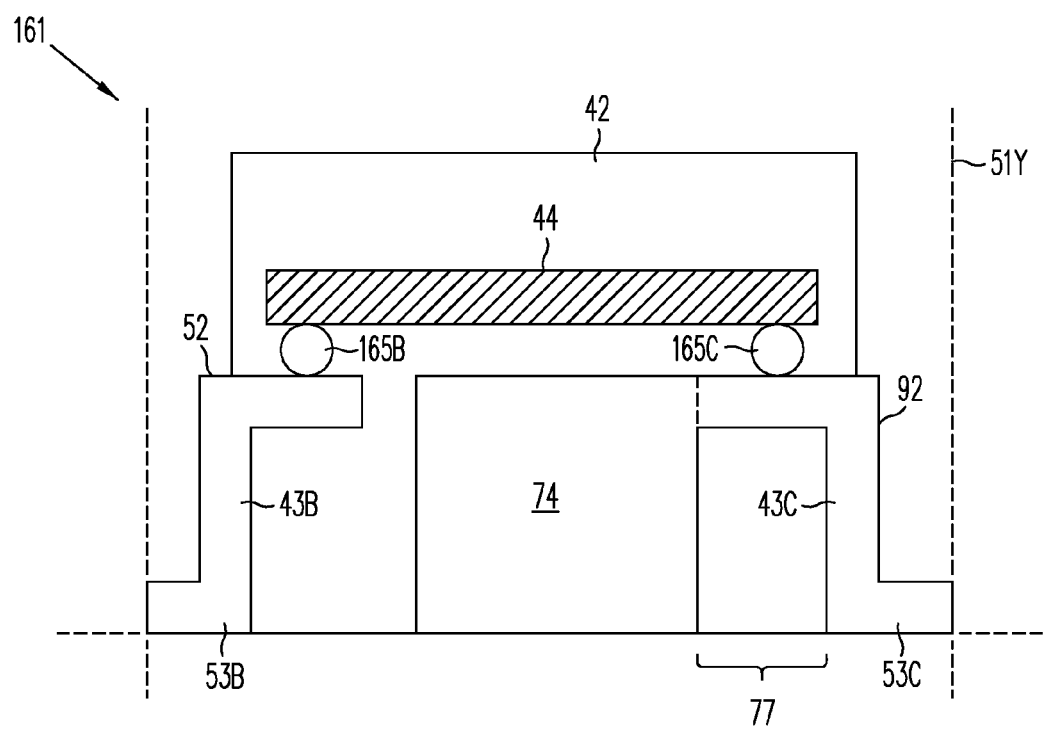
FIG. 15B is a cross-sectional view of a footed package with a solder ball die attach to leads and a die pad.

The ground or substrate connection of die 44 is not made from the backside of the die but rather through a bonding pad on the front side of die 44 connected to exposed die pad 74 through solder ball 165A. Other independent leads may also be electrically connected to the substrate or a ground pad of die 44, or as shown for a package 161 in FIG. 15B, lead 53C may be electrically shorted by metal bridge 92 to exposed die pad 74.

In bond-wireless packages 160 and 161, significant heat low from die 44 through exposed die pad 74 requires a direct thermal path from semiconductor die 44 to the solder ball, i.e. a thermal via, through the metal interconnection layers within the surface of die 44, best achieved by using multiple solder balls for the substrate contact, with each ball vertically stacked atop contact and via openings filled with every layer of metal available in the process. Any intervening oxide will greatly increase the thermal resistance and degrade the power dissipating capability of the die in the bond-wireless package.

Figure 16A:
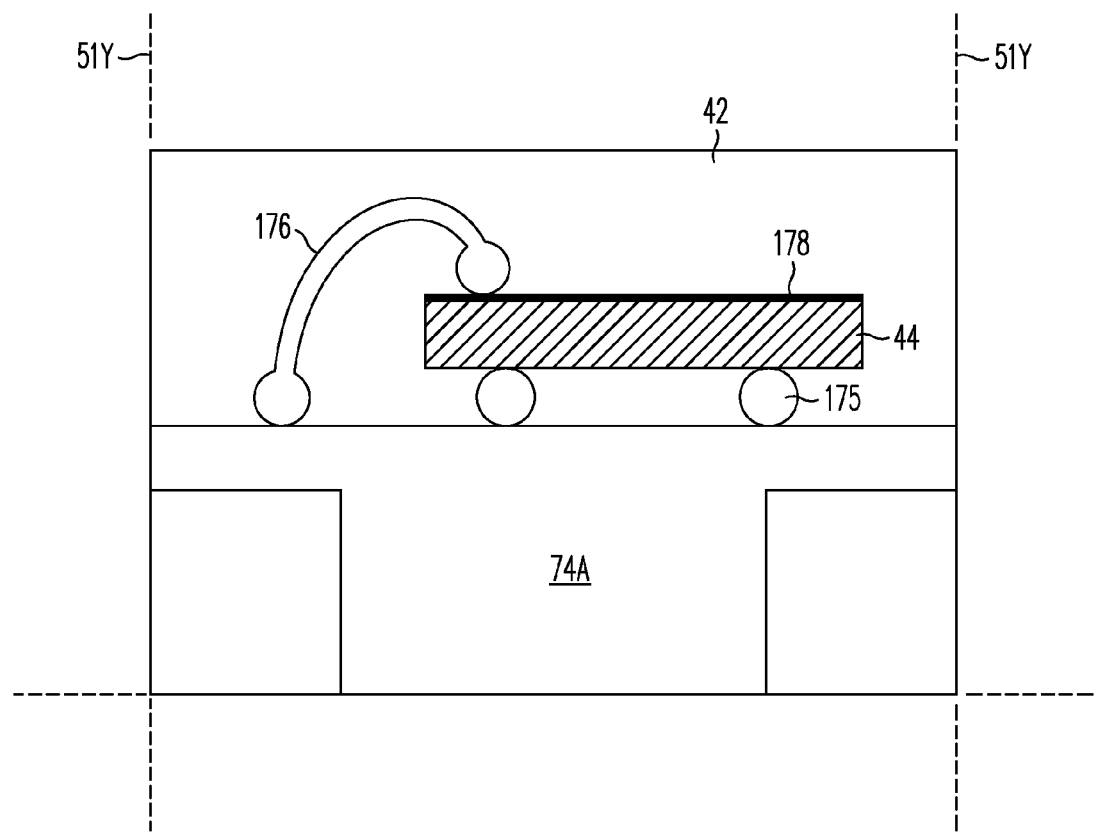
FIG. 16A is a cross-sectional view of a footed package with a solder ball die attach and backside wire down bond.

In some instances, for example in dice that contain devices with vertical current conduction, it may be necessary to electrically contact the backside of die 44 even in bump-on-leadframe packages. One means to facilitate backside contact of a die in a footed package assembled with bump-on-leadframe methods is illustrated in the cross section of FIG. 16A, where the backside of die 44 is electrically connected to an exposed die pad 74A using one or more wire down-bonds 176. Die pad 74A comprises a cantilevered shelf at its upper surface, allowing an additional area for the attachment of wire down-bonds 176. Solder balls 175 are shown as dotted lines indicating these balls are not in the cross section shown and do not necessarily contact exposed die pad 74A.

To bond onto the backside of die 44, a thick metal layer 178 is applied to the backside of die 44 using evaporation or sputtering. The metal layer 178 may comprise a metal sandwich with a bottom layer comprising a first metal such as tungsten or platinum, an intermediate layer comprising a second metal such as nickel, and a top layer comprising a third metal such as copper, silver, or gold. Ideally, if down bond wire 176 is copper, the top layer of a sandwich-type metal layer 178 should also be copper. If bond wire 176 is gold, the top layer of the sandwich-type metal layer 178 is preferably gold or silver.

Figure 16B:
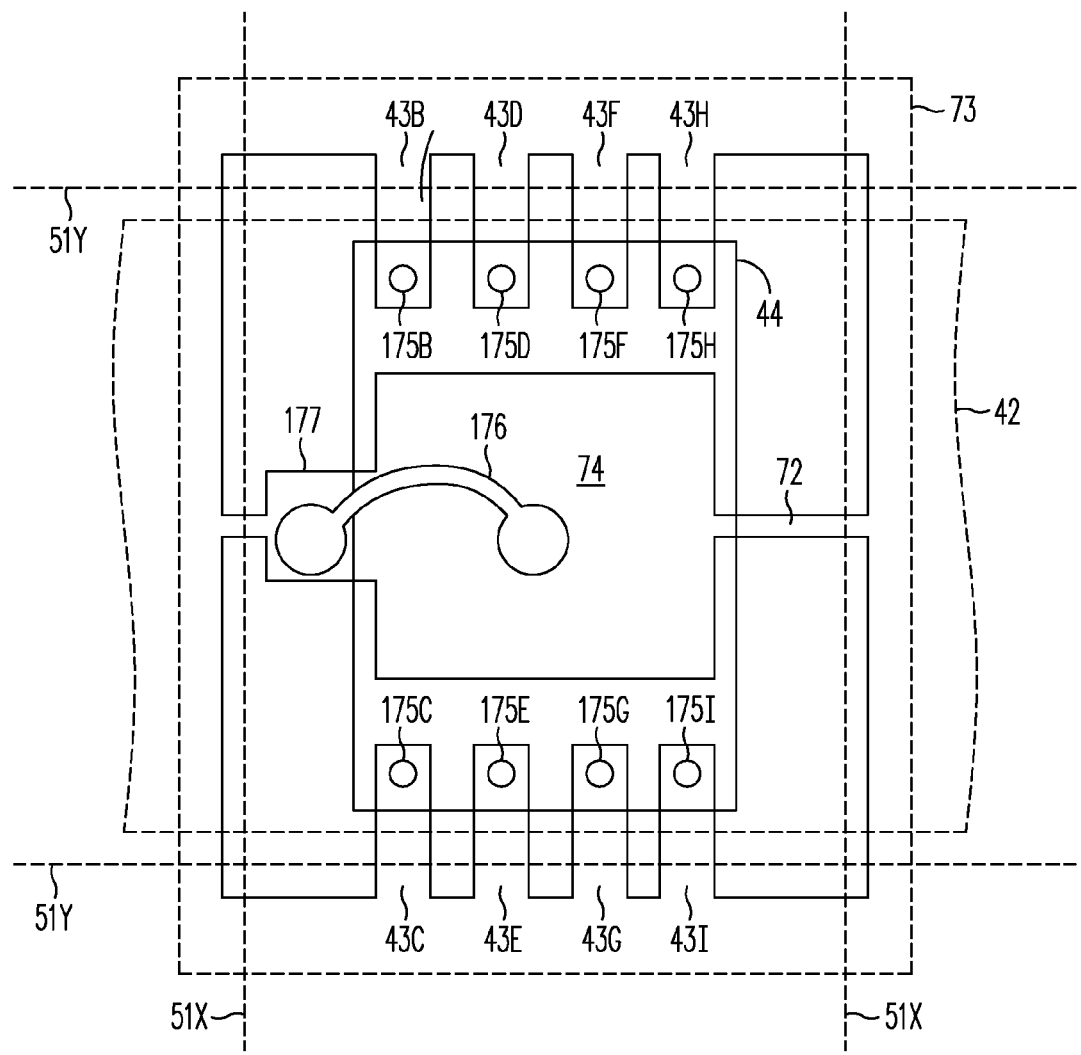
FIG. 16B is a plan view of a footed package with a solder ball die attach and backside wire down bond.

FIG. 16B illustrates a plan view of a footed DFN package using a bump-on-leadframe assembly with a backside down bond 176, whereby semiconductor die 44 with solder balls 175B through 175I is mounted onto a leadframe comprising footed leads 43B through 43I, tie bars 72, and plastic body 42. A down bond wire 176 connects the backside of die 44 to an exposed die pad 74, the down bond wire 176 being bonded to a widened portion 177 of tie bar 72. The package is transected by saw blade cut lines 51X cutting plastic body 42 and tie bars 72 flush with one another. Saw blade cut line 51Y transects leads 43B through 43I but not through plastic body 42, thereby forming footed leads in accordance with this invention.

Figure 16C:
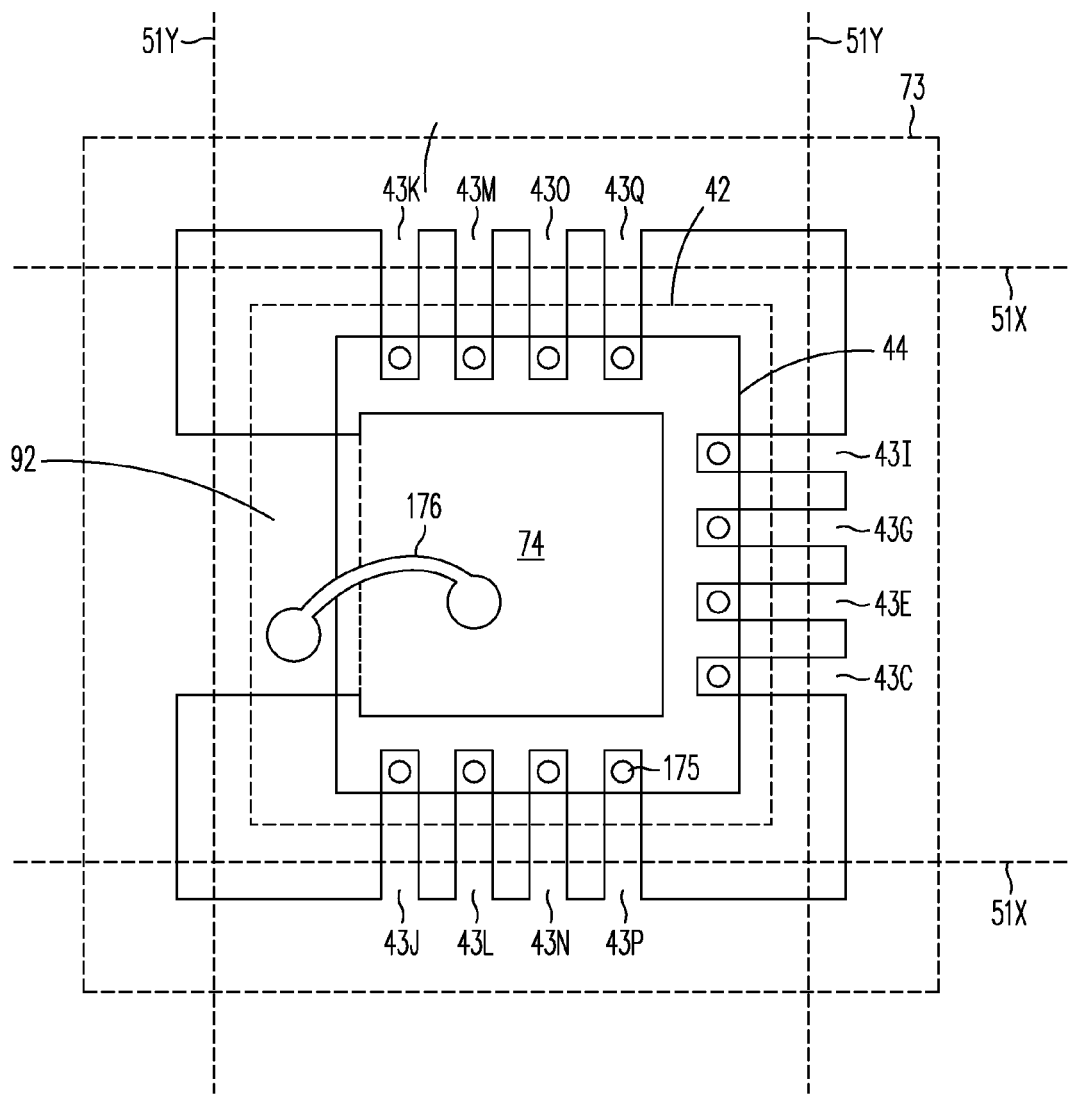
FIG. 16C is a plan view of a footed package with a heat tab, solder ball die attach and backside wire down bond.

FIG. 16C illustrates a plan view of another embodiment of this invention, comprising a footed heat tab QFF package using bump-on-leadframe assembly and a backside down bond. Die 44 includes solder bumps or copper pillars 175 attaching the bond pads of die 44 to corresponding package leads 43C, 43E, 43G, 43I and 43J through 43Q. Down bond wire 176 attaches topside thermal and electrical contacts on die 44 to exposed die pad 74 and heat tab 92, providing both topside and backside thermal and electrical conduction from semiconductor die 44. Die 44 and down bond wire 176 are contained within plastic body 42. Saw blade cuts lines 51X and 51Y transect leads 43C, 43E, 43G, 43I and 43J through 43Q along with heat tab 92 forming the foot feature characteristic of QFF packages made in accordance with this invention.

I claim:

1. A semiconductor package comprising:
    a plastic body, the plastic body having a side surface;
    a semiconductor die; and
    a lead partially encased in the plastic body, the lead comprising a vertical column segment and a foot, the foot projecting horizontally outward at a bottom of the vertical column segment and protruding outward from a bottom of the side surface of the plastic body, the vertical column segment forming fight angles and sharp corners with the foot.

2. The semiconductor package of claim 1 wherein an outside edge of the vertical column segment and a portion of the foot are covered by the plastic body.

3. The semiconductor package of claim 1 wherein the lead further comprises a cantilever segment, the cantilever segment extending horizontally inward at a top of the vertical column segment, the vertical column segment forming right angles and sharp corners with the cantilever segment.

4. The semiconductor package of claim 3 further comprising a die pad, the die being mounted to the die pad and being electrically connected to the lead.

5. The semiconductor package of claim 4 wherein a bottom surface of the die pad is exposed at a bottom of the package.

6. The semiconductor package of claim 5 further comprising a heat tab, the heat tab comprising a horizontal extension of the die pad and having, a flat bottom surface coplanar with the bottom surface of the die pad.

7. The semiconductor package of claim 4 wherein a top surface of the die pad is coplanar with a top surface of the cantilever segment of the lead.

8. The semiconductor package of claim 4 comprising a second lead, the second lead comprising a second cantilever segment, a second vertical column segment and a second foot, the die pad being electrically connected to the second cantilever segment.

9. The semiconductor package of claim 8 wherein a front side of the die is electrically connected to the lead and the second lead and the die pad by means of solder balls.

10. The semiconductor package of claim 4 wherein a bottom surface of the die pad is coplanar with a bottom surface of the cantilever segment of the lead.

11. The semiconductor package of claim 4 wherein the die is electrically connected to the lead with a bond wire.

12. The semiconductor package of claim 4 wherein the die is flipped over such that a front side of the die is mounted to the die pad.

13. The semiconductor package of claim 12 wherein a front side of the die is electrically connected to the lead and the die pad by means of solder balls or copper pillars.

14. The semiconductor package of claim 13 further comprising a down bond wire connecting a terminal on a front side of the die to the lead.

15. The semiconductor package of claim 4 wherein the lead is shorted to the die pad by means of a bridge.

16. A semiconductor package comprising:
a plastic body, the plastic body having a side surface; and
a lead partially encased in the plastic body, the lead comprising a vertical column segment and a foot, the foot protruding outward from a bottom of the vertical column segment, an inside surface of the vertical column segment being embedded in the plastic body, an outside surface of the vertical column segment and an upper surface of the foot being exposed.

17. The semiconductor package of claim 16 wherein, a top surface of the vertical column segment protrudes outward from the side surface of the plastic body so as to form a ledge.

18. The semiconductor package of claim 16 further comprising a cantilever segment, the cantilever segment extending horizontally inward at a top of the vertical column segment.

19. The semiconductor package of claim 16 further comprising a die pad and a die, the die being mounted to the die pad and being electrically connected to the lead.

20. The semiconductor package of claim 19 wherein a bottom surface of the die pad is exposed at a bottom of the package.

21. The semiconductor package of claim 20 further comprising a heat tab, the heat tab comprising a horizontal extension of the die pad and having a flat bottom surface coplanar with the bottom surface of the die pad.

22. A semiconductor package comprising:
a semiconductor die;
a die pad, the die being mounted on the die pad;
a plastic body, the die being encased in the plastic body, the die pad being partially encased in the plastic body, a bottom surface of the die pad being exposed at a bottom of the package, the die pad extending horizontally beyond a side surface of the plastic body, a foot extending from a lateral surface of the die pad.

23. The semiconductor package of claim 22 wherein the lateral surface of the die pad and an upper surface of the foot are exposed.

* * * * *